(12) United States Patent  
Tanaka et al.

(10) Patent No.: US 8,981,370 B2  
(45) Date of Patent: Mar. 17, 2015

(54) SEMICONDUCTOR DEVICE

(71) Applicant: Semiconductor Energy Laboratory Co., Ltd., Atsugi-shi, Kanagawa-ken (JP)

(72) Inventors: Tetsuhiro Tanaka, Isehara (JP); Erika Takahashi, Chigasaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/780,325

(22) Filed: Feb. 28, 2013

(65) Prior Publication Data

US 2013/0234131 A1    Sep. 12, 2013

(30) Foreign Application Priority Data

Mar. 8, 2012  (JP) .................................. 2012-051261  
Mar. 8, 2012  (JP) .................................. 2012-051263

(51) Int. Cl.  
*H01L 29/10* (2006.01)  
*H01L 29/786* (2006.01)

(52) U.S. Cl.  
CPC .......... *H01L 29/786* (2013.01); *H01L 29/7869* (2013.01)  
USPC ........................................................ 257/43

(58) Field of Classification Search  
CPC ..................................................... H01L 29/786  
USPC ............................................................. 257/43  
See application file for complete search history.

(56) References Cited

U.S. PATENT DOCUMENTS

| | | | |
|---|---|---|---|
| 5,528,032 | A | 6/1996 | Uchiyama |
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Armando Rodriguez  
*Assistant Examiner* — Mohammed R Alam  
(74) *Attorney, Agent, or Firm* — Eric J. Robinson; Robinson Intellectual Property Law Office, P.C.

(57) ABSTRACT

A semiconductor device which has stable electrical characteristics and high reliability is provided. The semiconductor device includes a gate electrode over an insulating surface, a gate insulating film over the gate electrode, a semiconductor film which is over the gate insulating film and overlaps with the gate electrode, and a protective insulating film over the semiconductor film; and the protective insulating film includes a crystalline insulating film and an aluminum oxide film over the crystalline insulating film.

14 Claims, 49 Drawing Sheets

(56) References Cited

U.S. PATENT DOCUMENTS

| | | |
|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0153579 A1* | 10/2002 | Yamamoto ............... 257/412 |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0072611 A1* | 3/2010 | Oikawa et al. ............... 257/702 |
| 2010/0092800 A1 | 4/2010 | Itagaki et al. |
| 2010/0109002 A1 | 5/2010 | Itagaki et al. |
| 2010/0295041 A1 | 11/2010 | Kumomi et al. |
| 2011/0095288 A1 | 4/2011 | Morosawa et al. |
| 2011/0175090 A1 | 7/2011 | Sugihara et al. |
| 2011/0180802 A1 | 7/2011 | Morosawa et al. |
| 2011/0227143 A1* | 9/2011 | Lee et al. ............... 257/325 |
| 2011/0248270 A1* | 10/2011 | Fukumoto et al. ............. 257/59 |
| 2011/0312180 A1* | 12/2011 | Wang ............... 438/692 |
| 2012/0049189 A1 | 3/2012 | Sasaki et al. |
| 2012/0132908 A1 | 5/2012 | Sugihara et al. |
| 2012/0319175 A1 | 12/2012 | Endo et al. |
| 2013/0009147 A1 | 1/2013 | Koyama et al. |
| 2013/0043466 A1 | 2/2013 | Nomura et al. |
| 2013/0048977 A1 | 2/2013 | Watanabe et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2006-165528 A | 6/2006 |
| JP | 2006-229185 A | 8/2006 |
| JP | 2010-016163 | 1/2010 |
| JP | 2010-114413 A | 5/2010 |
| WO | WO-2004/114391 | 12/2004 |
| WO | WO-2010/041686 | 4/2010 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar

(56) References Cited

OTHER PUBLICATIONS

Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 208, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3-A2O3—BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

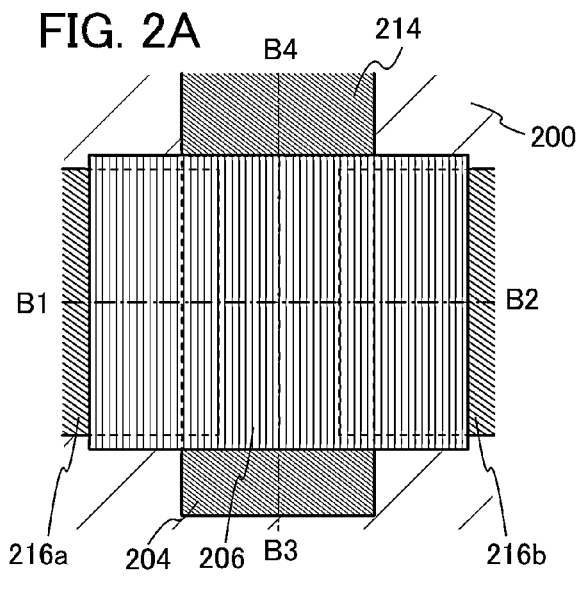
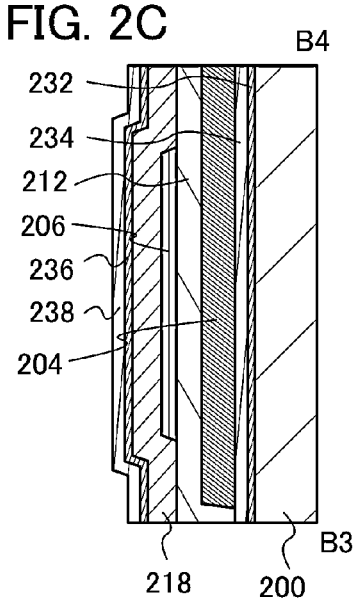
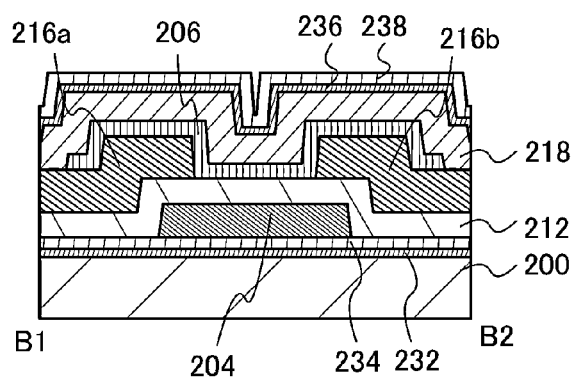

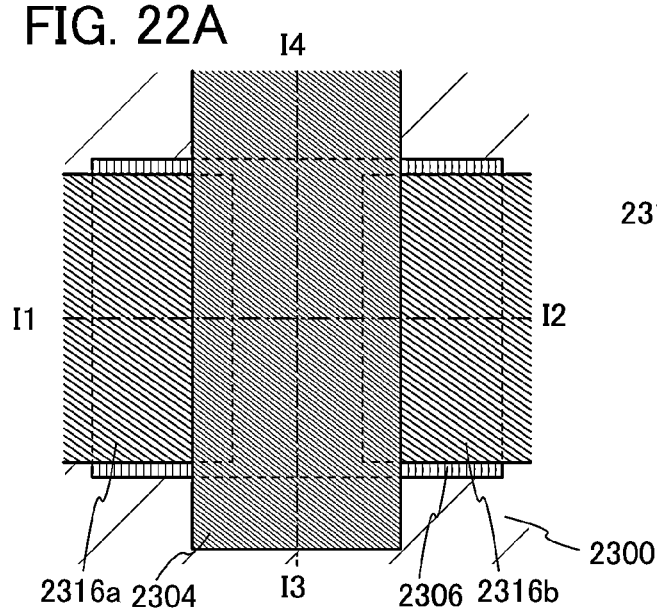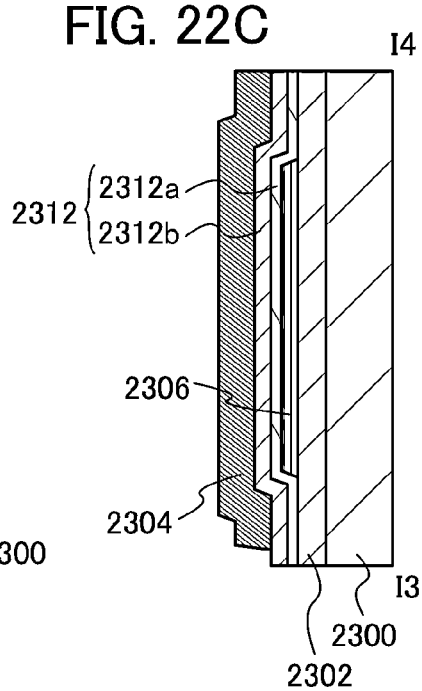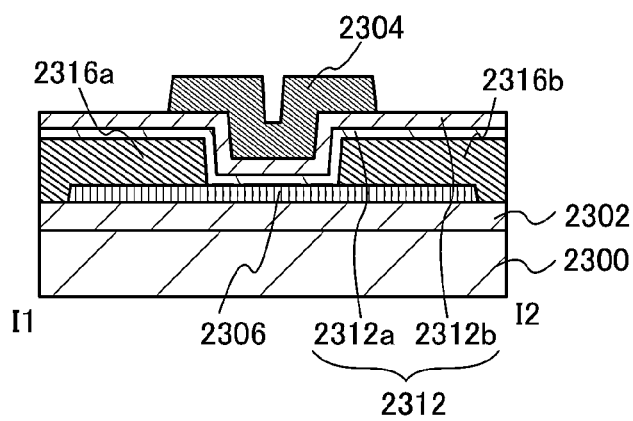

SEMICONDUCTOR DEVICE

BACKGROUND OF THE INVENTION

1. Field of the Invention

The present invention relates to a semiconductor device and a manufacturing method thereof.

In addition, the present invention relates to an object, a method, a method for producing an object, a process, a machine, manufacture, or a composition of matter. In particular, the present invention relates to, for example, a semiconductor device, a memory device, a display device, a liquid crystal display device, a light-emitting device, a driving method thereof, or a manufacturing method thereof. Alternatively, the present invention relates to, for example, an electronic device including the memory device, the display device, or the light-emitting device.

Note that in this specification, a semiconductor device refers to any device that can function by utilizing semiconductor characteristics, and an electro-optical device, a semiconductor circuit, an electronic device, and the like are all semiconductor devices.

2. Description of the Related Art

A technique by which a transistor is formed with a semiconductor film formed over a substrate having an insulating surface has been attracting attention. The transistor is applied to a wide range of semiconductor devices such as an integrated circuit and an image display device. A silicon film is widely known as a semiconductor film applicable to the transistor.

In the silicon film used as the semiconductor film of the transistor, amorphous silicon and crystalline silicon are used in accordance with the usage. For example, in the case of a transistor included in a large-sized display device, it is preferred to use an amorphous silicon film which can be formed using the established technique for forming a film in a large-sized area. On the other hand, in the case of a transistor included in a high-performance display device where driver circuits are formed over the same substrate, it is preferred to use a polycrystalline silicon film which can form a transistor having a high field-effect mobility. As a method for forming a polycrystalline silicon film, a heat treatment at a high temperature or a laser beam treatment which is performed on an amorphous silicon film has been known.

Further, in recent years, an oxide semiconductor film has attracted attention. For example, a transistor is disclosed in which an amorphous oxide semiconductor film containing indium, gallium, and zinc and having an electron carrier density of lower than $10^{18}/cm^3$ is used (see Patent Document 1).

The oxide semiconductor film can be formed by a sputtering method and therefore can be applied to a transistor included in a large-sized display device. Moreover, a transistor including the oxide semiconductor film has a high field-effect mobility; therefore, a high-performance display device where driver circuits are formed over the same substrate can be obtained. Further, there is an advantage that capital investment can be reduced because part of production equipment for a transistor including an amorphous silicon film can be retrofitted and utilized.

In the case where glass is used as a substrate over which the transistor is provided, the electrical characteristics of the transistor might deteriorate due to diffusion of impurities from the glass. In order to suppress the deterioration, a film having a barrier property is provided between the substrate and the transistor.

[Reference]
[Patent Document 1] Japanese Published Patent Application No. 2006-165528

SUMMARY OF THE INVENTION

An object is to provide a semiconductor device which has stable electrical characteristics and high reliability. Another object is to provide a semiconductor device which has stable electrical characteristics. Another object is to provide a semiconductor device which has high reliability. Another object is to provide a semiconductor device which can operate at high speed. Another object is to provide a semiconductor device with low power consumption. An object is to provide a semiconductor device with high yield.

According to one embodiment of the present invention, a semiconductor device includes a gate electrode over an insulating surface, a gate insulating film over the gate electrode, a semiconductor film which is over the gate insulating film and overlaps with the gate electrode, and a protective film over the semiconductor film; and the protective film includes a crystalline insulating film and an aluminum oxide film over the crystalline insulating film.

According to another embodiment of the present invention, a semiconductor device includes a base film, a semiconductor film over the base film, a gate insulating film over the semiconductor film, and a gate electrode which is over the gate insulating film and overlaps with the semiconductor film; and the base film includes a crystalline insulating film and an aluminum oxide film over the crystalline insulating film.

According to another embodiment of the present invention, a semiconductor device includes a base film, a semiconductor film over the base film, a gate insulating film over part of the semiconductor film, a gate electrode which is over the gate insulating film and overlaps with the semiconductor film, and a protective film over the semiconductor film and the gate electrode; and the protective film includes a crystalline insulating film and an aluminum oxide film over the crystalline insulating film.

According to another embodiment of the present invention, a semiconductor device includes a semiconductor film, a gate electrode overlapping with the semiconductor film, and a gate insulating film which is provided between the semiconductor film and the gate electrode; and the gate insulating film includes a crystalline insulating film and an aluminum oxide film over the crystalline insulating film.

The crystalline insulating film contains one or more kinds of Mg, Ti, V, Cr, Y, Zr, and Ta.

The aluminum oxide film has crystallinity.

The aluminum oxide film has a density greater than or equal to 3.2 $g/cm^3$ and less than or equal to 4.1 $g/cm^3$.

The aluminum oxide film is provided over the crystalline insulating film, whereby the aluminum oxide film can have crystallinity and a density greater than or equal to 3.2 $g/cm^3$ and less than or equal to 4.1 $g/cm^3$. The aluminum oxide film has a high barrier property against impurities. Accordingly, a change in electrical characteristics of a transistor, which is caused by impurities, can be suppressed.

Further, the aluminum oxide film having a density greater than or equal to 3.2 $g/cm^3$ and less than or equal to 4.1 $g/cm^3$ has high resistance to a chemical liquid, plasma, or the like and is not unintentionally etched with ease. Therefore, occurrence of shape defects of the aluminum oxide film, which is caused by unintentional etching, can be suppressed. Note that in portions where shape defects of layers that constitute a transistor occur, an etching residue occurs and another shape defect is caused by the portion. Thus, it is important to suppress occurrence of shape defects in order to provide transistor having stable electrical characteristics. Further, the aluminum oxide film has a high barrier property against impurities. Furthermore, because the aluminum oxide film has few defects, the use of the aluminum oxide film for the gate insulating film can suppress deterioration in electrical characteristics of a transistor, which is caused by defects of the gate insulating film.

The aluminum oxide film is provided over the crystalline insulating film, whereby the aluminum oxide film can have crystallinity and a density greater than or equal to 3.2 g/cm$^3$ and less than or equal to 4.1 g/cm$^3$. Accordingly, a semiconductor device which has stable electrical characteristics and high reliability can be provided. A semiconductor device which has stable electrical characteristics can be provided. A semiconductor device which has high reliability can be provided. A semiconductor device which can operate at high speed can be provided. A semiconductor device with low power consumption can be provided. A semiconductor device with high yield can be provided.

BRIEF DESCRIPTION OF THE DRAWINGS

FIGS. 2A to 2C are a top view and cross-sectional views which show an example of a transistor of one embodiment of the present invention.

FIGS. 22A to 22C are a top view and cross-sectional views which show an example of a transistor of one embodiment of the present invention.

DETAILED DESCRIPTION OF THE INVENTION

Figure 1A:
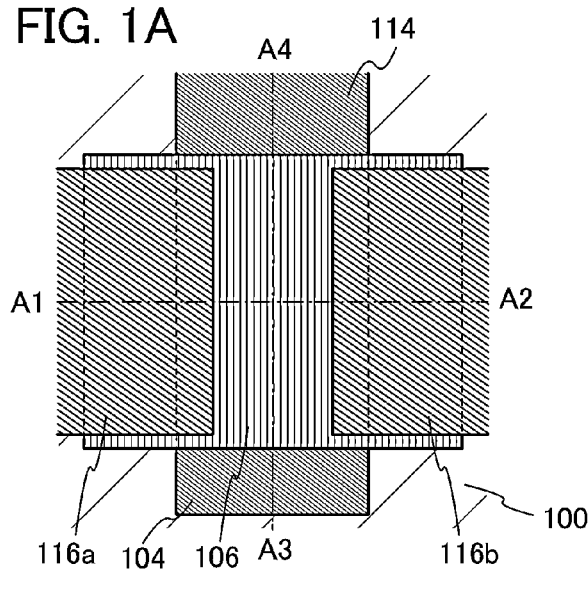
FIGS. 1A to 1C are a top view and cross-sectional views which show an example of a transistor of one embodiment of the present invention.

Embodiments of the present invention will be described with reference to the accompanying drawings. Note that the present invention is not limited to the following description and it will be readily appreciated by those skilled in the art that modes and details can be modified in various ways. Therefore, the present invention should not be construed as being limited to the description in the following embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that what is described (or part thereof) in one embodiment can be applied to, combined with, or exchanged with another content in the same embodiment and/or what is described (or part thereof) in another embodiment or other embodiments.

Note that in each embodiment, a content described in the embodiment is a content described with reference to a variety of diagrams or a content described with a text disclosed in this specification.

In addition, by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed.

Note that the size, the thickness of layers, or regions in diagrams is sometimes exaggerated for simplicity. Therefore, embodiments of the present invention are not limited to such scales.

Note that drawings are schematic views of ideal examples, and the embodiments of the present invention are not limited to the shape or the value illustrated in the drawings. For example, the following can be included: variation in shape due to a manufacturing technique; variation in shape due to an error; variation in signal, voltage, or current due to noise; variation in signal, voltage, or current due to a difference in timing; or the like.

Note that a voltage refers, in many cases, to a potential difference between a certain potential and a reference potential (e.g., a ground potential (GND) or a source potential). Accordingly, a voltage can also be called a potential.

Even when the expression "to be electrically connected" is used in this specification, there is a case in which no physical connection is made and a wiring is just extended in an actual circuit.

Note that technical terms are in many cases used in order to describe a specific embodiment, example, or the like. However, one embodiment of the present invention should not be construed as being limited by the technical terms.

Note that terms which are not defined (including terms used for science and technology, such as technical terms and academic parlance) can be used as the terms which have a meaning equivalent to a general meaning that an ordinary person skilled in the art understands. It is preferred that terms defined by dictionaries or the like are construed as consistent meaning with the background of related art.

Note that the ordinal numbers such as "first" and "second" in this specification are used for convenience and do not denote the order of steps or the stacking order of layers. In addition, the ordinal numbers do not denote particular names which specify the present invention.

The invention excluding content which is not specified in the drawings and texts in this specification can be constituted. Alternatively, when the range of a value (e.g., the maximum and minimum values) is described, the range may be freely narrowed or a value in the range may be excluded, so that the invention can be specified by a range part of which is excluded. In this manner, it is possible to specify the scope of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. Further, it can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from the invention. For example, it can be specified that the case where the voltage is higher than or equal to 13 V is excluded from the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention.

As another specific example, a description "a voltage is preferred to be 10 V" is given. In that case, for example, it can be specified that the case where the voltage is higher than or equal to −2 V and lower than or equal to 1 V is excluded from the invention. For example, it can be specified that the case where the voltage is higher than or equal to 13 V is excluded from the invention.

As another specific example, a description "a film is an insulating film" is given to describe properties of a material. In that case, for example, it can be specified that the case where the insulating film is an organic insulating film is excluded from the invention. For example, it can be specified that the case where the insulating film is an inorganic insulating film is excluded from the invention.

As another specific example, a description of a stacked-layer structure, "a film is provided between A and B" is given. In that case, for example, it can be specified that the case where the film is a stacked film of four or more layers is excluded from the invention. For example, it can be specified that the case where a conductive film is provided between A and the film is excluded from the invention.

Note that various people can implement the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a TFT and a light-emitting element, the following case is possible: Company A manufactures and sells semiconductor devices including TFTs, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. That is, one embodiment of the invention with which a patent infringement can be claimed against Company A or Company B is clear and can be regarded as being disclosed in this specification or the like. For example, in the case of a transmission/reception system, one embodiment of the invention can be constituted by only a transmitting device and one embodiment of the invention can be constituted by only a receiving device. Those embodiments of the invention are clear and can be regarded as being disclosed in this specification or the like. As another example, in the case of a light-emitting device including a TFT and a light-emitting element, one embodiment of the invention can be constituted by only a semiconductor device including a TFT, and one embodiment of the invention can be constituted by a light-emitting device including a TFT and a light-emitting element. Those embodiments of the invention are clear and can be regarded as being disclosed in this specification or the like.

[Embodiment 1]

In this embodiment, a transistor of one embodiment of the present invention will be described.

Figure 1C:
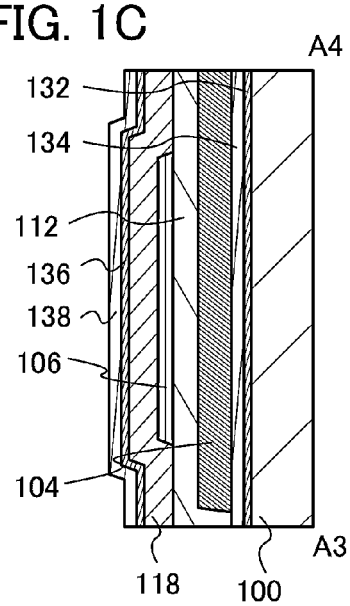
Figure 1B:
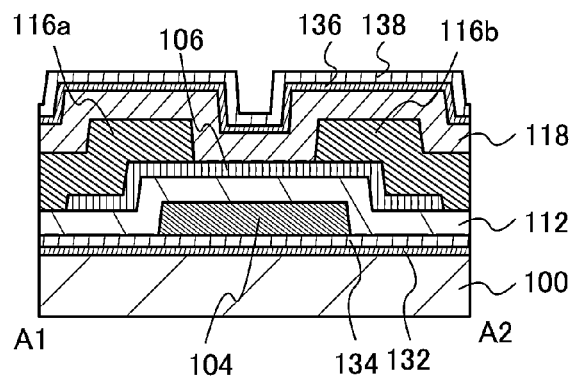

FIG. 1A is a top view of a transistor of one embodiment of the present invention. FIG. 1B is a cross-sectional view taken along dashed-dotted line A1-A2 in FIG. 1A. FIG. 1C is a cross-sectional view taken along dashed-dotted line A3-A4 in FIG. 1A. Note that for simplicity, a gate insulating film 112 and the like are not illustrated in FIG. 1A.

FIG. 1B is a cross-sectional view of a transistor including a crystalline insulating film 132 over a substrate 100; an aluminum oxide film 134 over the crystalline insulating film 132; a gate electrode 104 over the aluminum oxide film 134; the gate insulating film 112 over the gate electrode 104; a semiconductor film 106 which is over the gate insulating film 112 and overlaps with the gate electrode 104; a source electrode 116a and a drain electrode 116b over the semiconductor film 106; a crystalline insulating film 136 over the semiconductor film 106, and the source electrode 116a and the drain electrode 116b; and an aluminum oxide film 138 over the crystalline insulating film 136.

Here, the crystalline insulating film 132 and the crystalline insulating film 136 each contain one or more kinds of Mg, Ti, V, Cr, Y, Zr, and Ta. Specifically, it is preferred to include one or more kinds of magnesium oxide, titanium oxide, vanadium oxide, chromium oxide, yttrium oxide, zirconium oxide, and tantalum oxide. For example, an insulating film containing zirconium oxide and yttrium oxide can be used.

The crystalline insulating film 132 and the crystalline insulating film 136 are each an insulating film having crystallinity, specifically, an insulating film whose crystallinity can be observed by X-ray diffraction (XRD), electron diffraction, or neutron diffraction.

The aluminum oxide film 134 and the aluminum oxide film 138 each have crystallinity. Specifically, the crystallinity can be observed by XRD, electron diffraction, or neutron diffraction.

The aluminum oxide film 134 has crystallinity even near the interface with the crystalline insulating film 132. The aluminum oxide film 138 has crystallinity even near the interface with the crystalline insulating film 136. On the other hand, in the case where an aluminum oxide film is formed over a metal film or an amorphous insulating film which serves as a base, an amorphous aluminum oxide film is formed in the aluminum oxide film near the base. The amorphous aluminum oxide film is an aluminum oxide film having a lower density than an aluminum oxide film having crystallinity.

The aluminum oxide film 134 and the aluminum oxide film 138 are each a high-density aluminum oxide film, specifically, an aluminum oxide film having a density greater than or equal to 3.2 g/cm$^3$ and less than or equal to 4.1 g/cm$^3$ measured by X-ray reflectivity (XRR) or Rutherford backscattering spectrometry (RBS). The aluminum oxide film 134 and the aluminum oxide film 138 each have a high bather property against impurities; therefore, deterioration in electric characteristics of the transistor, which is caused by impurities, can be suppressed.

Note that the aluminum oxide film 134 does not include a low density layer near the crystalline insulating film 132, and the aluminum oxide film 138 does not either include a low density layer near the crystalline insulating film 136. Specifically, a layer having a density less than 3.2 g/cm$^3$ measured by XRR is not included. On the other hand, in the case where the aluminum oxide film is formed over the metal film or the amorphous insulating film which serves as a base, the aluminum oxide film having lower density is formed in the aluminum oxide film near the base. The aluminum oxide film having low density has low resistance to a chemical liquid and might be unintentionally etched in a chemical liquid treatment at the time of manufacturing the transistor. Consequently, shape defects and malfunctions of the transistor might occur.

The semiconductor film 106 can be formed using a silicon film, a germanium film, a silicon germanium film, a gallium arsenide film, a silicon carbide film, or a gallium nitride film. Note that an organic semiconductor film may be used as the semiconductor film 106. Alternatively, an oxide semiconductor film may be used as the semiconductor film 106.

As the oxide semiconductor film, an In-M-Zn oxide film can be used. Here, a metal element M is an element whose bond energy with oxygen is higher than that of In and that of Zn. Alternatively, the metal element M is an element which has a function of suppressing desorption of oxygen from the In-M-Zn oxide film. Owing to the effect of the metal element m, generation of an oxygen vacancy in the oxide semiconductor film is suppressed. Note that oxygen vacancies in the oxide semiconductor film sometimes generate carriers. Therefore, the effect of the metal element M can suppress an increase in carrier density in the oxide semiconductor film and an increase in an off-state current. Moreover, a change in the electrical characteristics of the transistor, which is caused by oxygen vacancies, can be reduced, so that a highly reliable transistor can be obtained.

The metal element M can be, specifically, Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. The metal element M can be formed using one or more elements selected from the above elements. Further, Si or Ge may be used instead of the metal element M.

The hydrogen concentration in the oxide semiconductor film is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$. This is because hydrogen included in the oxide semiconductor film sometimes generates unintentional carriers. The generated carriers are a factor of increasing an off-state current of the transistor and changing electrical characteristics of the transistor. Thus, with the above range of the hydrogen concentration in the oxide semiconductor film, it is possible to suppress an increase in off-state current of the transistor and a change in electric characteristics of the transistor.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm In an image obtained with a transmission electron microscope (TEM), a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through a crystallization treatment such as a heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electrical characteristics due to irradiation with visible light or ultraviolet light is small. Thus, the transistor has high reliability.

The oxide semiconductor film has a wider band gap than a silicon film by approximately 1 eV to 2 eV. For that reason, in the transistor including the oxide semiconductor film, impact ionization is unlikely to occur and avalanche breakdown is unlikely to occur. That is, it can be said that hot-carrier degradation is unlikely to occur in the transistor.

In the case where the oxide semiconductor film is used as the semiconductor film 106 as described above, a channel region can be completely depleted by an electric field of the gate electrode 104 even in the case where the thickness of the semiconductor film 106 is large (e.g., greater than or equal to 15 nm and less than 100 nm) because the oxide semiconductor film generates fewer carriers. Thus, in the transistor including the oxide semiconductor film, an increase in an off-state current and a change in a threshold voltage due to a punch-through phenomenon is not caused. When the channel length is, for example, 3 μm, the off-state current can be lower than $10^{-21}$ A or lower than $10^{-24}$ A per micrometer of channel width at room temperature.

The oxygen vacancies in the oxide semiconductor film, which are a factor of generating carriers, can be evaluated by electron spin resonance (ESR). That is, an oxide semiconductor film with few oxygen vacancies can be referred to as an oxide semiconductor film which does not have a signal evaluated by ESR, which is caused by oxygen vacancies. Specifically, the spin density attributed to oxygen vacancies of the oxide semiconductor film is lower than $5\times10^{16}$ spins/cm$^3$. When the oxide semiconductor film has oxygen vacancies, a signal having symmetry is found at a g value of around 1.93 in ESR.

Here, there is no particular limitation on the substrate 100 as long as it has heat resistance enough to withstand at least a heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates further provided with a semiconductor element may be used as the substrate 100.

In the case where a large glass substrate such as the 5th generation (1000 mm×1200 mm or 1300 mm×1500 mm), the 6th generation (1500 mm×1800 mm), the 7th generation (1870 mm×2200 mm), the 8th generation (2200 mm×2500 mm), the 9th generation (2400 mm×2800 mm), or the 10th generation (2880 mm×3130 mm) is used as the substrate 100, minute processing is sometimes difficult due to shrinkage of the substrate 100 caused by a heat treatment or the like in a manufacturing process of a semiconductor device. Therefore, in the case where the above-described large glass substrate is used as the substrate 100, a substrate which is unlikely to shrink through the heat treatment is preferred to be used. For example, as the substrate 100, it is possible to use a large glass substrate in which the amount of shrinkage after a heat treatment which is performed for an hour at 400° C., preferably 450° C., more preferably 500° C. is less than or equal to 10 ppm, preferably less than or equal to 5 ppm, more preferably less than or equal to 3 ppm.

Further alternatively, a flexible substrate may be used as the substrate 100. Note that as a method for forming a transistor over a flexible substrate, there is also a method in which, after a transistor is formed over a non-flexible substrate, the transistor is separated from the non-flexible substrate and transferred to the substrate 100 which is a flexible substrate. In that case, a separation layer is preferred to be provided between the non-flexible substrate and the transistor.

The gate electrode 104 can be formed to have a single-layer or a stacked-layer structure of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

The source electrode 116a and the drain electrode 116b can be formed to have a single-layer or a stacked-layer structure of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances. Note that a conductive film for forming the source electrode 116a and the drain electrode 116b may be the same or different from each other.

A protective insulating film 118 can be formed to have a single-layer or a stacked-layer structure of an insulating film containing one or more of the following: aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

Silicon oxynitride refers to a substance that contains more oxygen than nitrogen, and silicon nitride oxide refers to a substance that contains more nitrogen than oxygen.

The protective insulating film 118 is preferred to contain excess oxygen.

In the case where the protective insulating film 118 contains excess oxygen, oxygen vacancies in the oxide semiconductor film can be reduced.

An insulating film containing excess oxygen refers to an insulating film in which the amount of released oxygen which is converted into oxygen atoms is greater than or equal to $1\times10^{18}$ atoms/cm$^3$, greater than or equal to $1\times10^{19}$ atoms/cm$^3$, or greater than or equal to $1\times10^{20}$ atoms/cm$^3$ in thermal desorption spectroscopy (TDS).

Here, a measurement method of the amount of released oxygen using TDS analysis will be described.

The total amount of a released gas in TDS analysis is proportional to the integral value of intensity of ions of the released gas. Then, the integral value is compared with that of a standard sample, whereby the total amount of the released gas can be calculated.

For example, the amount of oxygen molecules ($N_{O2}$) released from an insulating film can be found according to Formula 1 with the TDS analysis results of a silicon wafer containing hydrogen at a predetermined density which is the standard sample and the TDS analysis results of the insulating film. Here, all gases having a mass number of 32 which are obtained in the TDS analysis are assumed to originate from an oxygen molecule. A CH$_3$OH gas, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \quad \text{[FORMULA 1]}$$

The value $N_{H2}$ is obtained by conversion of the amount of hydrogen molecules desorbed from the standard sample into densities. The integral value of ion intensity in the case where the standard sample is subjected to the TDS analysis is denoted by $S_{H2}$. Here, the reference value of the standard sample is $N_{H2}/S_{H2}$. The integral value of ion intensity in the case where the insulating film is subjected to the TDS analysis is denoted by $S_{O2}$. A coefficient affecting the ion intensity in the TDS analysis is denoted by $\alpha$. Japanese Published Patent Application No. H6-275697 can be referred to for details of Formula 1. Note that the amount of oxygen released from the above insulating film is measured with EMD-WA1000S/W, a thermal desorption spectroscopy apparatus produced by ESCO Ltd., with the use of a silicon wafer containing a hydrogen atom at $1 \times 10^{16}$ atoms/cm$^2$ as the standard sample.

Further, in the TDS analysis, oxygen is partly detected as an oxygen atom. The ratio between oxygen molecules and oxygen atoms can be calculated from the ionization rate of the oxygen molecules. Note that, since the above coefficient α includes the ionization rate of the oxygen molecules, the amount of the released oxygen atoms can be estimated through the evaluation of the amount of the released oxygen molecules.

Note that the amount of the released oxygen molecules is denoted by $N_{O2}$. The amount of released oxygen converted into oxygen atoms is twice the amount of the released oxygen molecules.

The insulating film containing excess oxygen may contain a peroxide radical. Specifically, the spin density attributed to a peroxide radical of the insulating film is higher than or equal to $5 \times 10^{17}$ spins/cm$^3$. Note that the insulating film containing a peroxide radical has a signal having asymmetry at a g value of around 2.01 in ESR.

Alternatively, the insulating film containing excess oxygen may be formed using oxygen-excess silicon oxide ($SiO_X$ ($X>2$)). In the oxygen-excess silicon oxide ($SiO_X$ ($X>2$)), the number of oxygen atoms per unit volume is more than twice the number of silicon atoms per unit volume. The number of silicon atoms and the number of oxygen atoms per unit volume are measured by RBS.

The gate insulating film 112 can be formed to have a single-layer or a stacked-layer structure of an insulating film containing one or more of the following: aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

The gate insulating film 112 is preferred to contain excess oxygen.

In the case where the gate insulating film 112 contains excess oxygen, oxygen vacancies in the oxide semiconductor film can be reduced.

The transistor illustrated in FIGS. 1A to 1C is surrounded with the aluminum oxide film 134 and the aluminum oxide film 138 each having crystallinity and a high density. Thus, the transistor has a high barrier property against external impurities. Further, outward diffusion of excess oxygen contained in the transistor can be suppressed because the aluminum oxide films do not transmit oxygen.

Accordingly, the transistor illustrated in FIGS. 1A to 1C has stable electrical characteristics.

Note that although FIGS. 1A to 1C illustrate the structure including all of the crystalline insulating film 132, the aluminum oxide film 134, the crystalline insulating film 136, and the aluminum oxide film 138, one embodiment of the present invention is not limited to this structure. For example, the crystalline insulating film 132 and the aluminum oxide film 134 are not necessarily provided. Alternatively, the crystalline insulating film 136 and the aluminum oxide film 138 are not necessarily provided.

Next, a transistor having a structure different from that of the transistor illustrated in FIGS. 1A to 1C will be described with reference to FIGS. 2A to 2C.

FIG. 2A is a top view of a transistor of one embodiment of the present invention. FIG. 2B is a cross-sectional view taken along dashed-dotted line B1-B2 in FIG. 2A. FIG. 2C is a cross-sectional view taken along dashed-dotted line B3-B4 in FIG. 2A. Note that for simplicity, a gate insulating film 212 and the like are not illustrated in FIG. 2A.

FIG. 2B is a cross-sectional view of a transistor including a crystalline insulating film 232 over a substrate 200; an aluminum oxide film 234 over the crystalline insulating film 232; a gate electrode 204 over the aluminum oxide film 234; the gate insulating film 212 over the gate electrode 204; a source electrode 216a and a drain electrode 216b over the gate insulating film 212; a semiconductor film 206 which is over the gate insulating film 212, and the source electrode 216a and the drain electrode 216b and overlaps with the gate electrode 204; a crystalline insulating film 236 over the semiconductor film 206, and the source electrode 216a and the drain electrode 216b; and an aluminum oxide film 238 over the crystalline insulating film 236.

Here, as the crystalline insulating film 232 and the crystalline insulating film 236, a film selected from the insulating films given as examples of the crystalline insulating film 132 and the crystalline insulating film 136 can be used.

The crystalline insulating film 232 and the crystalline insulating film 236 are each an insulating film having crystallinity, specifically, an insulating film whose crystallinity can be observed by XRD, electron diffraction, or neutron diffraction.

The aluminum oxide film 234 and the aluminum oxide film 238 each have crystallinity. Specifically, the crystallinity can be observed by XRD, electron diffraction, or neutron diffraction.

The aluminum oxide film 234 has crystallinity even near the interface with the crystalline insulating film 232. The aluminum oxide film 238 has crystallinity even near the interface with the crystalline insulating film 236. On the other hand, in the case where an aluminum oxide film is formed over a metal film or an amorphous insulating film which serves as a base, an amorphous aluminum oxide film is formed in the aluminum oxide film near the base.

The aluminum oxide film 234 and the aluminum oxide film 238 are each a high-density aluminum oxide film, specifically, an aluminum oxide film having a density greater than or equal to 3.2 g/cm$^3$ and less than or equal to 4.1 g/cm$^3$ measured by XRR or RBS. The aluminum oxide film 234 and the aluminum oxide film 238 each have a high barrier property against impurities; therefore, deterioration in electric characteristics of the transistor, which is caused by impurities, can be suppressed.

Note that the aluminum oxide film 234 does not include a low density layer near the crystalline insulating film 232, and the aluminum oxide film 238 does not either include a low density layer near the crystalline insulating film 236. Specifically, a layer having a density less than 3.2 g/cm$^3$ measured by XRR is not included. On the other hand, in the case where the aluminum oxide film is formed over the metal film or the amorphous insulating film which serves as a base, the aluminum oxide film having lower density is formed in the aluminum oxide film near the base. The aluminum oxide film having low density has low resistance to a chemical liquid and might be unintentionally etched in a chemical liquid treatment at the time of manufacturing the transistor. Consequently, shape defects and malfunctions of the transistor might occur.

The description of the semiconductor film 106 is referred to for the semiconductor film 206.

The description of the substrate 100 is referred to for the substrate 200.

The description of the gate electrode 104 is referred to for the gate electrode 204.

The description of the source electrode 116a and the drain electrode 116b are referred to for the source electrode 216a and the drain electrode 216b.

The description of the protective insulating film 118 is referred to for the protective insulating film 218.

The protective insulating film 218 is preferred to contain excess oxygen.

In the case where the protective insulating film 218 contains excess oxygen, oxygen vacancies in the oxide semiconductor film can be reduced.

The description of the gate insulating film 112 is referred to for the gate insulating film 212.

The gate insulating film 212 is preferred to contain excess oxygen.

In the case where the gate insulating film 212 contains excess oxygen, oxygen vacancies in the oxide semiconductor film can be reduced.

The transistor illustrated in FIGS. 2A to 2C is surrounded with the aluminum oxide film 234 and the aluminum oxide film 238 each having crystallinity and a high density. Thus, the transistor has a high barrier property against external impurities. Further, outward diffusion of excess oxygen contained in the transistor can be suppressed because the aluminum oxide films do not transmit oxygen.

Accordingly, the transistor illustrated in FIGS. 2A to 2C has stable electrical characteristics.

Note that although FIGS. 2A to 2C illustrate the structure including all of the crystalline insulating film 232, the aluminum oxide film 234, the crystalline insulating film 236, and the aluminum oxide film 238, one embodiment of the present invention is not limited to this structure. For example, the crystalline insulating film 232 and the aluminum oxide film 234 are not necessarily provided. Alternatively, the crystalline insulating film 236 and the aluminum oxide film 238 are not necessarily provided.

Next, a transistor having a structure different from those of the transistors illustrated in FIGS. 1A to 1C and FIGS. 2A to 2C will be described with reference to FIGS. 3A to 3C.

Figure 3A:
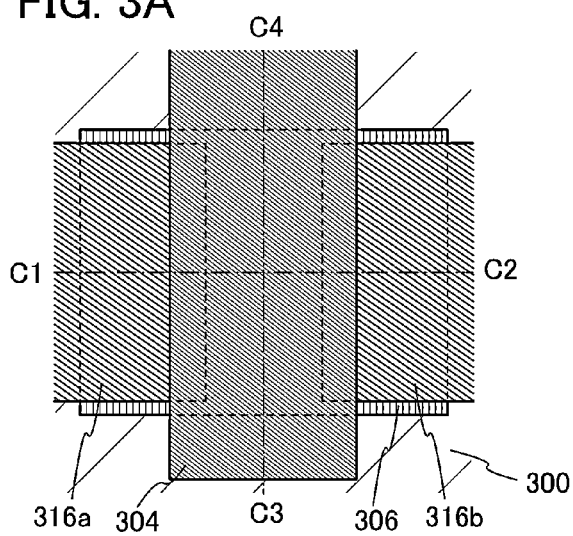
FIGS. 3A to 3C are a top view and cross-sectional views which show an example of a transistor of one embodiment of the present invention.

FIG. 3A is a top view of a transistor of one embodiment of the present invention. FIG. 3B is a cross-sectional view taken along dashed-dotted line C1-C2 in FIG. 3A. FIG. 3C is a cross-sectional view taken along dashed-dotted line C3-C4 in FIG. 3A. Note that for simplicity, a gate insulating film 312 and the like are not illustrated in FIG. 3A.

Figure 3C:
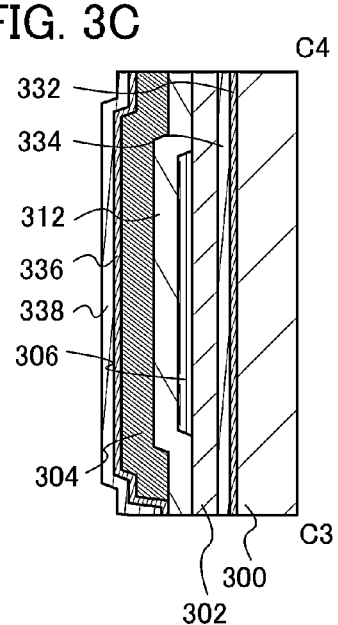
Figure 3B:
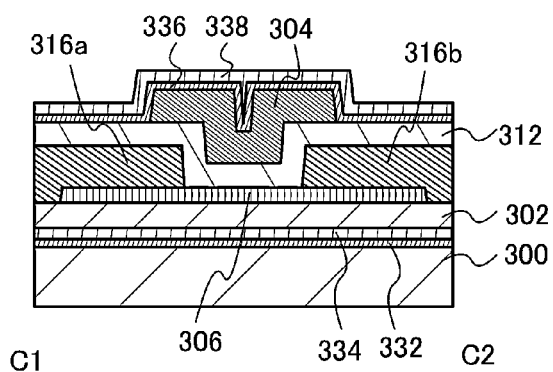

FIG. 3B is a cross-sectional view of a transistor including a crystalline insulating film 332 over a substrate 300; an aluminum oxide film 334 over the crystalline insulating film 332; a base insulating film 302 over the aluminum oxide film 334; a semiconductor film 306 over the base insulating film 302; a source electrode 316a and a drain electrode 316b over the semiconductor film 306; the gate insulating film 312 over the semiconductor film 306, and the source electrode 316a and the drain electrode 316b; a gate electrode 304 which is over the gate insulating film 312 and overlaps with the semiconductor film 306; a crystalline insulating film 336 over the gate electrode 304; and an aluminum oxide film 338 over the crystalline insulating film 336.

Here, as the crystalline insulating film 332 and the crystalline insulating film 336, a film selected from the insulating films given as examples of the crystalline insulating film 132 and the crystalline insulating film 136 can be used.

The crystalline insulating film 332 and the crystalline insulating film 336 are each an insulating film having crystallinity, specifically, an insulating film whose crystallinity can be observed by XRD, electron diffraction, or neutron diffraction.

The aluminum oxide film 334 and the aluminum oxide film 338 each have crystallinity. Specifically, the crystallinity can be observed by XRD, electron diffraction, or neutron diffraction.

The aluminum oxide film 334 has crystallinity even near the interface with the crystalline insulating film 332. The aluminum oxide film 338 has crystallinity even near the interface with the crystalline insulating film 336. On the other hand, in the case where an aluminum oxide film is formed over a metal film or an amorphous insulating film which serves as a base, an amorphous aluminum oxide film is formed in the aluminum oxide film near the base.

The aluminum oxide film 334 and the aluminum oxide film 338 are each a high-density aluminum oxide film, specifically, an aluminum oxide film having a density greater than or equal to 3.2 g/cm$^3$ and less than or equal to 4.1 g/cm$^3$ measured by XRR or RBS. The aluminum oxide film 334 and the aluminum oxide film 338 each have a high barrier property against impurities; therefore, deterioration in electric characteristics of the transistor, which is caused by impurities, can be suppressed.

Note that the aluminum oxide film 334 does not include a low density layer near the crystalline insulating film 332, and the aluminum oxide film 338 does not either include a low density layer near the crystalline insulating film 336. Specifically, a layer having a density less than 3.2 g/cm$^3$ measured by XRR is not included. On the other hand, in the case where the aluminum oxide film is formed over the metal film or the amorphous insulating film which serves as a base, the aluminum oxide film having lower density is formed in the aluminum oxide film near the base. The aluminum oxide film having low density has low resistance to a chemical liquid and might be unintentionally etched in a chemical liquid treatment at the time of manufacturing the transistor. Consequently, shape defects and malfunctions of the transistor might occur.

The description of the semiconductor film 106 is referred to for the semiconductor film 306.

The description of the substrate 100 is referred to for the substrate 300.

The base insulating film 302 can be formed to have a single-layer or a stacked-layer structure of an insulating film containing one or more of the following: aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

The base insulating film 302 is preferred to contain excess oxygen.

In the case where the base insulating film 302 contains excess oxygen, oxygen vacancies in the oxide semiconductor film can be reduced.

The description of the gate insulating film 112 is referred to for the gate insulating film 312.

The gate insulating film 312 is preferred to contain excess oxygen.

In the case where the gate insulating film 312 contains excess oxygen, oxygen vacancies in the oxide semiconductor film can be reduced.

The description of the source electrode 116a and the drain electrode 116b are referred to for the source electrode 316a and the drain electrode 316b.

The description of the gate electrode 104 is referred to for the gate electrode 304.

The transistor illustrated in FIGS. 3A to 3C is surrounded with the aluminum oxide film 334 and the aluminum oxide film 338 each having crystallinity and a high density. Thus, the transistor has a high barrier property against external impurities. Further, outward diffusion of excess oxygen contained in the transistor can be suppressed because the aluminum oxide films do not transmit oxygen.

Accordingly, the transistor illustrated in FIGS. 3A to 3C has stable electrical characteristics.

Note that although FIGS. 3A to 3C illustrate the structure including all of the crystalline insulating film 332, the aluminum oxide film 334, the crystalline insulating film 336, and the aluminum oxide film 338, one embodiment of the present invention is not limited to this structure. For example, the crystalline insulating film 332 and the aluminum oxide film 334 are not necessarily provided. Alternatively, the crystalline insulating film 336 and the aluminum oxide film 338 are not necessarily provided.

Next, a transistor having a structure different from those of the transistors illustrated in FIGS. 1A to 1C, FIGS. 2A to 2C, and FIGS. 3A to 3C will be described with reference to FIGS. 4A to 4C.

Figure 4A:
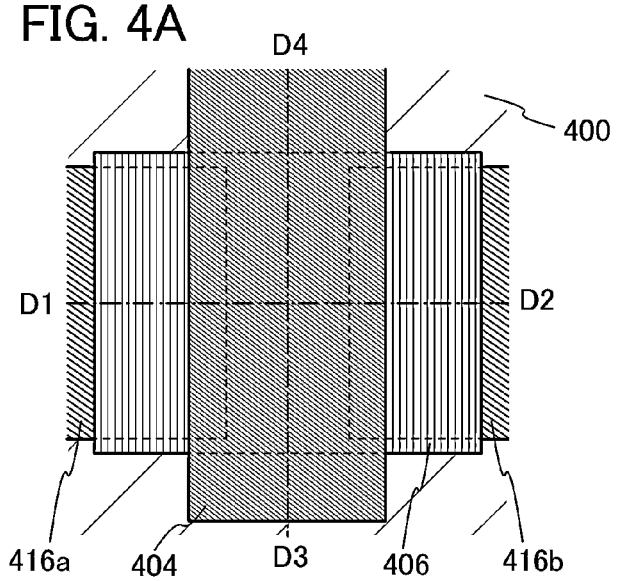
FIGS. 4A to 4C are a top view and cross-sectional views which show an example of a transistor of one embodiment of the present invention.

FIG. 4A is a top view of a transistor of one embodiment of the present invention. FIG. 4B is a cross-sectional view taken along dashed-dotted line D1-D2 in FIG. 4A. FIG. 4C is a cross-sectional view taken along dashed-dotted line D3-D4 in FIG. 4A. Note that for simplicity, a gate insulating film 412 and the like are not illustrated in FIG. 4A.

Figure 4C:
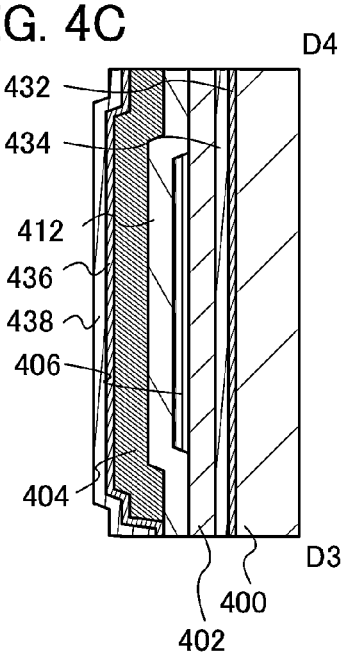
Figure 4B:
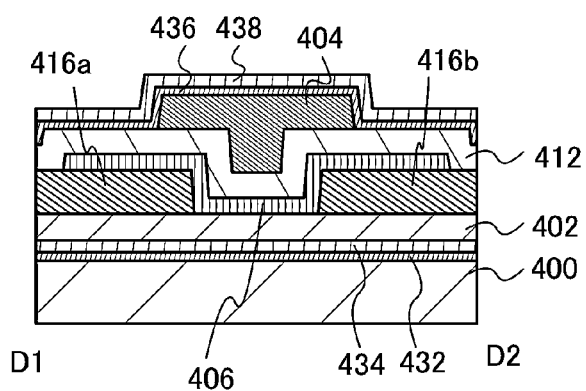

FIG. 4B is a cross-sectional view of a transistor including a crystalline insulating film 432 over a substrate 400; an aluminum oxide film 434 over the crystalline insulating film 432; a base insulating film 402 over the aluminum oxide film 434; a source electrode 416a and a drain electrode 416b over the base insulating film 402; a semiconductor film 406 over the base insulating film 402, and the source electrode 416a and the drain electrode 416b; the gate insulating film 412 over the semiconductor film 406; a gate electrode 404 which is over the gate insulating film 412 and overlaps with the semiconductor film 406; a crystalline insulating film 436 over the gate electrode 404; and an aluminum oxide film 438 over the crystalline insulating film 436. Note that the gate insulating film 412 includes a crystalline insulating film 412a and an aluminum oxide film 412b over the crystalline insulating film 412a.

Here, as the crystalline insulating film 432 and the crystalline insulating film 436, a film selected from the insulating films given as examples of the crystalline insulating film 132 and the crystalline insulating film 136 can be used.

The crystalline insulating film 432 and the crystalline insulating film 436 are each an insulating film having crystallinity, specifically, an insulating film whose crystallinity can be observed by XRD, electron diffraction, or neutron diffraction.

The aluminum oxide film 434 and the aluminum oxide film 438 each have crystallinity. Specifically, the crystallinity can be observed by XRD, electron diffraction, or neutron diffraction.

The aluminum oxide film 434 has crystallinity even near the interface with the crystalline insulating film 432. The aluminum oxide film 438 has crystallinity even near the interface with the crystalline insulating film 436. On the other hand, in the case where an aluminum oxide film is formed over a metal film or an amorphous insulating film which serves as a base, an amorphous aluminum oxide film is formed in the aluminum oxide film near the base.

The aluminum oxide film 434 and the aluminum oxide film 438 are each a high-density aluminum oxide film, specifically, an aluminum oxide film having a density greater than or equal to 3.2 g/cm$^3$ and less than or equal to 4.1 g/cm$^3$ measured by XRR or RBS. The aluminum oxide film 434 and the aluminum oxide film 438 each have a high barrier property against impurities; therefore, deterioration in electric characteristics of the transistor, which is caused by impurities, can be suppressed.

Note that the aluminum oxide film 434 does not include a low density layer near the crystalline insulating film 432, and the aluminum oxide film 438 does not either include a low density layer near the crystalline insulating film 436. Specifically, a layer having a density less than 3.2 g/cm$^3$ measured by XRR is not included. On the other hand, in the case where the aluminum oxide film is formed over the metal film or the amorphous insulating film which serves as a base, the aluminum oxide film having lower density is formed in the aluminum oxide film near the base. The aluminum oxide film having low density has low resistance to a chemical liquid and might be unintentionally etched in a chemical liquid treatment at the time of manufacturing the transistor. Consequently, shape defects and malfunctions of the transistor might occur.

The description of the semiconductor film 106 is referred to for the semiconductor film 406.

The description of the substrate 100 is referred to for the substrate 400.

The description of the base insulating film 302 is referred to for the base insulating film 402.

The base insulating film 402 is preferred to contain excess oxygen.

In the case where the base insulating film 402 contains excess oxygen, oxygen vacancies in the oxide semiconductor film can be reduced.

The description of the gate insulating film 112 is referred to for the gate insulating film 412.

The gate insulating film 412 is preferred to contain excess oxygen.

In the case where the gate insulating film 412 contains excess oxygen, oxygen vacancies in the oxide semiconductor film can be reduced.

The description of the source electrode 116a and the drain electrode 116b are referred to for the source electrode 416a and the drain electrode 416b.

The description of the gate electrode 104 is referred to for the gate electrode 404.

The transistor illustrated in FIGS. 4A to 4C is surrounded with the aluminum oxide film 434 and the aluminum oxide film 438 each having crystallinity and a high density. Thus, the transistor has a high barrier property against external impurities. Further, outward diffusion of excess oxygen contained in the transistor can be suppressed because the aluminum oxide films do not transmit oxygen.

Accordingly, the transistor illustrated in FIGS. 4A to 4C has stable electrical characteristics.

Note that although FIGS. 4A to 4C illustrate the structure including all of the crystalline insulating film 432, the aluminum oxide film 434, the crystalline insulating film 436, and the aluminum oxide film 438, one embodiment of the present invention is not limited to this structure. For example, the crystalline insulating film 432 and the aluminum oxide film 434 are not necessarily provided. Alternatively, the crystalline insulating film 436 and the aluminum oxide film 438 are not necessarily provided.

Next, a transistor having a structure different from those of the transistors illustrated in FIGS. 1A to 1C, FIGS. 2A to 2C, FIGS. 3A to 3C, and FIGS. 4A to 4C will be described with reference to FIGS. 5A to 5C.

Figure 5A:
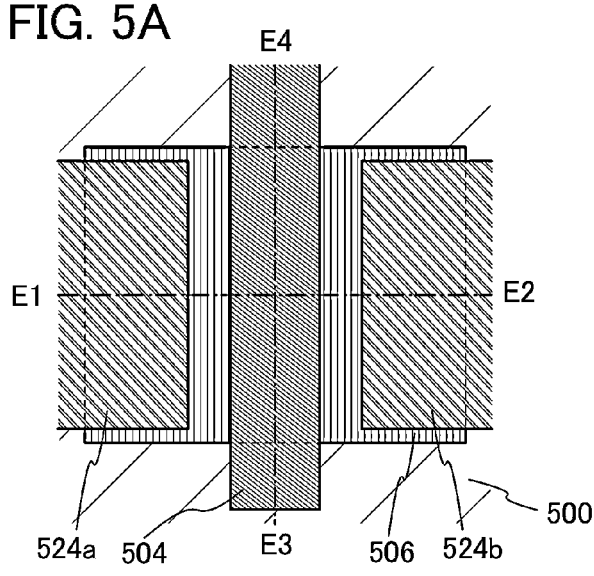
FIGS. 5A to 5C are a top view and cross-sectional views which show an example of a transistor of one embodiment of the present invention.

FIG. 5A is a top view of a transistor of one embodiment of the present invention. FIG. 5B is a cross-sectional view taken along dashed-dotted line E1-E2 in FIG. 5A. FIG. 5C is a cross-sectional view taken along dashed-dotted line E3-E4 in FIG. 5A. Note that for simplicity, a gate insulating film 512 and the like are not illustrated in FIG. 5A.

Figure 5C:
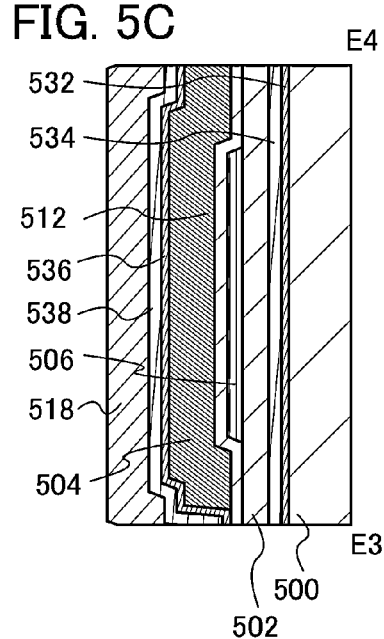
Figure 5B:
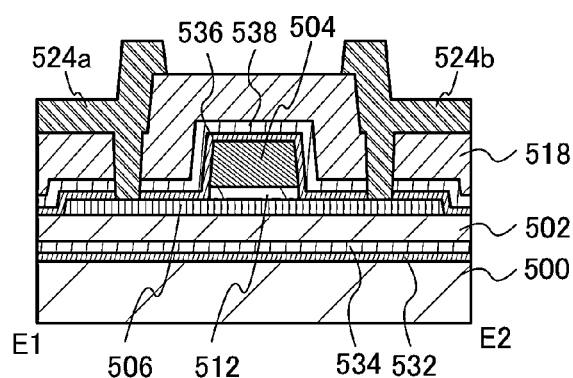

FIG. 5B is a cross-sectional view of a transistor including a crystalline insulating film 532 over a substrate 500; an aluminum oxide film 534 over the crystalline insulating film 532; a base insulating film 502 over the aluminum oxide film 534; a semiconductor film 506 over the base insulating film 502; the gate insulating film 512 over the semiconductor film 506; a gate electrode 504 which is over the gate insulating film 512 and overlaps with the semiconductor film 506; a crystalline insulating film 536 over the semiconductor film 506 and the gate electrode 504; and an aluminum oxide film 538 over the crystalline insulating film 536.

In the cross-sectional view in FIG. 5B, a protective insulating film 518 is provided over the aluminum oxide film 538. Note that openings reaching the semiconductor film 506 are formed in the crystalline insulating film 536, the aluminum oxide film 538, and the protective insulating film 518, and a wiring 524a and a wiring 524b provided over the protective insulating film 518 are in contact with the semiconductor film 506 through the openings.

Note that although the gate insulating film 512 is provided only in a region overlapping with the gate electrode 504 in FIG. 5B, one embodiment of the present invention is not limited to this structure. For example, the gate insulating film 512 may be provided so as to cover the semiconductor film 506. Alternatively, a sidewall insulating film may be provided in contact with a side surface of the gate electrode 504.

In the case of providing the sidewall insulating film, it is preferred that, in the semiconductor film 506, a region overlapping with the sidewall insulating film has lower resistance than a region overlapping with the gate electrode 504. For example, in the semiconductor film 506, a region not overlapping with the gate electrode 504 may contain an impurity that reduces the resistance of the semiconductor film 506. Alternatively, the resistance of the region may be reduced by defects. In the semiconductor film 506, the region overlapping with the sidewall insulating film has lower resistance than the region overlapping with the gate electrode 504; thus, the region serves as a lightly doped drain (LDD) region. With the LDD regions of the transistor, drain induced barrier lower (DIBL) and hot-carrier degradation can be suppressed. Note that in the semiconductor film 506, the region overlapping with the sidewall insulating film may serve also as an offset region. Also with the offset region of the transistor, DIBL and hot-carrier degradation can be suppressed.

Here, as the crystalline insulating film 532 and the crystalline insulating film 536, a film selected from the insulating films given as examples of the crystalline insulating film 132 and the crystalline insulating film 136 can be used.

The crystalline insulating film 532 and the crystalline insulating film 536 are each an insulating film having crystallinity, specifically, an insulating film whose crystallinity can be observed by XRD, electron diffraction, or neutron diffraction.

The aluminum oxide film 534 and the aluminum oxide film 538 each have crystallinity. Specifically, the crystallinity can be observed by XRD, electron diffraction, or neutron diffraction.

The aluminum oxide film 534 has crystallinity even near the interface with the crystalline insulating film 532. The aluminum oxide film 538 has crystallinity even near the interface with the crystalline insulating film 536. On the other hand, in the case where an aluminum oxide film is formed over a metal film or an amorphous insulating film which serves as a base, an amorphous aluminum oxide film is formed in the aluminum oxide film near the base.

The aluminum oxide film 534 and the aluminum oxide film 538 are each a high-density aluminum oxide film, specifically, an aluminum oxide film having a density greater than or equal to 3.2 g/cm$^3$ and less than or equal to 4.1 g/cm$^3$ measured by XRR or RBS. The aluminum oxide film 534 and the aluminum oxide film 538 each have a high barrier property against impurities; therefore, deterioration in electric characteristics of the transistor, which is caused by impurities, can be suppressed.

Note that the aluminum oxide film 534 does not include a low density layer near the crystalline insulating film 532, and the aluminum oxide film 538 does not either include a low density layer near the crystalline insulating film 536. Specifically, a layer having a density less than 3.2 g/cm$^3$ measured by XRR is not included. On the other hand, in the case where the aluminum oxide film is formed over the metal film or the amorphous insulating film which serves as a base, the aluminum oxide film having lower density is formed in the aluminum oxide film near the base. The aluminum oxide film having low density has low resistance to a chemical liquid and might be unintentionally etched in a chemical liquid treatment at the time of manufacturing the transistor. Consequently, shape defects and malfunctions of the transistor might occur.

The description of the semiconductor film 106 is referred to for the semiconductor film 506.

It is preferred that, in the semiconductor film 506, the region not overlapping with the gate electrode 504 has lower resistance than a region overlapping with the gate electrode 504. For example, in the semiconductor film 506, the region not overlapping with the gate electrode 504 may contain an impurity that reduces the resistance of the semiconductor film 506. Alternatively, the resistance of the region may be reduced by defects. In the semiconductor film 506, the region not overlapping with the gate electrode 504 has lower resistance than the region overlapping with the gate electrode 504; thus, the region can serve as a source region and a drain region of the transistor.

The description of the substrate 100 is referred to for the substrate 500.

The description of the base insulating film 302 is referred to for the base insulating film 502.

The base insulating film 502 is preferred to contain excess oxygen.

In the case where the base insulating film 502 contains excess oxygen, oxygen vacancies in the oxide semiconductor film can be reduced.

The description of the gate insulating film 112 is referred to for the gate insulating film 512.

The gate insulating film 512 is preferred to contain excess oxygen.

In the case where the gate insulating film 512 contains excess oxygen, oxygen vacancies in the oxide semiconductor film can be reduced.

The description of the gate electrode 104 is referred to for the gate electrode 504.

The protective insulating film 518 can be formed to have a single-layer or a stacked-layer structure of an insulating film containing one or more of the following: aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

The wiring 524a and the wiring 524b can be formed to have a single-layer or a stacked-layer structure of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances. Note that the wiring 524a and the wiring 524b may be the same or different from each other.

In the transistor illustrated in FIGS. 5A to 5C, a region where the gate electrode 504 overlaps with another wiring and electrode is small; therefore, parasitic capacitance is unlikely to be generated. Accordingly, the switching characteristics of the transistor can be enhanced. Moreover, the channel length of the transistor is determined by the width of the gate electrode 504; therefore, a miniaturized transistor having a short channel length is manufactured easily.

The transistor illustrated in FIGS. 5A to 5C is surrounded with the aluminum oxide film 534 and the aluminum oxide film 538 each having crystallinity and a high density. Thus, the transistor has a high barrier property against external impurities. Further, outward diffusion of excess oxygen contained in the transistor can be suppressed because the aluminum oxide films do not transmit oxygen.

Accordingly, the transistor illustrated in FIGS. 5A to 5C has stable electrical characteristics.

Note that although FIGS. 5A to 5C illustrate the structure including all of the crystalline insulating film 532, the aluminum oxide film 534, the crystalline insulating film 536, and the aluminum oxide film 538, one embodiment of the present invention is not limited to this structure. For example, the crystalline insulating film 532 and the aluminum oxide film 534 are not necessarily provided. Alternatively, the crystalline insulating film 536 and the aluminum oxide film 538 are not necessarily provided.

Next, a transistor having a structure different from those of the transistors illustrated in FIGS. 1A to 1C, FIGS. 2A to 2C, FIGS. 3A to 3C, FIGS. 4A to 4C, and FIGS. 5A to 5C will be described with reference to FIGS. 6A to 6C.

Figure 6A:
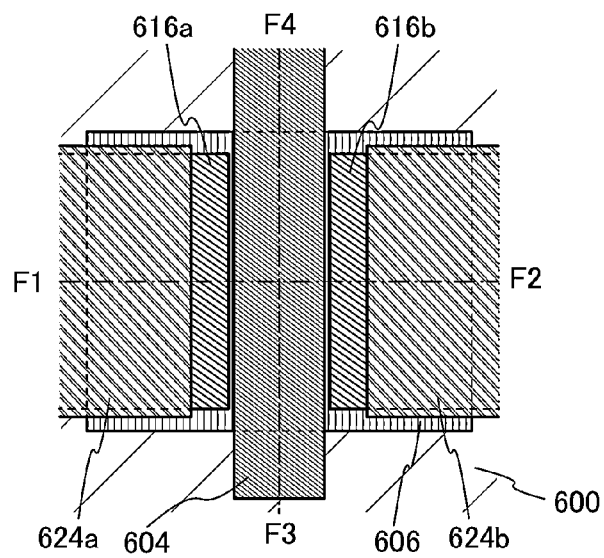
FIGS. 6A to 6C are a top view and cross-sectional views which show an example of a transistor of one embodiment of the present invention.

FIG. 6A is a top view of a transistor of one embodiment of the present invention. FIG. 6B is a cross-sectional view taken along dashed-dotted line F1-F2 in FIG. 6A. FIG. 6C is a cross-sectional view taken along dashed-dotted line F3-F4 in FIG. 6A. Note that for simplicity, a gate insulating film 612 and the like are not illustrated in FIG. 6A.

Figure 6C:
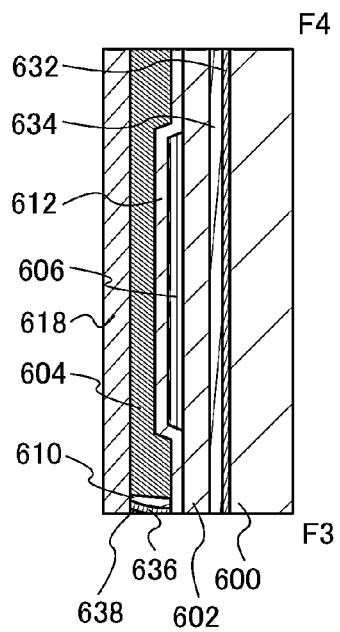
Figure 6B:
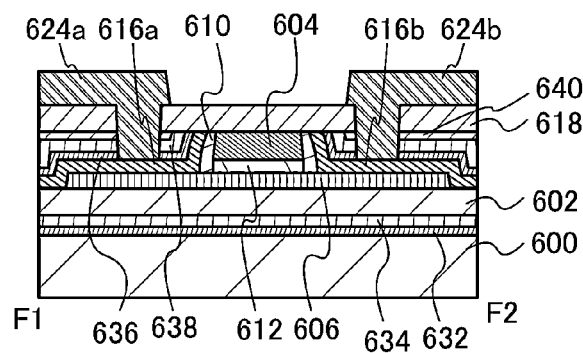

FIG. 6B is a cross-sectional view of a transistor including a crystalline insulating film 632 over a substrate 600; an aluminum oxide film 634 over the crystalline insulating film 632; a base insulating film 602 over the aluminum oxide film 634; a semiconductor film 606 over the base insulating film 602; the gate insulating film 612 over the semiconductor film 606; a gate electrode 604 over the gate insulating film 612; a sidewall insulating film 610 in contact with side surfaces of the gate electrode 604; a source electrode 616a and a drain electrode 616b over the semiconductor film 606 and the sidewall insulating film 610; a crystalline insulating film 636 over the semiconductor film 606, and the source electrode 616a and the drain electrode 616b; an aluminum oxide film 638 over the crystalline insulating film 636; and an insulating film 640 over the aluminum oxide film 638.

In the cross-sectional view in FIG. 6B, a protective insulating film 618 is provided over the gate electrode 604, the sidewall insulating film 610, the source electrode 616a and the drain electrode 616b, the crystalline insulating film 636, the aluminum oxide film 638, and the insulating film 640. Note that openings reaching the source electrode 616a and the drain electrode 616b are formed in the crystalline insulating film 636, the aluminum oxide film 638, the insulating film 640, and the protective insulating film 618, and a wiring 624a and a wiring 624b provided over the protective insulating film 618 are in contact with the source electrode 616a and the drain electrode 616b through the openings.

Note that although part of the sidewall insulating film 610 is provided on the side surfaces of the gate insulating film 612 in FIG. 6B, one embodiment of the present invention is not limited to this structure. For example, the sidewall insulating film 610 may be provided over the gate insulating film 612.

Note that, in FIG. 6B, the surfaces of the gate electrode 604, the sidewall insulating film 610, the source electrode 616a and the drain electrode 616b, the crystalline insulating film 636, the aluminum oxide film 638, and the insulating film 640 are level with one another.

Here, as the crystalline insulating film 632 and the crystalline insulating film 636, a film selected from the insulating films given as examples of the crystalline insulating film 132 and the crystalline insulating film 136 can be used.

The crystalline insulating film 632 and the crystalline insulating film 636 are each an insulating film having crystallinity, specifically, an insulating film whose crystallinity can be observed by XRD, electron diffraction, or neutron diffraction.

The aluminum oxide film 634 and the aluminum oxide film 638 each have crystallinity. Specifically, the crystallinity can be observed by XRD, electron diffraction, or neutron diffraction.

The aluminum oxide film 634 has crystallinity even near the interface with the crystalline insulating film 632. The aluminum oxide film 638 has crystallinity even near the interface with the crystalline insulating film 636. On the other hand, in the case where an aluminum oxide film is formed over a metal film or an amorphous insulating film which serves as a base, an amorphous aluminum oxide film is formed in the aluminum oxide film near the base.

The aluminum oxide film 634 and the aluminum oxide film 638 are each a high-density aluminum oxide film, specifically, an aluminum oxide film having a density greater than or equal to 3.2 g/cm$^3$ and less than or equal to 4.1 g/cm$^3$ measured by XRR or RBS. The aluminum oxide film 634 and the aluminum oxide film 638 each have a high barrier property against impurities; therefore, deterioration in electric characteristics of the transistor, which is caused by impurities, can be suppressed.

Note that the aluminum oxide film 634 does not include a low density layer near the crystalline insulating film 632, and the aluminum oxide film 638 does not either include a low density layer near the crystalline insulating film 636. Specifically, a layer having a density less than 3.2 g/cm$^3$ measured by XRR is not included. On the other hand, in the case where the aluminum oxide film is formed over the metal film or the amorphous insulating film which serves as a base, the aluminum oxide film having lower density is formed in the aluminum oxide film near the base. The aluminum oxide film having low density has low resistance to a chemical liquid and might be unintentionally etched in a chemical liquid treatment at the time of manufacturing the transistor. Consequently, shape defects and malfunctions of the transistor might occur.

The description of the semiconductor film 106 is referred to for the semiconductor film 606.

It is preferred that, in the semiconductor film 606, a region not overlapping with the gate electrode 604 has lower resistance than a region overlapping with the gate electrode 604. For example, in the semiconductor film 606, the region not overlapping with the gate electrode 604 may contain an impurity that reduces the resistance of the semiconductor film 606. Alternatively, the resistance of the region may be reduced by defects. In the semiconductor film 606, the region not overlapping with the gate electrode 604 has lower resistance than the region overlapping with the gate electrode 604; thus, the region can serve as a source region and a drain region of the transistor. However, since the transistor illustrated in FIG. 6B includes the source electrode 616*a* and the drain electrode 616*b*, a source region and a drain region are not necessarily provided.

It is preferred that, in the semiconductor film 606, a region overlapping with the sidewall insulating film 610 has higher resistance than a region overlapping with the source electrode 616*a* and the drain electrode 616*b* and lower resistance than a region overlapping with the gate electrode 604. For example, in the semiconductor film 606, the region not overlapping with the gate electrode 604 may contain an impurity that reduces the resistance of the semiconductor film 606. Alternatively, the resistance of the region may be reduced by defects. In the semiconductor film 606, the region overlapping with the sidewall insulating film 610 has higher resistance than the source electrode 616*a* and the drain electrode 616*b* and lower resistance than the region overlapping with the gate electrode 604; thus, the region serves as an LDD region. With the LDD regions of the transistor, DIBL and hot-carrier degradation can be suppressed. Note that in the semiconductor film 606, the region overlapping with the sidewall insulating film 610 may serve also as an offset region. Also with the offset region of the transistor, DIBL and hot-carrier degradation can be suppressed.

The description of the substrate 100 is referred to for the substrate 600.

The description of the base insulating film 302 is referred to for the base insulating film 602.

The base insulating film 602 is preferred to contain excess oxygen.

In the case where the base insulating film 602 contains excess oxygen, oxygen vacancies in the oxide semiconductor film can be reduced.

The description of the gate insulating film 112 is referred to for the gate insulating film 612.

The gate insulating film 612 is preferred to contain excess oxygen.

In the case where the gate insulating film 612 contains excess oxygen, oxygen vacancies in the oxide semiconductor film can be reduced.

The description of the gate electrode 104 is referred to for the gate electrode 604.

The sidewall insulating film 610 can be formed to have a single-layer or a stacked-layer structure of an insulating film containing one or more of the following: aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

Note that it is preferred to use a crystalline insulating film and an aluminum oxide film over the crystalline insulating film for the sidewall insulating film 610. With such a structure, shape defects of the sidewall insulating film 610 can be made unlikely to occur.

The source electrode 616*a* and the drain electrode 616*b* can be formed to have a single-layer or a stacked-layer structure of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances. Note that the source electrode 616*a* and the drain electrode 616*b* may be the same or different from each other.

The description of the protective insulating film 518 is referred to for the protective insulating film 618.

The description of the wiring 524*a* and the wiring 524*b* are referred to for the wiring 624*a* and the wiring 624*b*.

In the transistor illustrated in FIGS. 6A to 6C, a region where the gate electrode 604 overlaps with another wiring and electrode is small; therefore, parasitic capacitance is unlikely to be generated. Accordingly, the switching characteristics of the transistor can be enhanced. The source electrode 616*a* and the drain electrode 616*b* are provided, whereby parasitic resistance can be made lower than that of the transistor illustrated in FIGS. 5A to 5C. Accordingly, an on-state current can be increased. Moreover, the channel length of the transistor is determined by the width of the gate electrode 604; therefore, a miniaturized transistor having a short channel length is manufactured easily.

The transistor illustrated in FIGS. 6A to 6C is surrounded with the aluminum oxide film 634 and the aluminum oxide film 638 each having crystallinity and a high density. Thus, the transistor has a high barrier property against external impurities. Further, outward diffusion of excess oxygen contained in the transistor can be suppressed because the aluminum oxide films do not transmit oxygen.

Accordingly, the transistor illustrated in FIGS. 6A to 6C has stable electrical characteristics.

Note that although FIGS. 6A to 6C illustrate the structure including all of the crystalline insulating film 632, the aluminum oxide film 634, the crystalline insulating film 636, and the aluminum oxide film 638, one embodiment of the present invention is not limited to this structure. For example, the crystalline insulating film 632 and the aluminum oxide film 634 are not necessarily provided. Alternatively, the crystalline insulating film 636 and the aluminum oxide film 638 are not necessarily provided.

According to this embodiment, since a gate insulating film has a high barrier property against impurities and contains fewer defects, a transistor having stable electric characteristics and high reliability can be provided.

This embodiment shows an example of a basic principle. Thus, part or the whole of this embodiment can be freely combined with, applied to, or replaced with part or the whole of another embodiment.

[Embodiment 2]

In this embodiment, methods for manufacturing the transistors described in Embodiment 1 will be described.

First, a method for manufacturing the transistor illustrated in FIGS. 1A to 1C will be described with reference to FIGS. 7A to 7D and FIGS. 8A to 8C. Note that only cross-sectional views corresponding to FIG. 1B are shown for simplicity in FIGS. 7A to 7D and FIGS. 8A to 8C.

First, the substrate 100 is prepared. As the substrate 100, a substrate selected from the substrates given as examples of the substrate 100 can be used.

Figure 7A:
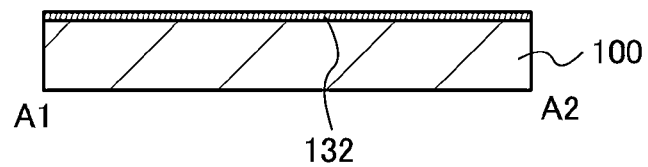
FIGS. 7A to 7D are cross-sectional views illustrating an example of a method for manufacturing the transistor illustrated in FIGS. 1A to 1C.

Next, the crystalline insulating film 132 is formed (see FIG. 7A). The crystalline insulating film 132 can be formed using an insulating film selected from the insulating films given as examples of the crystalline insulating film 132 and can be formed by a sputtering method, a chemical vapor deposition (CVD) method, a molecular beam epitaxy (MBE) method, an atomic layer deposition (ALD) method, or a pulsed laser deposition (PLD) method. Note that it is preferred to employ a sputtering method because an insulating film having crystallinity and a high density is likely to be formed. Moreover, it is preferred to form the crystalline insulating film 132 while the substrate is heated at a temperature higher than or equal to 100° C. and lower than or equal to 450° C. because an insulating film having crystallinity and a high density is likely to be formed.

When a microwave CVD method is employed as the CVD method, plasma damage to a surface to be formed can be made small. Since high-density plasma is used, a dense film having fewer defects can be formed even at a relatively low temperature (at approximately 325° C.). Note that the microwave CVD method is also referred to as a high-density plasma CVD method.

Note that a first heat treatment may be performed after the crystalline insulating film 132 is formed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, preferably 1% or more, further preferably 10% or more, or under reduced pressure. Alternatively, the first heat treatment may be performed in such a manner that a heat treatment is performed in an inert gas atmosphere, and then another heat treatment is performed in an atmosphere containing an oxidizing gas at 10 ppm or more, preferably 1% or more, further preferably 10% or more in order to compensate desorbed oxygen. By the first heat treatment, the crystallinity of the crystalline insulating film 132 can be improved and impurities such as hydrogen and water can be removed.

Figure 7B:
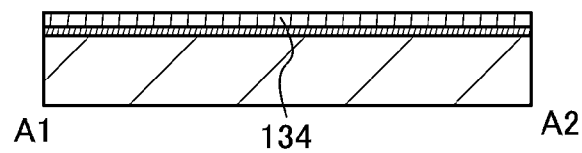

Next, the aluminum oxide film 134 is formed (see FIG. 7B). The aluminum oxide film 134 can be formed by a sputtering method, a CVD method, an MBE method, an ALD method, or a PLD method.

The aluminum oxide film 134 is formed over the crystalline insulating film 132, whereby the aluminum oxide film 134 having crystallinity and a high density can be formed. The aluminum oxide film 134 having crystallinity and a high density is unlikely to transmit hydrogen, water, oxygen, and a metal element. Thus, the aluminum oxide film 134 serves as a barrier film against impurities which cause deterioration in electrical characteristics of the transistor.

Note that it is preferred to employ a sputtering method because the aluminum oxide film 134 having crystallinity and a high density is likely to be formed over the crystalline insulating film 132. Moreover, it is preferred to form the aluminum oxide film 134 while the substrate is heated at a temperature higher than or equal to 100° C. and lower than or equal to 450° C. because an insulating film having crystallinity and a high density is likely to be formed.

Next, a conductive film to be the gate electrode 104 is formed. The conductive film to be the gate electrode 104 can be formed using a conductive film selected from the conductive films given as examples of the gate electrode 104 and can be formed by a sputtering method, a CVD method, an MBE method, an ALD method, or a PLD method.

Figure 7C:
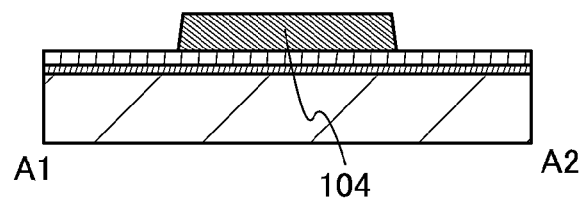

Next, the conductive film to be the gate electrode 104 is processed to form the gate electrode 104 (see FIG. 7C).

Figure 7D:
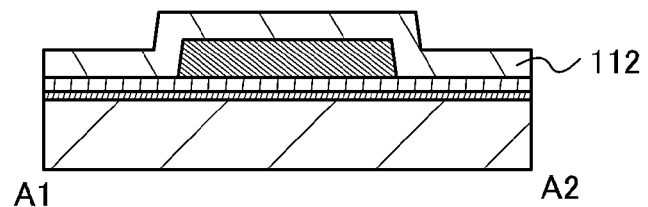

Next, the gate insulating film 112 is formed (see FIG. 7D). The gate insulating film 112 can be formed using an insulating film selected from the insulating films given as examples of the gate insulating film 112 and can be formed by a sputtering method, a CVD method, an MBE method, an ALD method, or a PLD method.

Next, a semiconductor film to be the semiconductor film 106 is formed. The semiconductor film to be the semiconductor film 106 can be formed using a semiconductor film selected from the semiconductor films given as examples of the semiconductor film 106 and can be formed by a sputtering method, a CVD method, an MBE method, an ALD method, or a PLD method. The semiconductor film to be the semiconductor film 106 is preferred to be formed using an oxide semiconductor film by a sputtering method. Note that it is preferred to employ a sputtering method because an oxide semiconductor film having crystallinity and a high density is likely to be formed. Moreover, it is preferred to form the oxide semiconductor film while the substrate is heated at a temperature higher than or equal to 100° C. and lower than or equal to 450° C. because an oxide semiconductor film having crystallinity and a high density is likely to be formed.

Note that a second heat treatment may be performed after the oxide semiconductor film is formed. The second heat treatment can be performed under the conditions shown in the first heat treatment. By the second heat treatment, the crystallinity of the oxide semiconductor film can be improved and further impurities such as hydrogen and water can be removed from the oxide semiconductor film.

Figure 8A:
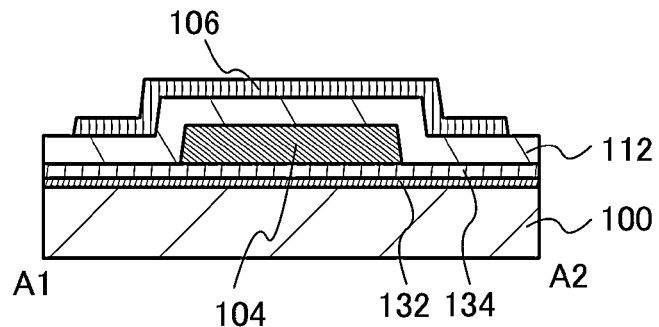
FIGS. 8A to 8C are cross-sectional views illustrating the example of the method for manufacturing the transistor illustrated in FIGS. 1A to 1C.

Next, the semiconductor film to be the semiconductor film 106 is processed into an island shape to form the semiconductor film 106 (see FIG. 8A).

Note that when the semiconductor film 106 is an oxide semiconductor film, a third heat treatment may be performed after the semiconductor film 106 is formed. The third heat treatment can be performed under the conditions shown in the first heat treatment. By the third heat treatment, which is performed with the side surfaces of the oxide semiconductor film exposed, impurities such as hydrogen and water are likely to be removed from the side surfaces of the oxide semiconductor film and thus the impurities can be effectively removed. Note that when the oxide semiconductor film is a CAAC-OS film, impurities diffuse easily along a layer of crystal; thus, impurities such as hydrogen and water are further likely to be removed form the side surfaces.

Next, a conductive film to be the source electrode 116a and the drain electrode 116b is formed. The conductive film to be the source electrode 116a and the drain electrode 116b can be formed using a conductive film selected from the conductive films given as examples of the source electrode 116a and the drain electrode 116b and can be formed by a sputtering method, a CVD method, an MBE method, an ALD method, or a PLD method.

Figure 8B:
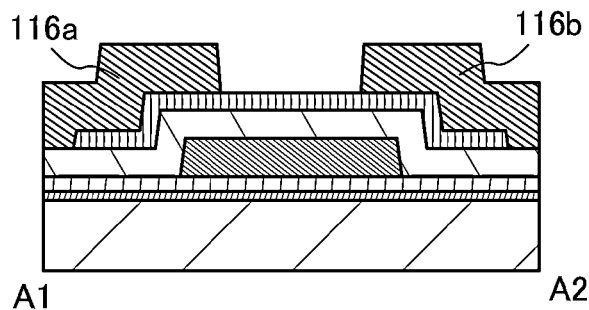

Next, the conductive film to be the source electrode 116a and the drain electrode 116b is processed to form the source electrode 116a and the drain electrode 116b (see FIG. 8B).

Next, the protective insulating film 118 is formed. The protective insulating film 118 can be formed using an insulating film selected from the insulating films given as examples of the protective insulating film 118 and can be formed by a sputtering method, a CVD method, an MBE method, an ALD method, or a PLD method.

As the protective insulating film 118, for example, a silicon oxide film is preferred to be formed by an RF sputtering method under the following conditions: a quartz (preferably synthetic quartz) target is used; the substrate heating temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas. With such a method, the protective insulating film 118 can contain excess oxygen.

Next, the crystalline insulating film 136 is formed. The crystalline insulating film 136 can be formed using an insulating film selected from the insulating films given as examples of the crystalline insulating film 136 and can be formed by a sputtering method, a CVD method, an MBE method, an ALD method, or a PLD method.

Next, a fourth heat treatment may be performed. The fourth heat treatment may be performed under conditions selected from conditions similar to those of the first heat treatment. By the fourth heat treatment, the crystallinity of the crystalline insulating film 136 can be improved and impurities such as hydrogen and water can be removed. When the semiconductor film 106 is an oxide semiconductor film and the protective insulating film 118 contains excess oxygen, defects in the semiconductor film 106 (oxygen vacancies in the oxide semiconductor film) can be reduced.

Figure 8C:
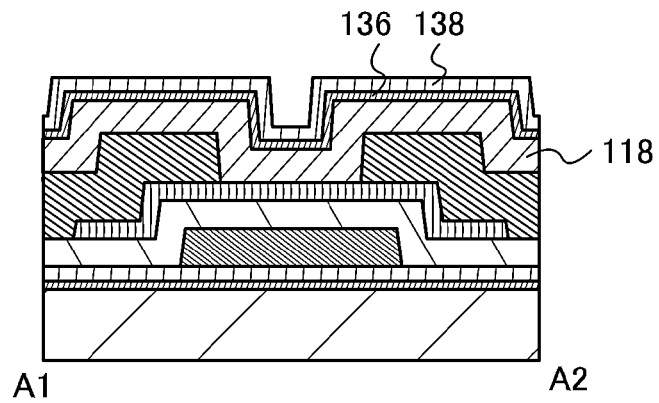

Next, the aluminum oxide film 138 is formed (see FIG. 8C). The aluminum oxide film 138 can be formed by a sputtering method, a CVD method, an MBE method, an ALD method, or a PLD method.

Next, a fifth heat treatment may be performed. The fifth heat treatment may be performed under conditions selected from conditions similar to those of the first heat treatment. By the fifth heat treatment, when the semiconductor film 106 is an oxide semiconductor film and the protective insulating film 118 contains excess oxygen, defects in the semiconductor film 106 (oxygen vacancies in the oxide semiconductor film) can be reduced. Note that the fifth heat treatment may be substituted for the fourth heat treatment. At this time, with the aluminum oxide film 138, outward diffusion of excess oxygen can be suppressed and oxygen vacancies can be effectively reduced.

Through the above steps, the transistor illustrated in FIGS. 1A to 1C can be manufactured.

When the semiconductor film 106 is an oxide semiconductor film, a transistor having stable electrical characteristics and high reliability can be provided by performing the first to fifth heat treatments. Moreover, the aluminum oxide film 134 and the aluminum oxide film 138 each serve as a barrier film against impurities which cause deterioration in electrical characteristics of the transistor. Thus, even in the case where diffusion of the impurities occurs, the first to fifth heat treatments can prevent deterioration in electrical characteristics from being caused. However, one embodiment of the present invention is not limited to performing all of the first to fifth heat treatments.

Next, a method for manufacturing the transistor illustrated in FIGS. 2A to 2C will be described with reference to FIGS. 9A to 9D and FIGS. 10A to 10C. Note that only cross-sectional views corresponding to FIG. 2B are shown for simplicity in FIGS. 9A to 9D and FIGS. 10A to 10C.

First, the substrate 200 is prepared. As the substrate 200, a substrate selected from the substrates given as examples of the substrate 200 can be used.

Figure 9A:
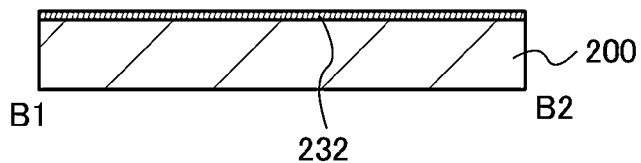
FIGS. 9A to 9D are cross-sectional views illustrating an example of a method for manufacturing the transistor illustrated in FIGS. 2A to 2C.

Next, the crystalline insulating film 232 is formed (see FIG. 9A). The crystalline insulating film 232 can be formed using an insulating film selected from the insulating films given as examples of the crystalline insulating film 232 and can be formed by a sputtering method, a CVD method, a MBE method, an ALD method, or a PLD method. Note that it is preferred to employ a sputtering method because an insulating film having crystallinity and a high density is likely to be formed. Moreover, it is preferred to form the crystalline insulating film 232 while the substrate is heated at a temperature higher than or equal to 100° C. and lower than or equal to 450° C. because an insulating film having crystallinity and a high density is likely to be formed.

Note that a sixth heat treatment may be performed after the crystalline insulating film 232 is formed. The sixth heat treatment can be performed under the conditions shown in the first heat treatment. By the sixth heat treatment, the crystallinity of the crystalline insulating film 232 can be improved and impurities such as hydrogen and water can be removed.

Figure 9B:
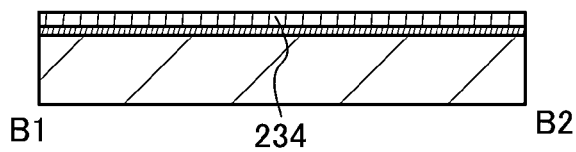

Next, the aluminum oxide film 234 is formed (see FIG. 9B). The aluminum oxide film 234 can be formed by a sputtering method, a CVD method, an MBE method, an ALD method, or a PLD method.

The aluminum oxide film 234 is formed over the crystalline insulating film 232, whereby the aluminum oxide film 234 having crystallinity and a high density can be formed. The aluminum oxide film 234 having crystallinity and a high density is unlikely to transmit hydrogen, water, oxygen, and a metal element. Thus, the aluminum oxide film 234 serves as a barrier film against impurities which cause deterioration in electrical characteristics of the transistor.

Note that it is preferred to employ a sputtering method because the aluminum oxide film 234 having crystallinity and a high density is likely to be formed over the crystalline insulating film 232. Moreover, it is preferred to form the aluminum oxide film 234 while the substrate is heated at a temperature higher than or equal to 100° C. and lower than or equal to 450° C. because an insulating film having crystallinity and a high density is likely to be formed.

Next, a conductive film to be the gate electrode 204 is formed. The conductive film to be the gate electrode 204 can be formed using a conductive film selected from the conductive films given as examples of the gate electrode 204 and can be formed by a sputtering method, a CVD method, an MBE method, an ALD method, or a PLD method.

Figure 9C:
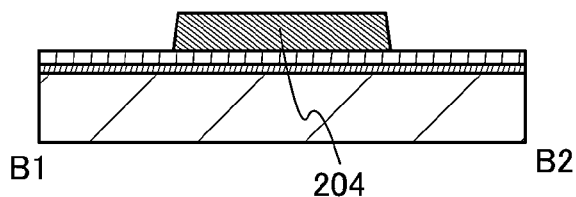

Next, the conductive film to be the gate electrode 204 is processed to form the gate electrode 204 (see FIG. 9C).

Figure 9D:
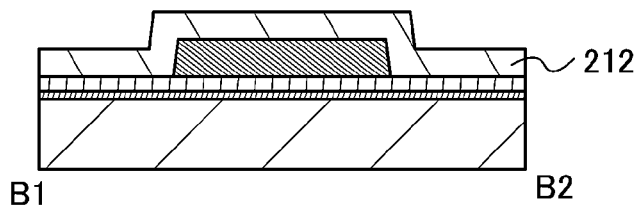

Next, the gate insulating film 212 is formed (see FIG. 9D). The gate insulating film 212 can be formed using an insulating film selected from the insulating films given as examples of the gate insulating film 212 and can be formed by a sputtering method, a CVD method, an MBE method, an ALD method, or a PLD method.

Next, a conductive film to be the source electrode 216a and the drain electrode 216b is formed. The conductive film to be the source electrode 216a and the drain electrode 216b can be formed using a conductive film selected from the conductive films given as examples of the source electrode 216a and the drain electrode 216b and can be formed by a sputtering method, a CVD method, an MBE method, an ALD method, or a PLD method.

Figure 10A:
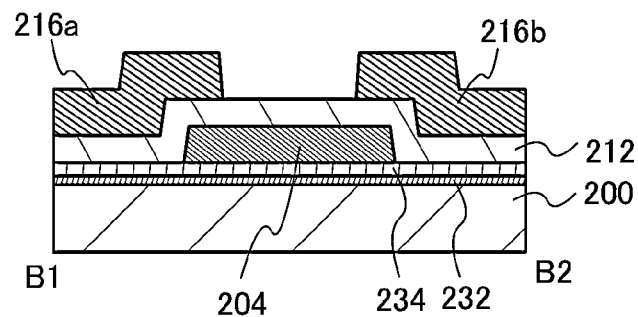
FIGS. 10A to 10C are cross-sectional views illustrating the example of the method for manufacturing the transistor illustrated in FIGS. 2A to 2C.

Next, the conductive film to be the source electrode 216a and the drain electrode 216b is processed to form the source electrode 216a and the drain electrode 216b (see FIG. 10A).

Next, a semiconductor film to be the semiconductor film 206 is formed. The semiconductor film to be the semiconductor film 206 can be formed using a semiconductor film selected from the semiconductor films given as examples of the semiconductor film 206 and can be formed by a sputtering method, a CVD method, an MBE method, an ALD method, or a PLD method. The semiconductor film to be the semiconductor film 206 is preferred to be formed using an oxide semiconductor film by a sputtering method. Note that it is preferred to employ a sputtering method because an oxide semiconductor film having crystallinity and a high density is likely to be formed. Moreover, it is preferred to form the oxide semiconductor film while the substrate is heated at a temperature higher than or equal to 100° C. and lower than or equal to 450° C. because an oxide semiconductor film having crystallinity and a high density is likely to be formed.

Note that a seventh heat treatment may be performed after the oxide semiconductor film is formed. The seventh heat treatment can be performed under the conditions shown in the first heat treatment. By the seventh heat treatment, the crystallinity of the oxide semiconductor film can be improved and further impurities such as hydrogen and water can be removed from the oxide semiconductor film.

Figure 10B:
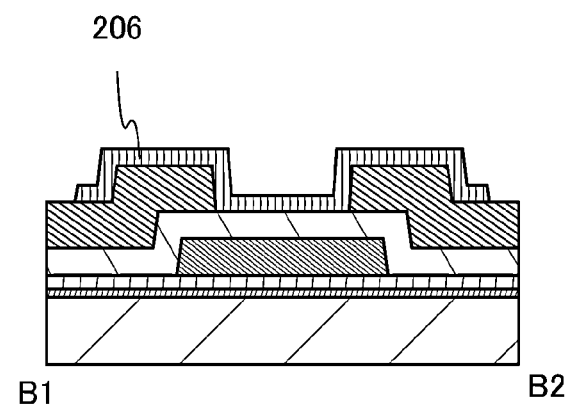

Next, the semiconductor film to be the semiconductor film 206 is processed into an island shape to form the semiconductor film 206 (see FIG. 10B).

Note that when the semiconductor film 206 is an oxide semiconductor film, an eighth heat treatment may be performed after the semiconductor film 206 is formed. The eighth heat treatment can be performed under the conditions shown in the first heat treatment. By the eighth heat treatment, which is performed with the side surfaces of the oxide semiconductor film exposed, impurities such as hydrogen and water are likely to be removed from the side surfaces of the oxide semiconductor film and thus the impurities can be effectively removed. Moreover, impurities such as hydrogen and water that exist at an interface between the gate insulating film 212 and the semiconductor film 206 can also be removed. Note that when the oxide semiconductor film is a CAAC-OS film, impurities diffuse easily along a layer of crystal; thus, impurities such as hydrogen and water are further likely to be removed form the side surfaces.

Next, the protective insulating film 218 is formed. The protective insulating film 218 can be formed using an insulating film selected from the insulating films given as examples of the protective insulating film 218 and can be formed by a sputtering method, a CVD method, an MBE method, an ALD method, or a PLD method.

As the protective insulating film 218, for example, a silicon oxide film is preferred to be formed by an RF sputtering method under the following conditions: a quartz (preferably synthetic quartz) target is used; the substrate heating temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas. With such a method, the protective insulating film 218 can contain excess oxygen.

Next, the crystalline insulating film 236 is formed. The crystalline insulating film 236 can be formed using an insulating film selected from the insulating films given as examples of the crystalline insulating film 236 and can be formed by a sputtering method, a CVD method, an MBE method, an ALD method, or a PLD method.

Next, a ninth heat treatment may be performed. The ninth heat treatment may be performed under conditions selected from conditions similar to those of the first heat treatment. By the ninth heat treatment, the crystallinity of the crystalline insulating film 236 can be improved and impurities such as hydrogen and water can be removed. When the semiconductor film 206 is an oxide semiconductor film and the protective insulating film 218 contains excess oxygen, defects in the semiconductor film 206 (oxygen vacancies in the oxide semiconductor film) can be reduced.

Figure 10C:
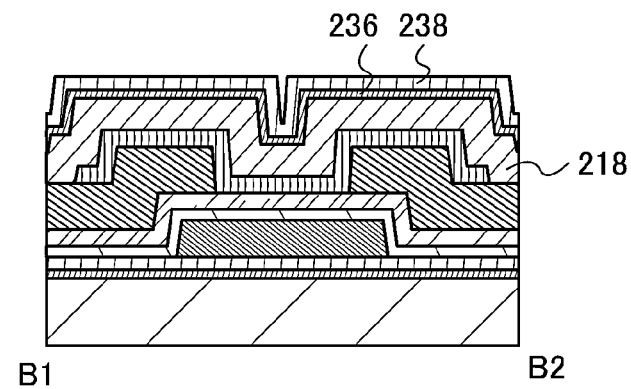

Next, the aluminum oxide film 238 is formed (see FIG. 10C). The aluminum oxide film 238 can be formed by a sputtering method, a CVD method, an MBE method, an ALD method, or a PLD method.

Next, a tenth heat treatment may be performed. The tenth heat treatment may be performed under conditions selected from conditions similar to those of the first heat treatment. By the tenth heat treatment, when the semiconductor film 206 is an oxide semiconductor film and the protective insulating film 218 contains excess oxygen, defects in the semiconductor film 206 (oxygen vacancies in the oxide semiconductor film) can be reduced. Note that the tenth heat treatment may be substituted for the ninth heat treatment. At this time, with the aluminum oxide film 238, outward diffusion of excess oxygen can be suppressed and oxygen vacancies can be effectively reduced.

Through the above steps, the transistor illustrated in FIGS. 2A to 2C can be manufactured.

When the semiconductor film 206 is an oxide semiconductor film, a transistor having stable electrical characteristics and high reliability can be provided by performing the sixth to tenth heat treatments. Moreover, the aluminum oxide film 234 and the aluminum oxide film 238 each serve as a barrier film against impurities which cause deterioration in electrical characteristics of the transistor. Thus, even in the case where diffusion of the impurities occurs, the sixth to tenth heat treatments can prevent deterioration in electrical characteristics from being caused. However, one embodiment of the present invention is not limited to performing all of the sixth to tenth heat treatments.

Next, a method for manufacturing the transistor illustrated in FIGS. 3A to 3C will be described with reference to FIGS. 11A to 11D and FIGS. 12A to 12D. Note that only cross-sectional views corresponding to FIG. 3B are shown for simplicity in FIGS. 11A to 11D and FIGS. 12A to 12D.

First, the substrate 300 is prepared. As the substrate 300, a substrate selected from the substrates given as examples of the substrate 300 can be used.

Figure 11A:
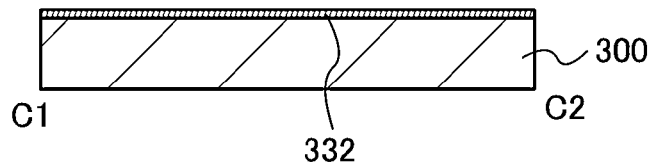
FIGS. 11A to 11D are cross-sectional views illustrating an example of a method for manufacturing the transistor illustrated in FIGS. 3A to 3C.

Next, the crystalline insulating film 332 is formed (see FIG. 11A). The crystalline insulating film 332 can be formed using an insulating film selected from the insulating films given as examples of the crystalline insulating film 332 and can be formed by a sputtering method, a CVD method, a MBE method, an ALD method, or a PLD method. Note that it is preferred to employ a sputtering method because an insulating film having crystallinity and a high density is likely to be formed. Moreover, it is preferred to form the crystalline insulating film 332 while the substrate is heated at a temperature higher than or equal to 100° C. and lower than or equal to 450° C. because an insulating film having crystallinity and a high density is likely to be formed.

Note that an eleventh heat treatment may be performed after the crystalline insulating film 332 is formed. The eleventh heat treatment can be performed under the conditions shown in the first heat treatment. By the eleventh heat treatment, the crystallinity of the crystalline insulating film 332 can be improved and impurities such as hydrogen and water can be removed.

Figure 11B:
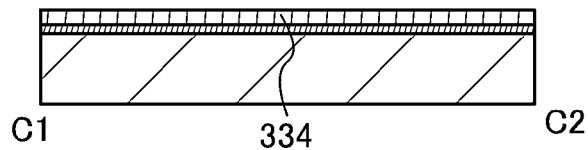

Next, the aluminum oxide film 334 is formed (see FIG. 11B). The aluminum oxide film 334 can be formed by a sputtering method, a CVD method, an MBE method, an ALD method, or a PLD method.

The aluminum oxide film 334 is formed over the crystalline insulating film 332, whereby the aluminum oxide film 334 having crystallinity and a high density can be formed. The aluminum oxide film 334 having crystallinity and a high density is unlikely to transmit hydrogen, water, oxygen, and a metal element. Thus, the aluminum oxide film 334 serves as a barrier film against impurities which cause deterioration in electrical characteristics of the transistor.

Note that it is preferred to employ a sputtering method because the aluminum oxide film 334 having crystallinity and a high density is likely to be formed over the crystalline insulating film 332. Moreover, it is preferred to form the aluminum oxide film 334 while the substrate is heated at a temperature higher than or equal to 100° C. and lower than or equal to 450° C. because an insulating film having crystallinity and a high density is likely to be formed.

Figure 11C:
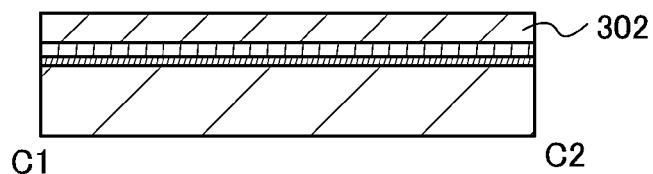

Next, the base insulating film 302 is formed (see FIG. 11C). The base insulating film 302 can be formed using an insulating film selected from the insulating films given as examples of the base insulating film 302 and can be formed by a sputtering method, a CVD method, a MBE method, an ALD method, or a PLD method.

As the base insulating film 302, for example, a silicon oxide film is preferred to be formed by an RF sputtering method under the following conditions: a quartz (preferably synthetic quartz) target is used; the substrate heating temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas. With such a method, the base insulating film 302 can contain excess oxygen.

Next, a semiconductor film to be the semiconductor film 306 is formed. The semiconductor film to be the semiconductor film 306 can be formed using a semiconductor film selected from the semiconductor films given as examples of the semiconductor film 306 and can be formed by a sputtering method, a CVD method, an MBE method, an ALD method, or a PLD method. The semiconductor film to be the semiconductor film 306 is preferred to be formed using an oxide semiconductor film by a sputtering method. Note that it is preferred to employ a sputtering method because an oxide semiconductor film having crystallinity and a high density is likely to be formed. Moreover, it is preferred to form the oxide semiconductor film while the substrate is heated at a temperature higher than or equal to 100° C. and lower than or equal to 450° C. because an oxide semiconductor film having crystallinity and a high density is likely to be formed.

Note that a twelfth heat treatment may be performed after the oxide semiconductor film is formed. The twelfth heat treatment can be performed under the conditions shown in the first heat treatment. By the twelfth heat treatment, the crystallinity of the oxide semiconductor film can be improved and further impurities such as hydrogen and water can be removed from the oxide semiconductor film.

Figure 11D:
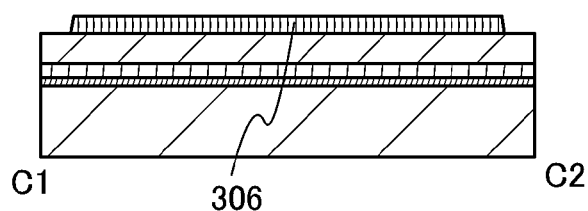

Next, the semiconductor film to be the semiconductor film 306 is processed into an island shape to form the semiconductor film 306 (see FIG. 11D).

Note that when the semiconductor film 306 is an oxide semiconductor film, a thirteenth heat treatment may be performed after the semiconductor film 306 is formed. The thirteenth heat treatment can be performed under the conditions shown in the first heat treatment. By the thirteenth heat treatment, which is performed with the side surfaces of the oxide semiconductor film exposed, impurities such as hydrogen and water are likely to be removed from the side surfaces of the oxide semiconductor film and thus the impurities can be effectively removed. Moreover, impurities such as hydrogen and water that exist at an interface between the base insulating film 302 and the semiconductor film 306 can also be removed. Note that when the oxide semiconductor film is a CAAC-OS film, impurities diffuse easily along a layer of crystal; thus, impurities such as hydrogen and water are further likely to be removed form the side surfaces.

Next, a conductive film to be the source electrode 316a and the drain electrode 316b is formed. The conductive film to be the source electrode 316a and the drain electrode 316b can be formed using a conductive film selected from the conductive films given as examples of the source electrode 316a and the drain electrode 316b and can be formed by a sputtering method, a CVD method, an MBE method, an ALD method, or a PLD method.

Figure 12A:
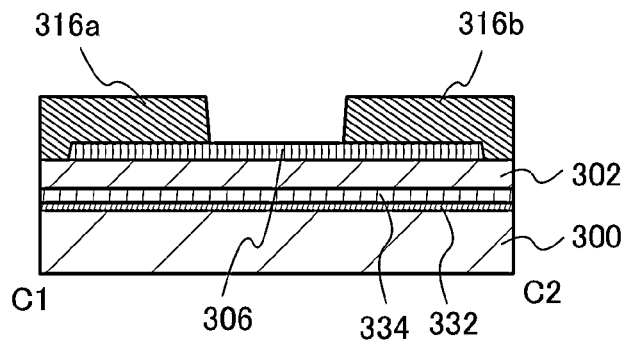
FIGS. 12A to 12D are cross-sectional views illustrating the example of the method for manufacturing the transistor illustrated in FIGS. 3A to 3C.

Next, the conductive film to be the source electrode 316a and the drain electrode 316b is processed to form the source electrode 316a and the drain electrode 316b (see FIG. 12A).

Figure 12B:
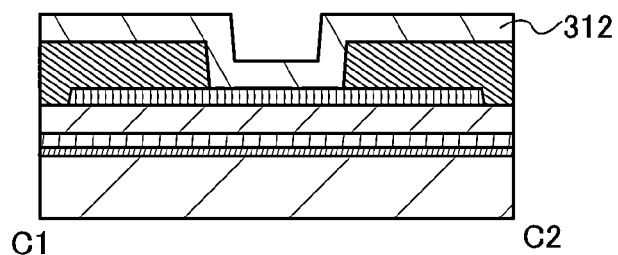

Next, the gate insulating film 312 is formed (see FIG. 12B). The gate insulating film 312 can be formed using an insulating film selected from the insulating films given as examples of the gate insulating film 312 and can be formed by a sputtering method, a CVD method, an MBE method, an ALD method, or a PLD method.

Next, a conductive film to be the gate electrode 304 is formed. The conductive film to be the gate electrode 304 can be formed using a conductive film selected from the conductive films given as examples of the gate electrode 304 and can be formed by a sputtering method, a CVD method, an MBE method, an ALD method, or a PLD method.

Figure 12C:
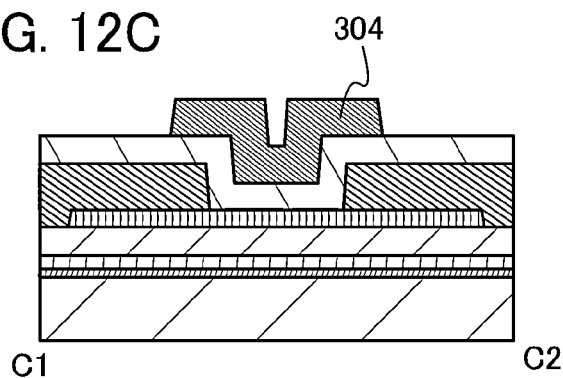

Next, the conductive film to be the gate electrode 304 is processed to form the gate electrode 304 (see FIG. 12C).

Next, the crystalline insulating film 336 is formed. The crystalline insulating film 336 can be formed using an insulating film selected from the insulating films given as examples of the crystalline insulating film 336 and can be formed by a sputtering method, a CVD method, an MBE method, an ALD method, or a PLD method.

Next, a fourteenth heat treatment may be performed. The fourteenth heat treatment may be performed under conditions selected from conditions similar to those of the first heat treatment. By the fourteenth heat treatment, the crystallinity of the crystalline insulating film 336 can be improved and impurities such as hydrogen and water can be removed. When the semiconductor film 306 is an oxide semiconductor film and the base insulating film 302 contains excess oxygen, defects in the semiconductor film 306 (oxygen vacancies in the oxide semiconductor film) can be reduced.

Figure 12D:
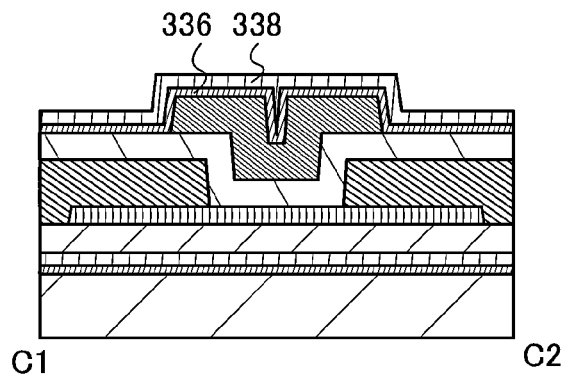

Next, the aluminum oxide film 338 is formed (see FIG. 12D). The aluminum oxide film 338 can be formed by a sputtering method, a CVD method, an MBE method, an ALD method, or a PLD method.

Next, a fifteenth heat treatment may be performed. The fifteenth heat treatment may be performed under conditions selected from conditions similar to those of the first heat treatment. By the fifteenth heat treatment, when the semiconductor film 306 is an oxide semiconductor film and the base insulating film 302 contains excess oxygen, defects in the semiconductor film 306 (oxygen vacancies in the oxide semiconductor film) can be reduced. Note that the fifteenth heat treatment may be substituted for the fourteenth heat treatment. At this time, with the aluminum oxide film 338, outward diffusion of excess oxygen can be suppressed and oxygen vacancies can be effectively reduced.

Through the above steps, the transistor illustrated in FIGS. 3A to 3C can be manufactured.

When the semiconductor film 306 is an oxide semiconductor film, a transistor having stable electrical characteristics and high reliability can be provided by performing the eleventh to fifteenth heat treatments. Moreover, the aluminum oxide film 334 and the aluminum oxide film 338 each serve as a barrier film against impurities which cause deterioration in electrical characteristics of the transistor. Thus, even in the case where diffusion of the impurities occurs, the eleventh to fifteenth heat treatments can prevent deterioration in electrical characteristics from being caused. However, one embodiment of the present invention is not limited to performing all of the eleventh to fifteenth heat treatments.

Next, a method for manufacturing the transistor illustrated in FIGS. 4A to 4C will be described with reference to FIGS. 13A to 13D and FIGS. 14A to 14D. Note that only cross-sectional views corresponding to FIG. 4B are shown for simplicity in FIGS. 13A to 13D and FIGS. 14A to 14D.

First, the substrate 400 is prepared. As the substrate 400, a substrate selected from the substrates given as examples of the substrate 400 can be used.

Figure 13A:
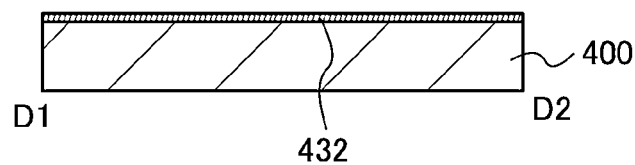
FIGS. 13A to 13D are cross-sectional views illustrating an example of a method for manufacturing the transistor illustrated in FIGS. 4A to 4C.

Next, the crystalline insulating film 432 is formed (see FIG. 13A). The crystalline insulating film 432 can be formed using an insulating film selected from the insulating films given as examples of the crystalline insulating film 432 and can be formed by a sputtering method, a CVD method, a MBE method, an ALD method, or a PLD method. Note that it is preferred to employ a sputtering method because an insulating film having crystallinity and a high density is likely to be formed. Moreover, it is preferred to form the crystalline insulating film 432 while the substrate is heated at a temperature higher than or equal to 100° C. and lower than or equal to 450° C. because an insulating film having crystallinity and a high density is likely to be formed.

Note that a sixteenth heat treatment may be performed after the crystalline insulating film 432 is formed. The sixteenth heat treatment can be performed under the conditions shown in the first heat treatment. By the sixteenth heat treatment, the crystallinity of the crystalline insulating film 432 can be improved and impurities such as hydrogen and water can be removed.

Figure 13B:
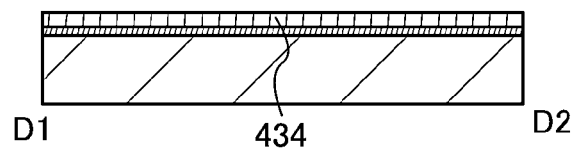

Next, the aluminum oxide film 434 is formed (see FIG. 13B). The aluminum oxide film 434 can be formed by a sputtering method, a CVD method, an MBE method, an ALD method, or a PLD method.

The aluminum oxide film 434 is formed over the crystalline insulating film 432, whereby the aluminum oxide film 434 having crystallinity and a high density can be formed. The aluminum oxide film 434 having crystallinity and a high density is unlikely to transmit hydrogen, water, oxygen, and a metal element. Thus, the aluminum oxide film 434 serves as a barrier film against impurities which cause deterioration in electrical characteristics of the transistor.

Note that it is preferred to employ a sputtering method because the aluminum oxide film 434 having crystallinity and a high density is likely to be formed over the crystalline insulating film 432. Moreover, it is preferred to form the aluminum oxide film 434 while the substrate is heated at a temperature higher than or equal to 100° C. and lower than or equal to 450° C. because an insulating film having crystallinity and a high density is likely to be formed.

Figure 13C:
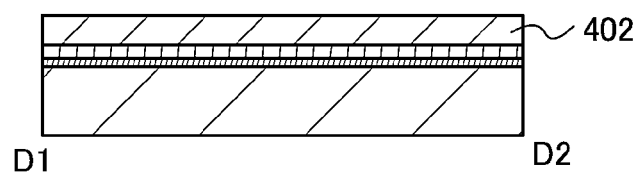

Next, the base insulating film 402 is formed (see FIG. 13C). The base insulating film 402 can be formed using an insulating film selected from the insulating films given as examples of the base insulating film 402 and can be formed by a sputtering method, a CVD method, a MBE method, an ALD method, or a PLD method.

As the base insulating film 402, for example, a silicon oxide film is preferred to be formed by an RF sputtering method under the following conditions: a quartz (preferably synthetic quartz) target is used; the substrate heating temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas. With such a method, the base insulating film 402 can contain excess oxygen.

Next, a conductive film to be the source electrode 416a and the drain electrode 416b is formed. The conductive film to be the source electrode 416a and the drain electrode 416b can be formed using a conductive film selected from the conductive films given as examples of the source electrode 416a and the drain electrode 416b and can be formed by a sputtering method, a CVD method, an MBE method, an ALD method, or a PLD method.

Figure 13D:
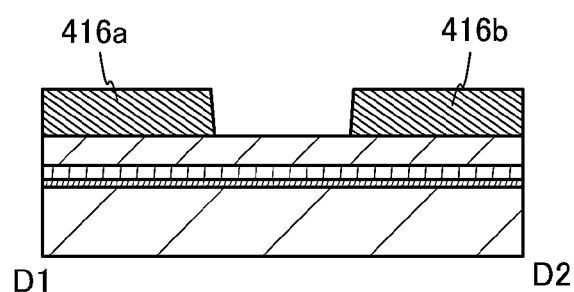

Next, the conductive film to be the source electrode 416a and the drain electrode 416b is processed to form the source electrode 416a and the drain electrode 416b (see FIG. 13D).

Next, a semiconductor film to be the semiconductor film 406 is formed. The semiconductor film to be the semiconductor film 406 can be formed using a semiconductor film selected from the semiconductor films given as examples of the semiconductor film 406 and can be formed by a sputtering method, a CVD method, an MBE method, an ALD method, or a PLD method. The semiconductor film to be the semiconductor film 406 is preferred to be formed using an oxide semiconductor film by a sputtering method. Note that it is preferred to employ a sputtering method because an oxide semiconductor film having crystallinity and a high density is likely to be formed. Moreover, it is preferred to form the oxide semiconductor film while the substrate is heated at a temperature higher than or equal to 100° C. and lower than or equal to 450° C. because an oxide semiconductor film having crystallinity and a high density is likely to be formed.

Note that a seventeenth heat treatment may be performed after the oxide semiconductor film is formed. The seventeenth heat treatment can be performed under the conditions shown in the first heat treatment. By the seventeenth heat treatment, the crystallinity of the oxide semiconductor film can be improved and further impurities such as hydrogen and water can be removed from the oxide semiconductor film.

Figure 14A:
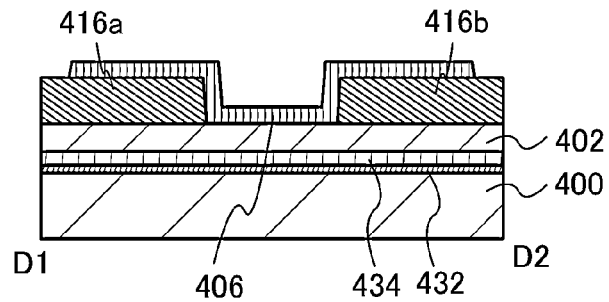
FIGS. 14A to 14D are cross-sectional views illustrating the example of the method for manufacturing the transistor illustrated in FIGS. 4A to 4C.

Next, the semiconductor film to be the semiconductor film 406 is processed into an island shape to form the semiconductor film 406 (see FIG. 14A).

Note that when the semiconductor film 406 is an oxide semiconductor film, an eighteenth heat treatment may be performed after the semiconductor film 406 is formed. The eighteenth heat treatment can be performed under the conditions shown in the first heat treatment. By the eighteenth heat treatment, which is performed with the side surfaces of the oxide semiconductor film exposed, impurities such as hydrogen and water are likely to be removed from the side surfaces of the oxide semiconductor film and thus the impurities can be effectively removed. Moreover, impurities such as hydrogen and water that exist at an interface between the base insulating film 402 and the semiconductor film 406 can also be removed. Note that when the oxide semiconductor film is a CAAC-OS film, impurities diffuse easily along a layer of crystal; thus, impurities such as hydrogen and water are further likely to be removed form the side surfaces.

Figure 14B:
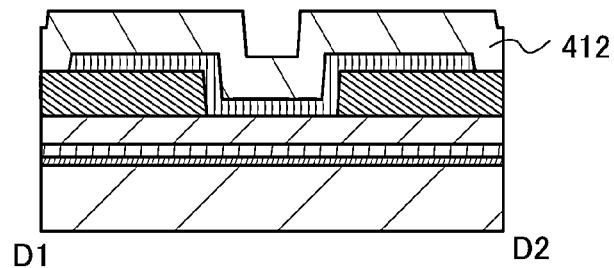

Next, the gate insulating film 412 is formed (see FIG. 14B). The gate insulating film 412 can be formed using an insulating film selected from the insulating films given as examples of the gate insulating film 412 and can be formed by a sputtering method, a CVD method, an MBE method, an ALD method, or a PLD method.

Next, a conductive film to be the gate electrode 404 is formed. The conductive film to be the gate electrode 404 can be formed using a conductive film selected from the conductive films given as examples of the gate electrode 404 and can be formed by a sputtering method, a CVD method, an MBE method, an ALD method, or a PLD method.

Figure 14C:
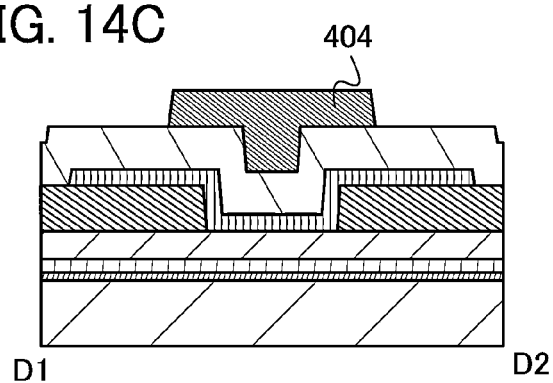

Next, the conductive film to be the gate electrode 404 is processed to form the gate electrode 404 (see FIG. 14C).

Next, the crystalline insulating film 436 is formed. The crystalline insulating film 436 can be formed using an insulating film selected from the insulating films given as examples of the crystalline insulating film 436 and can be formed by a sputtering method, a CVD method, an MBE method, an ALD method, or a PLD method.

Next, a nineteenth heat treatment may be performed. The nineteenth heat treatment may be performed under conditions selected from conditions similar to those of the first heat treatment. By the nineteenth heat treatment, the crystallinity of the crystalline insulating film 436 can be improved and impurities such as hydrogen and water can be removed. When the semiconductor film 406 is an oxide semiconductor film and the base insulating film 402 contains excess oxygen, defects in the semiconductor film 406 (oxygen vacancies in the oxide semiconductor film) can be reduced.

Figure 14D:
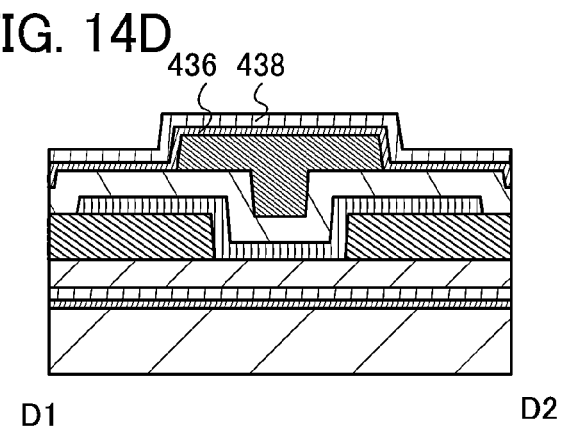

Next, the aluminum oxide film 438 is formed (see FIG. 14D). The aluminum oxide film 438 can be formed by a sputtering method, a CVD method, an MBE method, an ALD method, or a PLD method.

Next, a twentieth heat treatment may be performed. The twentieth heat treatment may be performed under conditions selected from conditions similar to those of the first heat treatment. By the twentieth heat treatment, when the semiconductor film 406 is an oxide semiconductor film and the base insulating film 402 contains excess oxygen, defects in the semiconductor film 406 (oxygen vacancies in the oxide semiconductor film) can be reduced. Note that the twentieth heat treatment may be substituted for the nineteenth heat treatment. At this time, with the aluminum oxide film 438, outward diffusion of excess oxygen can be suppressed and oxygen vacancies can be effectively reduced.

Through the above steps, the transistor illustrated in FIGS. 4A to 4C can be manufactured.

When the semiconductor film 406 is an oxide semiconductor film, a transistor having stable electrical characteristics and high reliability can be provided by performing the sixteenth to twentieth heat treatments. Moreover, the aluminum oxide film 434 and the aluminum oxide film 438 each serve as a barrier film against impurities which cause deterioration in electrical characteristics of the transistor. Thus, even in the case where diffusion of the impurities occurs, the sixteenth to twentieth heat treatments can prevent deterioration in electrical characteristics from being caused. However, one embodiment of the present invention is not limited to performing all of the sixteenth to twentieth heat treatments.

Next, a method for manufacturing the transistor illustrated in FIGS. 5A to 5C will be described with reference to FIGS. 15A to 15D and FIGS. 16A to 16D. Note that only cross-sectional views corresponding to FIG. 5B are shown for simplicity in FIGS. 15A to 15D and FIGS. 16A to 16D.

First, the substrate 500 is prepared. As the substrate 500, a substrate selected from the substrates given as examples of the substrate 500 can be used.

Figure 15A:
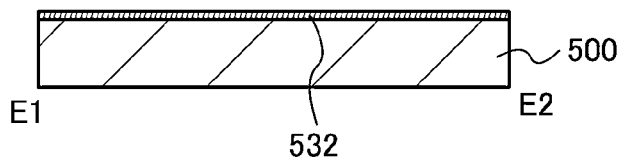
FIGS. 15A to 15D are cross-sectional views illustrating an example of a method for manufacturing the transistor illustrated in FIGS. 5A to 5C.

Next, the crystalline insulating film 532 is formed (see FIG. 15A). The crystalline insulating film 532 can be formed using an insulating film selected from the insulating films given as examples of the crystalline insulating film 532 and can be formed by a sputtering method, a CVD method, a MBE method, an ALD method, or a PLD method. Note that it is preferred to employ a sputtering method because an insulating film having crystallinity and a high density is likely to be formed. Moreover, it is preferred to form the crystalline insulating film 532 while the substrate is heated at a temperature higher than or equal to 100° C. and lower than or equal to 450° C. because an insulating film having crystallinity and a high density is likely to be formed.

Note that a twenty-first heat treatment may be performed after the crystalline insulating film 532 is formed. The twenty-first heat treatment can be performed under the conditions shown in the first heat treatment. By the twenty-first heat treatment, the crystallinity of the crystalline insulating film 532 can be improved and impurities such as hydrogen and water can be removed.

Figure 15B:
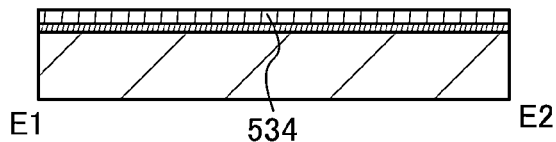

Next, the aluminum oxide film 534 is formed (see FIG. 15B). The aluminum oxide film 534 can be formed by a sputtering method, a CVD method, an MBE method, an ALD method, or a PLD method.

The aluminum oxide film 534 is formed over the crystalline insulating film 532, whereby the aluminum oxide film 534 having crystallinity and a high density can be formed. The aluminum oxide film 534 having crystallinity and a high density is unlikely to transmit hydrogen, water, oxygen, and a metal element. Thus, the aluminum oxide film 534 serves as a barrier film against impurities which cause deterioration in electrical characteristics of the transistor.

Note that it is preferred to employ a sputtering method because the aluminum oxide film 534 having crystallinity and a high density is likely to be formed over the crystalline insulating film 532. Moreover, it is preferred to form the aluminum oxide film 534 while the substrate is heated at a temperature higher than or equal to 100° C. and lower than or equal to 450° C. because an insulating film having crystallinity and a high density is likely to be formed.

Figure 15C:
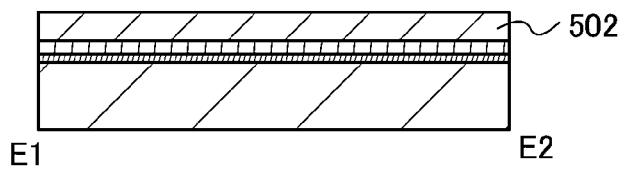
Figure 15D:
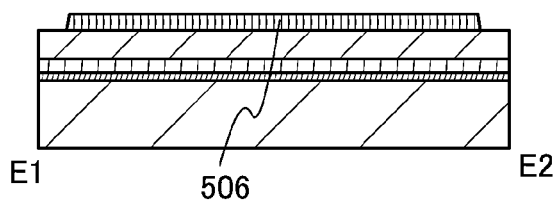

Next, the base insulating film 502 is formed (see FIG. 15C). The base insulating film 502 can be formed using an insulating film selected from the insulating films given as examples of the base insulating film 502 and can be formed by a sputtering method, a CVD method, a MBE method, an ALD method, or a PLD method.

As the base insulating film 502, for example, a silicon oxide film is preferred to be formed by an RF sputtering method under the following conditions: a quartz (preferably synthetic quartz) target is used; the substrate heating temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas. With such a method, the base insulating film 502 can contain excess oxygen.

Next, a semiconductor film to be the semiconductor film 506 is formed. The semiconductor film to be the semiconductor film 506 can be formed using a semiconductor film selected from the semiconductor films given as examples of the semiconductor film 506 and can be formed by a sputtering method, a CVD method, an MBE method, an ALD method, or a PLD method. The semiconductor film to be the semiconductor film 506 is preferred to be formed using an oxide semiconductor film by a sputtering method. Note that it is preferred to employ a sputtering method because an oxide semiconductor film having crystallinity and a high density is likely to be formed. Moreover, it is preferred to form the oxide semiconductor film while the substrate is heated at a temperature higher than or equal to 100° C. and lower than or equal to 450° C. because an oxide semiconductor film having crystallinity and a high density is likely to be formed.

Note that a twenty-second heat treatment may be performed after the oxide semiconductor film is formed. The twenty-second heat treatment can be performed under the conditions shown in the first heat treatment. By the twenty-second heat treatment, the crystallinity of the oxide semiconductor film can be improved and further impurities such as hydrogen and water can be removed from the oxide semiconductor film.

Figure 16A:
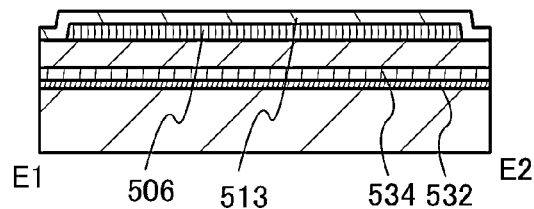
FIGS. 16A to 16D are cross-sectional views illustrating the example of the method for manufacturing the transistor illustrated in FIGS. 5A to 5C.

Next, the semiconductor film to be the semiconductor film 506 is processed into an island shape to form the semiconductor film 506 (see FIG. 16A).

Note that when the semiconductor film 506 is an oxide semiconductor film, a twenty-third heat treatment may be performed after the semiconductor film 506 is formed. The twenty-third heat treatment can be performed under the conditions shown in the first heat treatment. By the twenty-third heat treatment, which is performed with the side surfaces of the oxide semiconductor film exposed, impurities such as hydrogen and water are likely to be removed from the side surfaces of the oxide semiconductor film and thus the impurities can be effectively removed. Moreover, impurities such as hydrogen and water that exist at an interface between the base insulating film 502 and the semiconductor film 506 can also be removed. Note that when the oxide semiconductor film is a CAAC-OS film, impurities diffuse easily along a layer of crystal; thus, impurities such as hydrogen and water are further likely to be removed form the side surfaces.

Next, an insulating film 513 to be the gate insulating film 512 is formed (see FIG. 16A). The insulating film 513 can be formed using an insulating film selected from the insulating films given as examples of the gate insulating film 512 and can be formed by a sputtering method, a CVD method, an MBE method, an ALD method, or a PLD method.

Next, a conductive film to be the gate electrode 504 is formed. The conductive film to be the gate electrode 504 can be formed using a conductive film selected from the conductive films given as examples of the gate electrode 504 and can be formed by a sputtering method, a CVD method, an MBE method, an ALD method, or a PLD method.

Next, the conductive film to be the gate electrode 504 is processed to form the gate electrode 504.

Figure 16B:
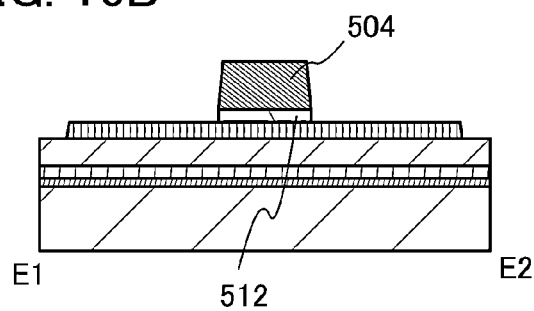

Next, the gate insulating film 512 is formed by processing the insulating film 513 using a resist mask used for forming the gate electrode 504 or the gate electrode 504 as a mask (see FIG. 16B).

Next, an impurity may be added to the semiconductor film 506 using the gate electrode 504 as a mask. As the impurity, an impurity selected from the impurities that reduce the resistance of the semiconductor film 506 may be added. Note that in the case where the semiconductor film 506 is an oxide semiconductor film, as the impurity, one or more of helium, boron, nitrogen, fluorine, neon, aluminum, phosphorus, argon, arsenic, krypton, indium, tin, antimony, and xenon can be added. The impurity may be added by an ion implantation method or an ion doping method, preferably, an ion implantation method. At this time, the acceleration voltage is made higher than or equal to 5 kV and lower than or equal to 100 kV. The amount of the added impurity is made greater than or equal to $1\times10^{14}$ ions/cm$^2$ and less than or equal to $1\times10^{16}$ ions/cm$^2$.

Next, a twenty-fourth heat treatment may be performed. The twenty-fourth heat treatment may be performed under conditions selected from conditions similar to those of the first heat treatment. By the twenty-fourth heat treatment, a region of the semiconductor film 506, to which an impurity is added, can be made a low-resistant region. When the semiconductor film 506 is an oxide semiconductor film and the base insulating film 502 contains excess oxygen, defects in the semiconductor film 506 (oxygen vacancies in the oxide semiconductor film) can be reduced.

Next, the crystalline insulating film 536 is formed. The crystalline insulating film 536 can be formed using an insulating film selected from the insulating films given as examples of the crystalline insulating film 536 and can be formed by a sputtering method, a CVD method, an MBE method, an ALD method, or a PLD method.

Next, a twenty-fifth heat treatment may be performed. The twenty-fifth heat treatment may be performed under conditions selected from conditions similar to those of the first heat treatment. By the twenty-fifth heat treatment, the crystallinity of the crystalline insulating film 536 can be improved and impurities such as hydrogen and water can be removed. When the semiconductor film 506 is an oxide semiconductor film and the base insulating film 502 contains excess oxygen, defects in the semiconductor film 506 (oxygen vacancies in the oxide semiconductor film) can be reduced.

Figure 16C:
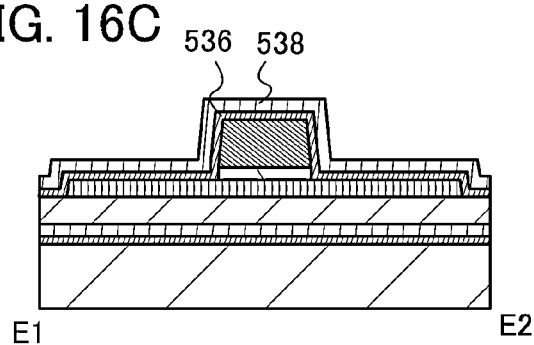

Next, the aluminum oxide film 538 is formed (see FIG. 16C). The aluminum oxide film 538 can be formed by a sputtering method, a CVD method, an MBE method, an ALD method, or a PLD method.

Next, a twenty-sixth heat treatment may be performed. The twenty-sixth heat treatment may be performed under conditions selected from conditions similar to those of the first heat treatment. By the twenty-sixth heat treatment, when the semiconductor film 506 is an oxide semiconductor film and the base insulating film 502 contains excess oxygen, defects in the semiconductor film 506 (oxygen vacancies in the oxide semiconductor film) can be reduced. Note that the twenty-sixth heat treatment may be substituted for the twenty-fifth heat treatment. At this time, with the aluminum oxide film 538, outward diffusion of excess oxygen can be suppressed and oxygen vacancies can be effectively reduced.

Next, the protective insulating film 518 is formed. The protective insulating film 518 can be formed using an insulating film selected from the insulating films given as examples of the protective insulating film 518 and can be formed by a sputtering method, a CVD method, an MBE method, an ALD method, or a PLD method.

Next, openings reaching the semiconductor film 506 are formed by processing the crystalline insulating film 536, the aluminum oxide film 538, and the protective insulating film 518.

Next, a conductive film to be the wiring 524a and the wiring 524b is formed. The conductive film to be the wiring 524a and the wiring 524b can be formed using a conductive film selected from the conductive films given as examples of the wiring 524a and the wiring 524b and can be formed by a sputtering method, a CVD method, an MBE method, an ALD method, or a PLD method.

Figure 16D:
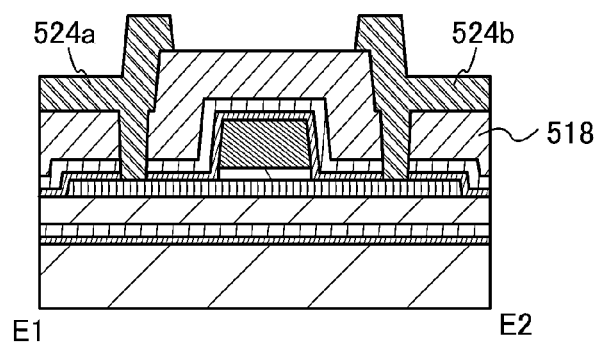

Next, the conductive film to be the wiring 524a and the wiring 524b is processed to form the wiring 524a and the wiring 524b (see FIG. 16D).

Through the above steps, the transistor illustrated in FIGS. 5A to 5C can be manufactured.

When the semiconductor film 506 is an oxide semiconductor film, a transistor having stable electrical characteristics and high reliability can be provided by performing the twenty-first to twenty-sixth heat treatments. Moreover, the aluminum oxide film 534 and the aluminum oxide film 538 each serve as a barrier film against impurities which cause deterioration in electrical characteristics of the transistor. Thus, even in the case where diffusion of the impurities occurs, the twenty-first to twenty-sixth heat treatments can prevent deterioration in electrical characteristics from being caused. However, one embodiment of the present invention is not limited to performing all of the twenty-first to twenty-sixth heat treatments.

Next, a method for manufacturing the transistor illustrated in FIGS. 6A to 6C will be described with reference to FIGS. 17A to 17D, FIGS. 18A to 18D, and FIGS. 19A to 19D. Note that only cross-sectional views corresponding to FIG. 6B are shown for simplicity in FIGS. 17A to 17D, FIGS. 18A to 18D, and FIGS. 19A to 19D.

First, the substrate 600 is prepared. As the substrate 600, a substrate selected from the substrates given as examples of the substrate 600 can be used.

Figure 17A:
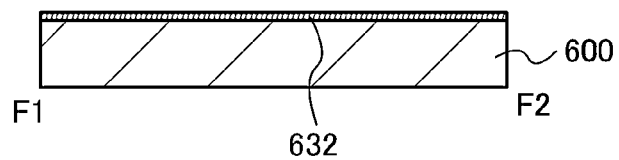
FIGS. 17A to 17D are cross-sectional views illustrating an example of a method for manufacturing the transistor illustrated in FIGS. 6A to 6C.

Next, the crystalline insulating film 632 is formed (see FIG. 17A). The crystalline insulating film 632 can be formed using an insulating film selected from the insulating films given as examples of the crystalline insulating film 632 and can be formed by a sputtering method, a CVD method, a MBE method, an ALD method, or a PLD method. Note that it is preferred to employ a sputtering method because an insulating film having crystallinity and a high density is likely to be formed. Moreover, it is preferred to form the crystalline insulating film 632 while the substrate is heated at a temperature higher than or equal to 100° C. and lower than or equal to 450° C. because an insulating film having crystallinity and a high density is likely to be formed.

Note that a twenty-seventh heat treatment may be performed after the crystalline insulating film 632 is formed. The twenty-seventh heat treatment can be performed under the conditions shown in the first heat treatment. By the twenty-seventh heat treatment, the crystallinity of the crystalline insulating film 632 can be improved and impurities such as hydrogen and water can be removed.

Figure 17B:
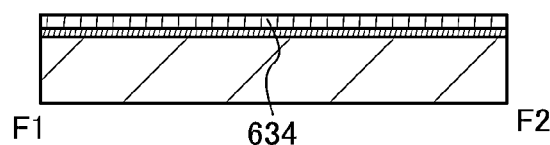

Next, the aluminum oxide film 634 is formed (see FIG. 17B). The aluminum oxide film 634 can be formed by a sputtering method, a CVD method, an MBE method, an ALD method, or a PLD method.

The aluminum oxide film 634 is formed over the crystalline insulating film 632, whereby the aluminum oxide film 634 having crystallinity and a high density can be formed. The aluminum oxide film 634 having crystallinity and a high density is unlikely to transmit hydrogen, water, oxygen, and a metal element. Thus, the aluminum oxide film 634 serves as a barrier film against impurities which cause deterioration in electrical characteristics of the transistor.

Note that it is preferred to employ a sputtering method because the aluminum oxide film 634 having crystallinity and a high density is likely to be formed over the crystalline insulating film 632. Moreover, it is preferred to form the aluminum oxide film 634 while the substrate is heated at a temperature higher than or equal to 100° C. and lower than or equal to 450° C. because an insulating film having crystallinity and a high density is likely to be formed.

Figure 17C:
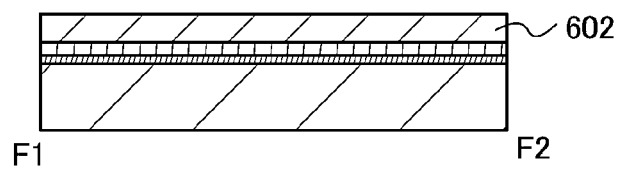

Next, the base insulating film 602 is formed (see FIG. 17C). The base insulating film 602 can be formed using an insulating film selected from the insulating films given as examples of the base insulating film 602 and can be formed by a sputtering method, a CVD method, a MBE method, an ALD method, or a PLD method.

As the base insulating film 602, for example, a silicon oxide film is preferred to be formed by an RF sputtering method under the following conditions: a quartz (preferably synthetic quartz) target is used; the substrate heating temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas. With such a method, the base insulating film 602 can contain excess oxygen.

Next, a semiconductor film to be the semiconductor film 606 is formed. The semiconductor film to be the semiconductor film 606 can be formed using a semiconductor film selected from the semiconductor films given as examples of the semiconductor film 606 and can be formed by a sputtering method, a CVD method, an MBE method, an ALD method, or a PLD method. The semiconductor film to be the semiconductor film 606 is preferred to be formed using an oxide semiconductor film by a sputtering method. Note that it is preferred to employ a sputtering method because an oxide semiconductor film having crystallinity and a high density is likely to be formed. Moreover, it is preferred to form the oxide semiconductor film while the substrate is heated at a temperature higher than or equal to 100° C. and lower than or equal to 450° C. because an oxide semiconductor film having crystallinity and a high density is likely to be formed.

Note that a twenty-eighth heat treatment may be performed after the oxide semiconductor film is formed. The twenty-eighth heat treatment can be performed under the conditions shown in the first heat treatment. By the twenty-eighth heat treatment, the crystallinity of the oxide semiconductor film can be improved and further impurities such as hydrogen and water can be removed from the oxide semiconductor film.

Figure 17D:
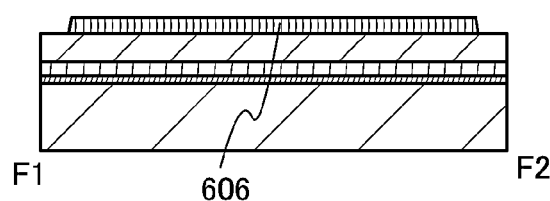

Next, the semiconductor film to be the semiconductor film 606 is processed into an island shape to form the semiconductor film 606 (see FIG. 17D).

Note that when the semiconductor film 606 is an oxide semiconductor film, a twenty-ninth heat treatment may be performed after the semiconductor film 606 is formed. The twenty-ninth heat treatment can be performed under the conditions shown in the first heat treatment. By the twenty-ninth heat treatment, which is performed with the side surfaces of the oxide semiconductor film exposed, impurities such as hydrogen and water are likely to be removed from the side surfaces of the oxide semiconductor film and thus the impurities can be effectively removed. Moreover, impurities such as hydrogen and water that exist at an interface between the base insulating film 602 and the semiconductor film 606 can also be removed. Note that when the oxide semiconductor film is a CAAC-OS film, impurities diffuse easily along a layer of crystal; thus, impurities such as hydrogen and water are further likely to be removed form the side surfaces.

Next, an insulating film to be the gate insulating film 612 is formed. The insulating film to be the gate insulating film 612 can be formed using an insulating film selected from the insulating films given as examples of the gate insulating film 612 and can be formed by a sputtering method, a CVD method, an MBE method, an ALD method, or a PLD method.

Next, a conductive film to be the gate electrode 604 is formed. The conductive film to be the gate electrode 604 can be formed using a conductive film selected from the conductive films given as examples of the gate electrode 604 and can be formed by a sputtering method, a CVD method, an MBE method, an ALD method, or a PLD method.

Next, the conductive film to be the gate electrode 604 is processed to form a conductive film 605 to be the gate electrode 604.

Figure 18A:
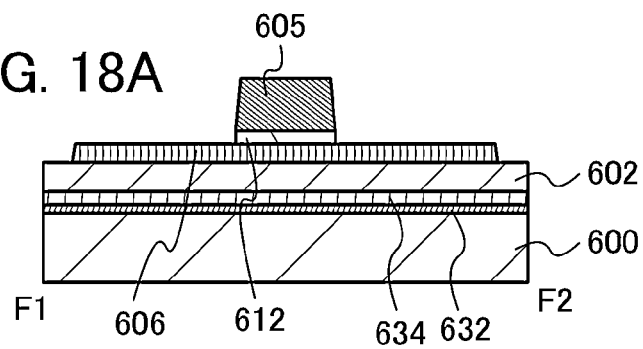
FIGS. 18A to 18D are cross-sectional views illustrating the example of the method for manufacturing the transistor illustrated in FIGS. 6A to 6C.
Figure 18B:
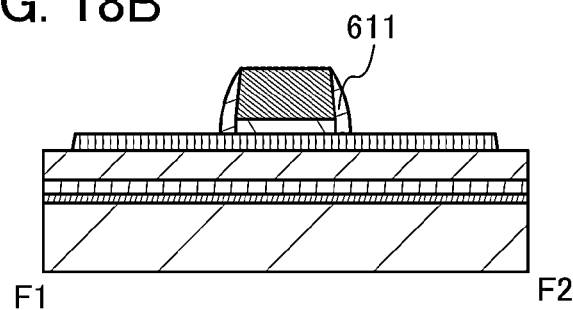

Next, the gate insulating film 612 is formed by processing the insulating film to be the gate insulating film 612 using a resist mask used for processing the conductive film 605 or the conductive film 605 as a mask (see FIG. 18A).

Next, an impurity may be added to the semiconductor film 606 using the conductive film 605 as a mask (this step is also referred to as a first impurity addition step). As the impurity, an impurity selected from the impurities that reduce the resistance of the semiconductor film 606 may be added. Note that in the case where the semiconductor film 606 is an oxide semiconductor film, as the impurity, one or more of helium, boron, nitrogen, fluorine, neon, aluminum, phosphorus, argon, arsenic, krypton, indium, tin, antimony, and xenon can be added. The impurity may be added by an ion implantation method or an ion doping method, preferably, an ion implantation method. At this time, the acceleration voltage is made higher than or equal to 5 kV and lower than or equal to 100 kV. The amount of the added impurity is made greater than or equal to $1 \times 10^{14}$ ions/cm$^2$ and less than or equal to $1 \times 10^{16}$ ions/cm$^2$.

Next, an insulating film to be the sidewall insulating film 611 is formed. The insulating film to be the sidewall insulating film 611 can be formed using an insulating film selected from the insulating films given as examples of the sidewall insulating film 610 and can be formed by a sputtering method, a CVD method, an MBE method, an ALD method, or a PLD method. Next, a highly anisotropic etching treatment is performed on the insulating film to be the sidewall insulating film 611, whereby the sidewall insulating film 611 which is in contact with side surfaces of the gate insulating film 612 and the conductive film 605 can be formed (see FIG. 18B).

Next, an impurity may be added to the semiconductor film 606 using the conductive film 605 and the sidewall insulating film 611 as masks (this step is also referred to as a second impurity addition step). The conditions of the first impurity addition step can be referred to for the second impurity addition step. Two kinds of low-resistance regions can be provided in the semiconductor film 606 by performing the first impurity addition step and the second impurity addition step. Therefore, electric-field concentration at an edge of the drain electrode is likely to be relieved and hot-carrier degradation can be effectively suppressed. Moreover, the edge of the source electrode has less influence of the electric field from the edge of the drain electrode; therefore, DIBL can be suppressed. Note that either one of the first impurity addition step and the second impurity addition step may be performed.

Next, a thirtieth heat treatment may be performed. The thirtieth heat treatment may be performed under conditions selected from conditions similar to those of the first heat treatment. By the thirtieth heat treatment, a region of the semiconductor film 606, to which an impurity is added, can be made a low-resistant region. When the semiconductor film 606 is an oxide semiconductor film and the base insulating film 602 contains excess oxygen, defects in the semiconductor film 606 (oxygen vacancies in the oxide semiconductor film) can be reduced.

Next, a conductive film to be the source electrode 616a and the drain electrode 616b is formed. The conductive film to be the source electrode 616a and the drain electrode 616b can be formed using a conductive film selected from the conductive films given as examples of the source electrode 616a and the drain electrode 616b and can be formed by a sputtering method, a CVD method, an MBE method, an ALD method, or a PLD method.

Figure 18C:
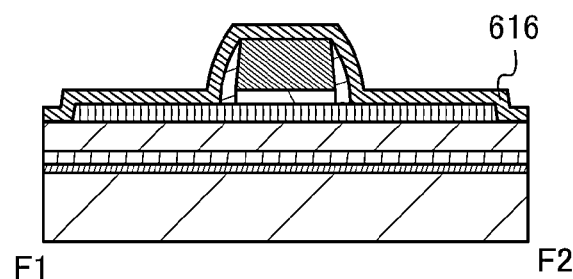

Next, the conductive film to be the source electrode 616a and the drain electrode 616b is processed to form a conductive film 616 (see FIG. 18C).

Figure 18D:
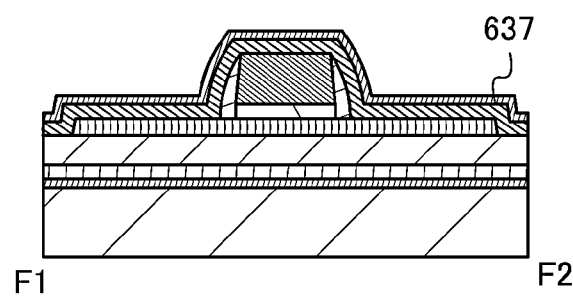

Next, the crystalline insulating film 637 is formed (see FIG. 18D). The crystalline insulating film 637 can be formed using an insulating film selected from the insulating films given as examples of the crystalline insulating film 637 and can be formed by a sputtering method, a CVD method, a MBE method, an ALD method, or a PLD method.

Next, a thirty-first heat treatment may be performed. The thirty-first heat treatment may be performed under conditions selected from conditions similar to those of the first heat treatment. By the thirty-first heat treatment, the crystallinity of the crystalline insulating film 637 can be improved and impurities such as hydrogen and water can be removed. When the semiconductor film 606 is an oxide semiconductor film and the base insulating film 602 contains excess oxygen, defects in the semiconductor film 606 (oxygen vacancies in the oxide semiconductor film) can be reduced.

Figure 19A:
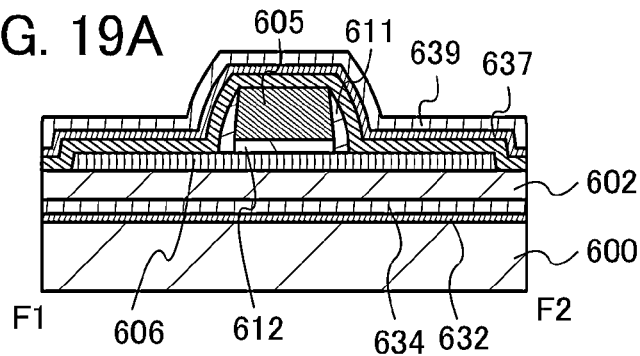
FIGS. 19A to 19D are cross-sectional views illustrating the example of the method for manufacturing the transistor illustrated in FIGS. 6A to 6C.

Next, the aluminum oxide film 639 is formed (see FIG. 19A). The aluminum oxide film 639 can be formed by a sputtering method, a CVD method, an MBE method, an ALD method, or a PLD method.

Next, a thirty-second heat treatment may be performed. The thirty-second heat treatment may be performed under conditions selected from conditions similar to those of the first heat treatment. By the thirty-second heat treatment, when the semiconductor film 606 is an oxide semiconductor film and the base insulating film 602 contains excess oxygen, defects in the semiconductor film 606 (oxygen vacancies in the oxide semiconductor film) can be reduced. Note that the thirty-second heat treatment may be substituted for the thirty-first heat treatment. At this time, with the aluminum oxide film 639, outward diffusion of excess oxygen can be suppressed and oxygen vacancies can be effectively reduced.

Figure 19B:
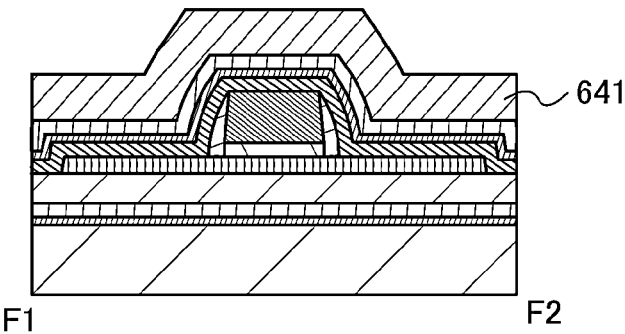
Figure 19C:
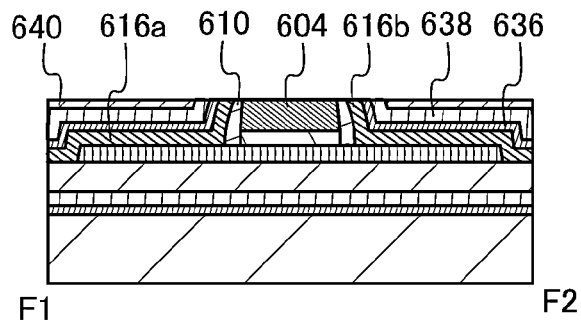
Figure 19D:
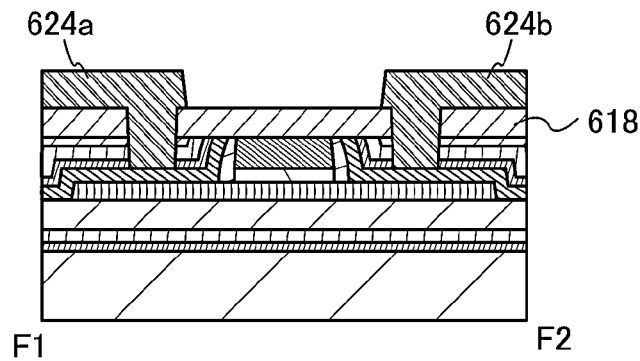

Next, an insulating film 641 to be the insulating film 640 is formed (see FIG. 19B). The insulating film 641 can be formed using an insulating film selected from the insulating films given as examples of the insulating film 640 and can be formed by a sputtering method, a CVD method, a MBE method, an ALD method, or a PLD method.

Next, the insulating film 641, the aluminum oxide film 639, the crystalline insulating film 637, the conductive film 616, the sidewall insulating film 611, and the conductive film 605 are processed so that the surfaces of these films are level with one another. The processing can be performed by a dry etching treatment or a chemical mechanical polishing (CMP) treatment. By the processing, the conductive film 605 becomes the gate electrode 604, the sidewall insulating film 611 becomes the sidewall insulating film 610, the conductive film 616 becomes the source electrode 616a and the drain electrode 616b, the crystalline insulating film 637 becomes the crystalline insulating film 636, the aluminum oxide film 639 becomes the aluminum oxide film 638, and the insulating film 641 becomes the insulating film 640 (see FIG. 19C).

The source electrode 616a and the drain electrode 616b are formed in this manner, whereby the distance between the gate electrode 604 and the source electrode 616a or the drain electrode 616b can be made similar to the thickness of the sidewall insulating film 610. Thus, the length of the distance between the gate electrode 604, and the source electrode 616a or the drain electrode 616b can be made smaller than the minimum feature size; therefore, the structure of the transistor illustrated in FIGS. 6A to 6C is suitable in manufacturing a miniaturized transistor.

Since the aluminum oxide film 638 has high resistance to a chemical, occurrence of shape defects can be suppressed. Thus, in a portion of the aluminum oxide film 638, where shape defects occur, it is possible to suppress occurrence of an etching residue and another shape defect which is caused by the portion. Accordingly, a transistor having stable electrical characteristics can be obtained.

Next, the protective insulating film 618 is formed. The protective insulating film 618 can be formed using an insulating film selected from the insulating films given as examples of the protective insulating film 618 and can be formed by a sputtering method, a CVD method, an MBE method, an ALD method, or a PLD method.

Next, openings exposing the source electrode 616a and the drain electrode 616b are formed by processing the crystalline insulating film 636, the aluminum oxide film 638, the insulating film 640, and the protective insulating film 618.

Next, a conductive film to be the wiring 624a and the wiring 624b is formed. The conductive film to be the wiring 624a and the wiring 624b can be formed using a conductive film selected from the conductive films given as examples of the wiring 624a and the wiring 624b and can be formed by a sputtering method, a CVD method, an MBE method, an ALD method, or a PLD method.

Next, the conductive film to be the wiring 624a and the wiring 624b is processed to form the wiring 624a and the wiring 624b (see FIG. 18C).

Through the above steps, the transistor illustrated in FIGS. 6A to 6C can be manufactured.

When the semiconductor film 606 is an oxide semiconductor film, a transistor having stable electrical characteristics and high reliability can be provided by performing the twenty-seventh to thirty-second heat treatments. Moreover, the aluminum oxide film 634 and the aluminum oxide film 638 each serve as a barrier film against impurities which cause deterioration in electrical characteristics of the transistor. Thus, even in the case where diffusion of the impurities occurs, the twenty-seventh to thirty-second heat treatments can prevent deterioration in electrical characteristics from being caused. However, one embodiment of the present invention is not limited to performing all of the twenty-seventh to thirty-second heat treatments.

According to this embodiment, since an aluminum oxide film having a high barrier property against impurities can be formed, a transistor having stable electric characteristics and high reliability can be provided.

This embodiment is obtained by performing change, addition, modification, removal, application, superordinate conceptualization, or subordinate conceptualization on part or the whole of another embodiment. Thus, part or whole of this embodiment can be freely combined with, applied to, or replaced with part or all of another embodiment.

[Embodiment 3]

In this embodiment, a transistor of one embodiment of the present invention will be described.

Figure 20A:
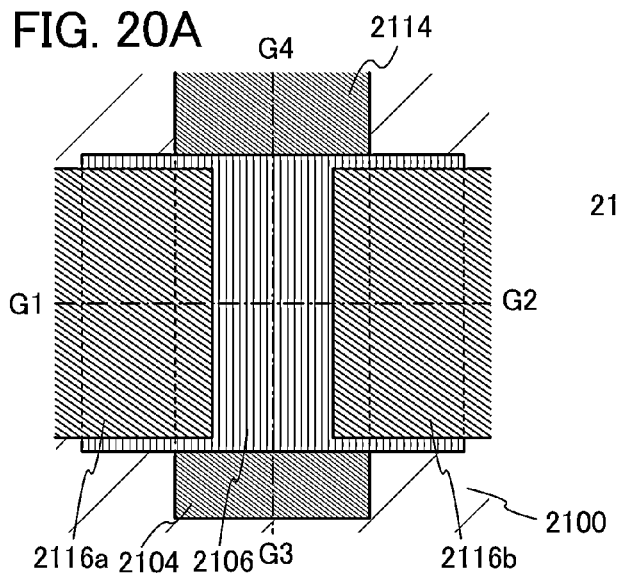
FIGS. 20A to 20C are a top view and cross-sectional views which show an example of a transistor of one embodiment of the present invention.
Figure 20C:
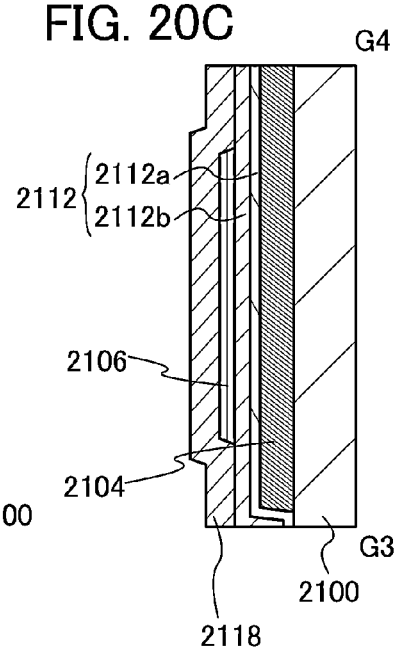
Figure 20B:
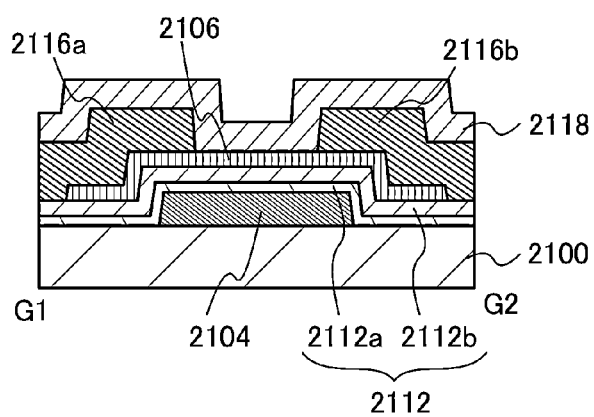

FIG. 20A is a top view of a transistor of one embodiment of the present invention. FIG. 20B is a cross-sectional view taken along dashed-dotted line G1-G2 in FIG. 20A. FIG. 20C is a cross-sectional view taken along dashed-dotted line G3-G4 in FIG. 20A. Note that for simplicity, a gate insulating film 2112 and the like are not illustrated in FIG. 20A.

FIG. 20B is a cross-sectional view of a transistor including a gate electrode 2104 over a substrate 2100; the gate insulating film 2112 over the gate electrode 2104; a semiconductor film 2106 which is over the gate insulating film 2112 and overlaps with the gate electrode 2104; a source electrode 2116a and a drain electrode 2116b over the semiconductor film 2106; and a protective insulating film 2118 over the semiconductor film 2106, and the source electrode 2116a and the drain electrode 2116b. Note that the gate insulating film 2112 includes a crystalline insulating film 2112a and an aluminum oxide film 2112b over the crystalline insulating film 2112a.

Here, the crystalline insulating film 2112a contains one or more kinds of Mg, Ti, V, Cr, Y, Zr, and Ta. Specifically, it is preferred to include one or more kinds of magnesium oxide, titanium oxide, vanadium oxide, chromium oxide, yttrium oxide, zirconium oxide, and tantalum oxide. For example, an insulating film containing zirconium oxide and yttrium oxide can be used.

The crystalline insulating film 2112a is an insulating film having crystallinity, specifically, an insulating film whose crystallinity can be observed by XRD, electron diffraction, or neutron diffraction.

The aluminum oxide film 2112b has crystallinity. Specifically, the crystallinity can be observed by XRD, electron diffraction, or neutron diffraction.

The aluminum oxide film 2112b has crystallinity even near the interface with the crystalline insulating film 2112a. On the other hand, in the case where an aluminum oxide film is formed over a metal film or an amorphous insulating film which serves as a base, an amorphous aluminum oxide film is formed in the aluminum oxide film near the base. The amorphous aluminum oxide film has many defects; therefore, when it is used as the gate insulating film, deterioration in electrical characteristics of the transistor might occur. Whereas, the aluminum oxide film 2112b has fewer defects; therefore, deterioration in electrical characteristics of the transistor, which is caused by defects in the gate insulating film 2112, can be suppressed.

The aluminum oxide film 2112b is a high-density aluminum oxide film, specifically, an aluminum oxide film having a density greater than or equal to 3.2 g/cm$^3$ and less than or equal to 4.1 g/cm$^3$ measured by XRR or RBS. The aluminum oxide film 2112b has a high barrier property against impurities; therefore, deterioration in electric characteristics of the transistor, which is caused by impurities, can be suppressed.

Note that the aluminum oxide film 2112b does not include a low density layer near the crystalline insulating film 2112a. Specifically, a layer having a density less than 3.2 g/cm$^3$ measured by XRR is not included. Thus, the aluminum oxide film 2112b has fewer defects; therefore, the gate insulating film 2112 can be made favorable. On the other hand, in the case where the aluminum oxide film is formed over the metal film or the amorphous insulating film which serves as a base, the aluminum oxide film having lower density is formed in the aluminum oxide film near the base. The aluminum oxide film having low density has high leakage current; therefore, when it is used as the gate insulating film, an off-state current of the transistor might be increased. Moreover, the aluminum oxide film having low density has low resistance to a chemical liquid and might be unintentionally etched in a chemical liquid treatment at the time of manufacturing the transistor. Consequently, shape defects and malfunctions of the transistor might occur.

Further, a relative dielectric constant of the aluminum oxide film 2112b is greater than or equal to 7 and less than or equal to 10. Thus, a physical thickness which is twice as large as a required equivalent oxide thickness can be obtained. Accordingly, gate leakage current can be reduced in some cases.

The semiconductor film 2106 can be formed using a silicon film, a germanium film, a silicon germanium film, a gallium arsenide film, a silicon carbide film, or a gallium nitride film. Note that an organic semiconductor film may be used as the semiconductor film 2106. Alternatively, an oxide semiconductor film may be used as the semiconductor film 2106.

Note that the description in the above embodiments is referred to for the oxide semiconductor film used as the semiconductor film 2106.

The description of the substrate 100 is referred to for the substrate 2100.

The description of the gate electrode 104 is referred to for the gate electrode 2104.

The description of the source electrode 116a and the drain electrode 116b are referred to for the source electrode 2116a and the drain electrode 2116b.

The description of the protective insulating film 118 is referred to for the protective insulating film 2118.

Next, a transistor having a structure different from that of the transistor illustrated in FIGS. 20A to 20C will be described with reference to FIGS. 21A to 21C.

Figure 21A:
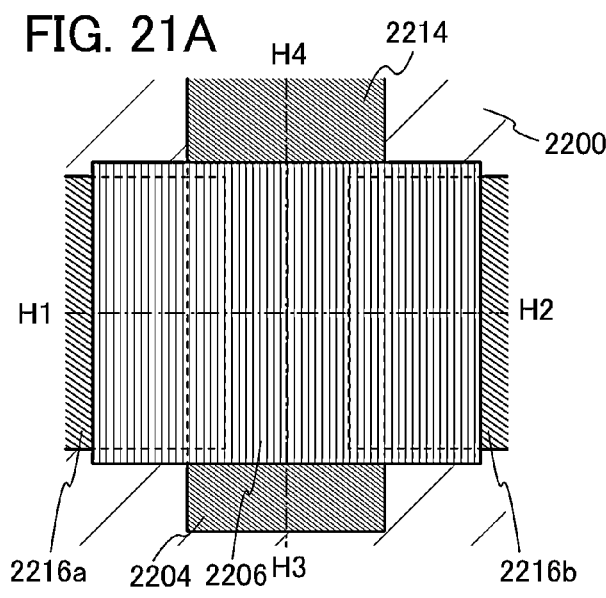
FIGS. 21A to 21C are a top view and cross-sectional views which show an example of a transistor of one embodiment of the present invention.

FIG. 21A is a top view of a transistor of one embodiment of the present invention. FIG. 21B is a cross-sectional view taken along dashed-dotted line H1-H2 in FIG. 21A. FIG. 21C is a cross-sectional view taken along dashed-dotted line H3-H4 in FIG. 21A. Note that for simplicity, a gate insulating film 2212 and the like are not illustrated in FIG. 21A.

Figure 21C:
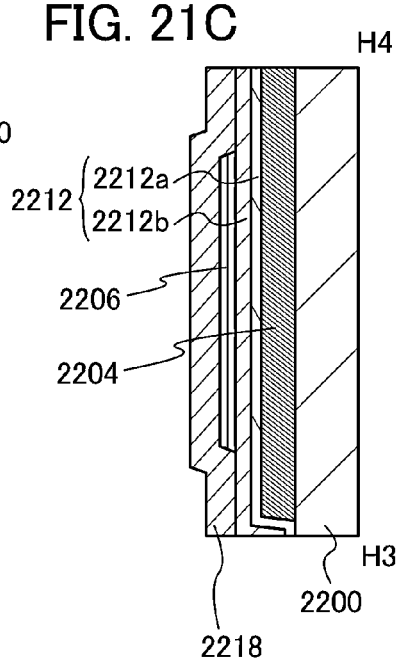
Figure 21B:
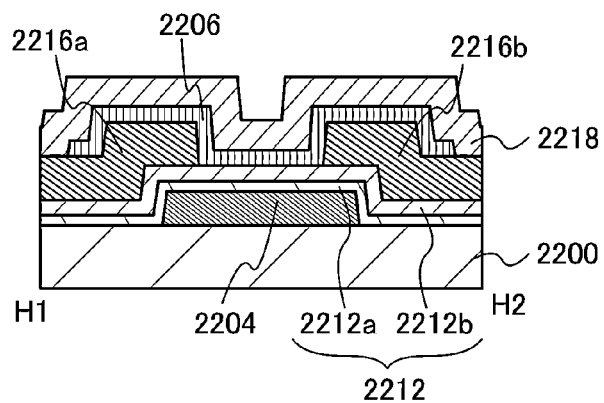

FIG. 21B is a cross-sectional view of a transistor including a gate electrode 2204 over a substrate 2200; the gate insulating film 2212 over the gate electrode 2204; a source electrode 2216a and a drain electrode 2216b over the gate insulating film 2212; a semiconductor film 2206 which is over the gate insulating film 2212, and the source electrode 2216a and the drain electrode 2216b and overlaps with the gate electrode 2204; and a protective insulating film 2218 over the semiconductor film 2206, and the source electrode 2216a and the drain electrode 2216b. Note that the gate insulating film 2212 includes a crystalline insulating film 2212a and an aluminum oxide film 2212b over the crystalline insulating film 2212a.

Here, the description of the crystalline insulating film 2112a is referred to for the crystalline insulating film 2212a.

The crystalline insulating film 2212a is an insulating film having crystallinity, specifically, an insulating film whose crystallinity can be observed by XRD, electron diffraction, or neutron diffraction.

The aluminum oxide film 2212b has crystallinity. Specifically, the crystallinity can be observed by XRD, electron diffraction, or neutron diffraction.

The aluminum oxide film 2212b has crystallinity even near the interface with the crystalline insulating film 2212a. On the other hand, in the case where an aluminum oxide film is formed over a metal film or an amorphous insulating film which serves as a base, an amorphous aluminum oxide film is formed in the aluminum oxide film near the base. The amorphous aluminum oxide film has many defects; therefore, when it is used as the gate insulating film, deterioration in electrical characteristics of the transistor might occur. Whereas, the aluminum oxide film 2212b has fewer defects; therefore, deterioration in electrical characteristics of the transistor, which is caused by defects in the gate insulating film 2212, can be suppressed.

The aluminum oxide film 2212b is a high-density aluminum oxide film, specifically, an aluminum oxide film having a density greater than or equal to 3.2 g/cm$^3$ and less than or equal to 4.1 g/cm$^3$ measured by XRR or RBS. The aluminum oxide film 2212b has a high barrier property against impurities; therefore, deterioration in electric characteristics of the transistor, which is caused by impurities, can be suppressed.

Note that the aluminum oxide film 2212b does not include a low density layer near the crystalline insulating film 2212a. Specifically, a layer having a density less than 3.2 g/cm$^3$ measured by XRR is not included. Thus, the aluminum oxide film 2212b has fewer defects; therefore, the gate insulating film 2212 can be made favorable. On the other hand, in the case where the aluminum oxide film is formed over the metal film or the amorphous insulating film which serves as a base, the aluminum oxide film having lower density is formed in the aluminum oxide film near the base. The aluminum oxide film having low density has high leakage current; therefore, when it is used as the gate insulating film, an off-state current of the transistor might be increased. Moreover, the aluminum oxide film having low density has low resistance to a chemical liquid and might be unintentionally etched in a chemical liquid treatment at the time of manufacturing the transistor. Consequently, shape defects and malfunctions of the transistor might occur.

Further, a relative dielectric constant of the aluminum oxide film 2212b is greater than or equal to 7 and less than or equal to 10. Thus, a physical thickness which is twice as large as a required equivalent oxide thickness can be obtained. Accordingly, gate leakage current can be reduced in some cases.

The description of the semiconductor film 106 is referred to for the semiconductor film 2206.

The description of the substrate 100 is referred to for the substrate 2200.

The description of the gate electrode 104 is referred to for the gate electrode 2204.

The description of the source electrode 116a and the drain electrode 116b are referred to for the source electrode 2216a and the drain electrode 2216b.

The description of the protective insulating film 118 is referred to for the protective insulating film 2218.

The protective insulating film 2218 is preferred to contain excess oxygen.

In the case where the protective insulating film 2218 contains excess oxygen, oxygen vacancies in the oxide semiconductor film can be reduced.

Next, a transistor having a structure different from those of the transistors illustrated in FIGS. 20A to 20C and FIGS. 21A to 21C will be described with reference to FIGS. 22A to 22C.

FIG. 22A is a top view of a transistor of one embodiment of the present invention. FIG. 22B is a cross-sectional view taken along dashed-dotted line 11-12 in FIG. 22A. FIG. 22C is a cross-sectional view taken along dashed-dotted line 13-14 in FIG. 22A. Note that for simplicity, a gate insulating film 2312 and the like are not illustrated in FIG. 22A.

FIG. 22B is a cross-sectional view of a transistor including a base insulating film 2302 over a substrate 2300; a semiconductor film 2306 over the base insulating film 2302; a source electrode 2316a and a drain electrode 2316b over the semiconductor film 2306; the gate insulating film 2312 over the semiconductor film 2306, and the source electrode 2316a and the drain electrode 2316b; and a gate electrode 2304 which is over the gate insulating film 2312 and overlaps with the semiconductor film 2306. Note that the gate insulating film 2312 includes a crystalline insulating film 2312a and an aluminum oxide film 2312b over the crystalline insulating film 2312a.

Here, the description of the crystalline insulating film 2112a is referred to for the crystalline insulating film 2312a.

The crystalline insulating film 2312a is an insulating film having crystallinity, specifically, an insulating film whose crystallinity can be observed by XRD, electron diffraction, or neutron diffraction.

The aluminum oxide film 2312b has crystallinity. Specifically, the crystallinity can be observed by XRD, electron diffraction, or neutron diffraction.

The aluminum oxide film 2312b has crystallinity even near the interface with the crystalline insulating film 2312a. On the other hand, in the case where an aluminum oxide film is formed over a metal film or an amorphous insulating film which serves as a base, an amorphous aluminum oxide film is formed in the aluminum oxide film near the base. The amorphous aluminum oxide film has many defects; therefore, when it is used as the gate insulating film, deterioration in electrical characteristics of the transistor might occur. Whereas, the aluminum oxide film 2312b has fewer defects; therefore, deterioration in electrical characteristics of the transistor, which is caused by defects in the gate insulating film 2312, can be suppressed.

The aluminum oxide film 2312b is a high-density aluminum oxide film, specifically, an aluminum oxide film having a density greater than or equal to 3.2 g/cm$^3$ and less than or equal to 4.1 g/cm$^3$ measured by XRR or RBS. The aluminum oxide film 2312b has a high barrier property against impurities; therefore, deterioration in electric characteristics of the transistor, which is caused by impurities, can be suppressed.

Note that the aluminum oxide film 2312b does not include a low density layer near the crystalline insulating film 2312a. Specifically, a layer having a density less than 3.2 g/cm$^3$ measured by XRR is not included. Thus, the aluminum oxide film 2312b has fewer defects; therefore, the gate insulating film 2312 can be made favorable. On the other hand, in the case where the aluminum oxide film is formed over the metal film or the amorphous insulating film which serves as a base, the aluminum oxide film having lower density is formed in the aluminum oxide film near the base. The aluminum oxide film having low density has high leakage current; therefore, when it is used as the gate insulating film, an off-state current of the transistor might be increased. Moreover, the aluminum oxide film having low density has low resistance to a chemical liquid and might be unintentionally etched in a chemical liquid treatment at the time of manufacturing the transistor. Consequently, shape defects and malfunctions of the transistor might occur.

Further, a relative dielectric constant of the aluminum oxide film 2312b is greater than or equal to 7 and less than or equal to 10. Thus, a physical thickness which is twice as large as a required equivalent oxide thickness can be obtained. Accordingly, gate leakage current can be reduced in some cases.

The description of the semiconductor film 106 is referred to for the semiconductor film 2306.

The description of the substrate 100 is referred to for the substrate 2300.

The description of the base insulating film 302 is referred to for the base insulating film 2302.

The description of the source electrode 2116a and the drain electrode 2116b are referred to for the source electrode 2316a and the drain electrode 2316b.

The description of the gate electrode 2104 is referred to for the gate electrode 2304.

Next, a transistor having a structure different from those of the transistors illustrated in FIGS. 20A to 20C, FIGS. 21A to 21C, and FIGS. 22A to 22C will be described with reference to FIGS. 23A to 23C.

Figure 23A:
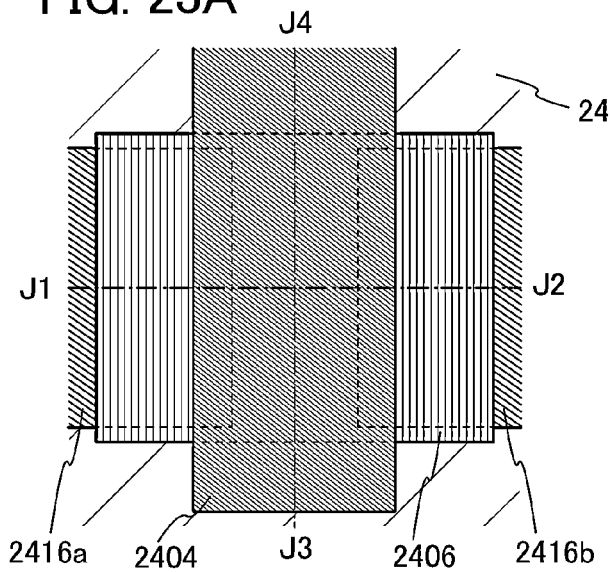
FIGS. 23A to 23C are a top view and cross-sectional views which show an example of a transistor of one embodiment of the present invention.

FIG. 23A is a top view of a transistor of one embodiment of the present invention. FIG. 23B is a cross-sectional view taken along dashed-dotted line J1-J2 in FIG. 23A. FIG. 23C is a cross-sectional view taken along dashed-dotted line J3-J4 in FIG. 23A. Note that for simplicity, a gate insulating film 2412 and the like are not illustrated in FIG. 23A.

Figure 23C:
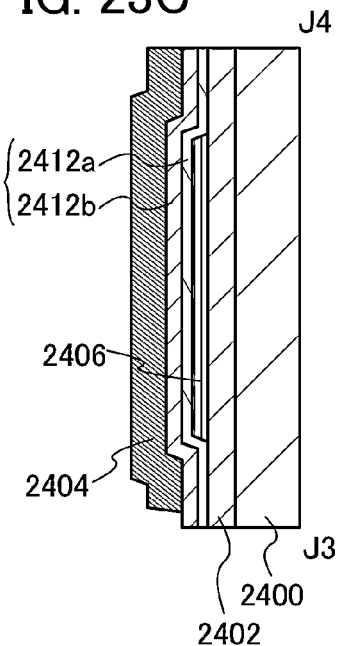
Figure 23B:
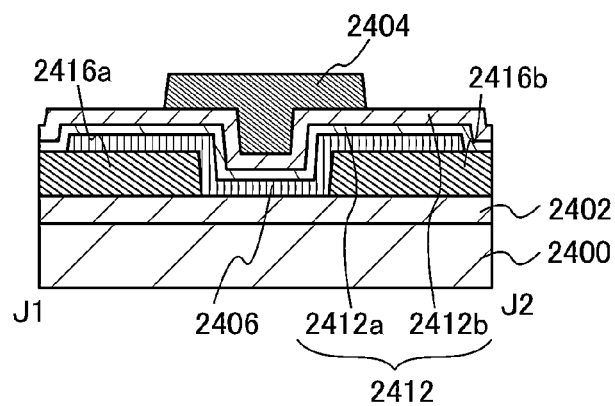

FIG. 23B is a cross-sectional view of a transistor including a base insulating film 2402 over a substrate 2400; a source electrode 2416a and a drain electrode 2416b over the base insulating film 2402; a semiconductor film 2406 over the base insulating film 2402, and the source electrode 2416a and the drain electrode 2416b; the gate insulating film 2412 over the semiconductor film 2406; and a gate electrode 2404 which is over the gate insulating film 2412 and overlaps with the semiconductor film 2406. Note that the gate insulating film 2412 includes a crystalline insulating film 2412a and an aluminum oxide film 2412b over the crystalline insulating film 2412a.

Here, the description of the crystalline insulating film 2112a is referred to for the crystalline insulating film 2412a.

The crystalline insulating film 2412a is an insulating film having crystallinity, specifically, an insulating film whose crystallinity can be observed by XRD, electron diffraction, or neutron diffraction.

The aluminum oxide film 2412b has crystallinity. Specifically, the crystallinity can be observed by XRD, electron diffraction, or neutron diffraction.

The aluminum oxide film 2412b has crystallinity even near the interface with the crystalline insulating film 2412a. On the other hand, in the case where an aluminum oxide film is formed over a metal film or an amorphous insulating film which serves as a base, an amorphous aluminum oxide film is formed in the aluminum oxide film near the base. The amorphous aluminum oxide film has many defects; therefore, when it is used as the gate insulating film, deterioration in electrical characteristics of the transistor might occur. Whereas, the aluminum oxide film 2412b has fewer defects; therefore, deterioration in electrical characteristics of the transistor, which is caused by defects in the gate insulating film 2412, can be suppressed.

The aluminum oxide film 2412b is a high-density aluminum oxide film, specifically, an aluminum oxide film having a density greater than or equal to 3.2 g/cm$^3$ and less than or equal to 4.1 g/cm$^3$ measured by XRR or RBS. The aluminum oxide film 2412b has a high barrier property against impurities; therefore, deterioration in electric characteristics of the transistor, which is caused by impurities, can be suppressed.

Note that the aluminum oxide film 2412b does not include a low density layer near the crystalline insulating film 2412a. Specifically, a layer having a density less than 3.2 g/cm$^3$ measured by XRR is not included. Thus, the aluminum oxide film 2412b has fewer defects; therefore, the gate insulating film 2412 can be made favorable. On the other hand, in the case where the aluminum oxide film is formed over the metal film or the amorphous insulating film which serves as a base, the aluminum oxide film having lower density is formed in the aluminum oxide film near the base. The aluminum oxide film having low density has high leakage current; therefore, when it is used as the gate insulating film, an off-state current of the transistor might be increased. Moreover, the aluminum oxide film having low density has low resistance to a chemical liquid and might be unintentionally etched in a chemical liquid treatment at the time of manufacturing the transistor. Consequently, shape defects and malfunctions of the transistor might occur.

Further, a relative dielectric constant of the aluminum oxide film 2412b is greater than or equal to 7 and less than or equal to 10. Thus, a physical thickness which is twice as large as a required equivalent oxide thickness can be obtained. Accordingly, gate leakage current can be reduced in some cases.

The description of the semiconductor film 106 is referred to for the semiconductor film 2406.

The description of the substrate 100 is referred to for the substrate 2400.

The description of the base insulating film 302 is referred to for the base insulating film 2402.

The base insulating film 2402 is preferred to contain excess oxygen.

In the case where the base insulating film 2402 contains excess oxygen, oxygen vacancies in the oxide semiconductor film can be reduced.

The description of the source electrode 116a and the drain electrode 116b are referred to for the source electrode 2416a and the drain electrode 2416b.

The description of the gate electrode 104 is referred to for the gate electrode 2404.

Next, a transistor having a structure different from those of the transistors illustrated in FIGS. 20A to 20C, FIGS. 21A to 21C, FIGS. 22A to 22C, and FIGS. 23A to 23C will be described with reference to FIGS. 24A to 24C.

Figure 24A:
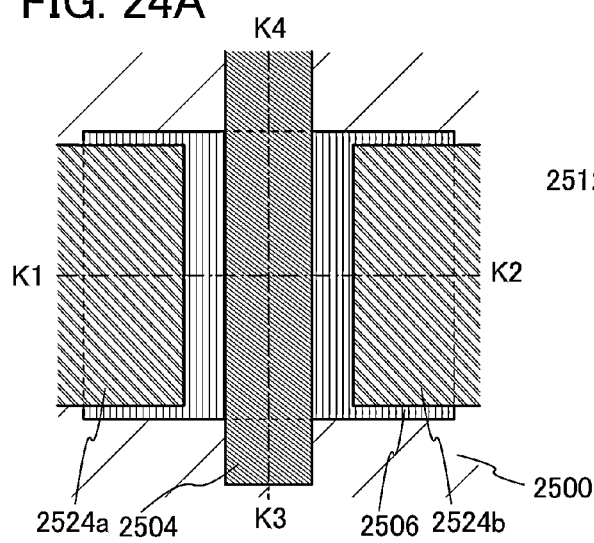
FIGS. 24A to 24C are a top view and cross-sectional views which show an example of a transistor of one embodiment of the present invention.

FIG. 24A is a top view of a transistor of one embodiment of the present invention. FIG. 24B is a cross-sectional view taken along dashed-dotted line K1-K2 in FIG. 24A. FIG. 24C is a cross-sectional view taken along dashed-dotted line K3-K4 in FIG. 24A. Note that for simplicity, a gate insulating film 2512 and the like are not illustrated in FIG. 24A.

Figure 24C:
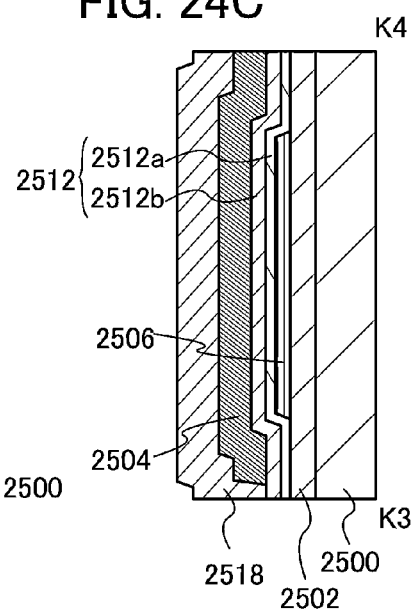
Figure 24B:
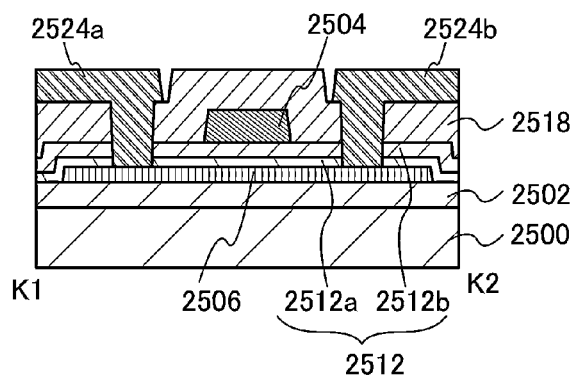

FIG. 24B is a cross-sectional view of a transistor including a base insulating film 2502 over a substrate 2500; a semiconductor film 2506 over the base insulating film 2502; the gate insulating film 2512 over the semiconductor film 2506; and a gate electrode 2504 which is over the gate insulating film 2512 and overlaps with the semiconductor film 2506. Note that the gate insulating film 2512 includes a crystalline insulating film 2512a and an aluminum oxide film 2512b over the crystalline insulating film 2512a.

In the cross-sectional view in FIG. 24B, a protective insulating film 2518 is provided over the gate insulating film 2512 and the gate electrode 2504. Note that openings reaching the semiconductor film 2506 are formed in the gate insulating film 2512 and the protective insulating film 2518, and a wiring 2524a and a wiring 2524b provided over the protective insulating film 2518 are in contact with the semiconductor film 2506 through the openings.

Note that although the gate insulating film 2512 is provided so as to cover the semiconductor film 2506 in FIG. 24B, one embodiment of the present invention is not limited to this structure. For example, the gate insulating film 2512 may be provided only in a region overlapping with the gate electrode 2504. Alternatively, a sidewall insulating film may be provided in contact with a side surface of the gate electrode 2504.

In the case of providing the sidewall insulating film, it is preferred that, in the semiconductor film 2506, a region overlapping with the sidewall insulating film has lower resistance than a region overlapping with the gate electrode 2504. For example, in the semiconductor film 2506, a region not overlapping with the gate electrode 2504 may contain an impurity that reduces the resistance of the semiconductor film 2506. Alternatively, the resistance of the region may be reduced by defects. In the semiconductor film 2506, the region overlapping with the sidewall insulating film has lower resistance than the region overlapping with the gate electrode 2504; thus, the region serves as an LDD region. With the LDD regions of the transistor, DIBL and hot-carrier degradation can be suppressed. Note that in the semiconductor film 2506, the region overlapping with the sidewall insulating film may serve also as an offset region. Also with the offset region of the transistor, DIBL and hot-carrier degradation can be suppressed.

Here, the description of the crystalline insulating film 2112a is referred to for the crystalline insulating film 2512a.

The crystalline insulating film 2512a is an insulating film having crystallinity, specifically, an insulating film whose crystallinity can be observed by XRD, electron diffraction, or neutron diffraction.

The aluminum oxide film 2512b has crystallinity. Specifically, the crystallinity can be observed by XRD, electron diffraction, or neutron diffraction.

The aluminum oxide film 2512b has crystallinity even near the interface with the crystalline insulating film 2512a. On the other hand, in the case where an aluminum oxide film is formed over a metal film or an amorphous insulating film which serves as a base, an amorphous aluminum oxide film is formed in the aluminum oxide film near the base. The amorphous aluminum oxide film has many defects; therefore, when it is used as the gate insulating film, deterioration in electrical characteristics of the transistor might occur. Whereas, the aluminum oxide film 2512b has fewer defects; therefore, deterioration in electrical characteristics of the transistor, which is caused by defects in the gate insulating film 2512, can be suppressed.

The aluminum oxide film 2512b is a high-density aluminum oxide film, specifically, an aluminum oxide film having a density greater than or equal to 3.2 g/cm$^3$ and less than or equal to 4.1 g/cm$^3$ measured by XRR or RBS. The aluminum oxide film 2512b has a high barrier property against impurities; therefore, deterioration in electric characteristics of the transistor, which is caused by impurities, can be suppressed.

Note that the aluminum oxide film 2512b does not include a low density layer near the crystalline insulating film 2512a. Specifically, a layer having a density less than 3.2 g/cm$^3$ measured by XRR is not included. Thus, the aluminum oxide film 2512b has fewer defects; therefore, the gate insulating film 2512 can be made favorable. On the other hand, in the case where the aluminum oxide film is formed over the metal film or the amorphous insulating film which serves as a base, the aluminum oxide film having lower density is formed in the aluminum oxide film near the base. The aluminum oxide film having low density has high leakage current; therefore, when it is used as the gate insulating film, an off-state current of the transistor might be increased. Moreover, the aluminum oxide film having low density has low resistance to a chemical liquid and might be unintentionally etched in a chemical liquid treatment at the time of manufacturing the transistor. Consequently, shape defects and malfunctions of the transistor might occur.

Further, a relative dielectric constant of the aluminum oxide film 2512b is greater than or equal to 7 and less than or equal to 10. Thus, a physical thickness which is twice as large as a required equivalent oxide thickness can be obtained. Accordingly, gate leakage current can be reduced in some cases.

The description of the semiconductor film 106 is referred to for the semiconductor film 2506.

It is preferred that, in the semiconductor film 2506, a region not overlapping with the gate electrode 2504 has lower resistance than a region overlapping with the gate electrode 2504. For example, in the semiconductor film 2506, the region not overlapping with the gate electrode 2504 may contain an impurity that reduces the resistance of the semiconductor film 2506. Alternatively, the resistance of the region may be reduced by defects. In the semiconductor film 2506, the region not overlapping with the gate electrode 2504 has lower resistance than the region overlapping with the gate electrode 2504; thus, the region can serve as a source region and a drain region of the transistor.

The description of the substrate 100 is referred to for the substrate 2500.

The description of the base insulating film 302 is referred to for the base insulating film 2502.

The base insulating film 2502 is preferred to contain excess oxygen.

In the case where the base insulating film 2502 contains excess oxygen, oxygen vacancies in the oxide semiconductor film can be reduced.

The description of the gate electrode 104 is referred to for the gate electrode 2504.

The description of the protective insulating film 518 is referred to for the protective insulating film 2518.

The description of the wiring 524a and the wiring 524b are referred to for the wiring 2524a and the wiring 2524b.

In the transistor illustrated in FIGS. 24A to 24C, a region where the gate electrode 2504 overlaps with another wiring and electrode is small; therefore, parasitic capacitance is unlikely to be generated. Accordingly, the switching characteristics of the transistor can be enhanced. Moreover, the channel length of the transistor is determined by the width of the gate electrode 2504; therefore, a miniaturized transistor having a short channel length is manufactured easily.

Next, a transistor having a structure different from those of the transistors illustrated in FIGS. 20A to 20C, FIGS. 21A to 21C, FIGS. 22A to 22C, FIGS. 23A to 23C, and FIGS. 24A to 24C will be described with reference to FIGS. 25A to 25C.

Figure 25A:
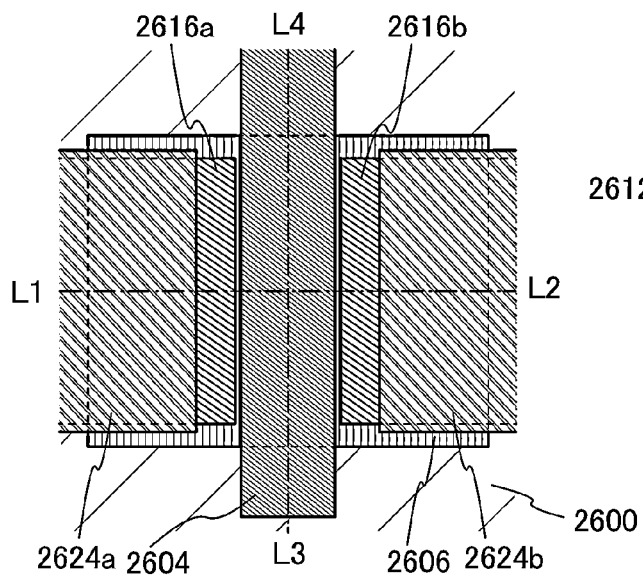
FIGS. 25A to 25C are a top view and cross-sectional views which show an example of a transistor of one embodiment of the present invention.

FIG. 25A is a top view of a transistor of one embodiment of the present invention. FIG. 25B is a cross-sectional view taken along dashed-dotted line L1-L2 in FIG. 25A. FIG. 25C is a cross-sectional view taken along dashed-dotted line L3-L4 in FIG. 25A. Note that for simplicity, a gate insulating film 2612 and the like are not illustrated in FIG. 25A.

Figure 25C:
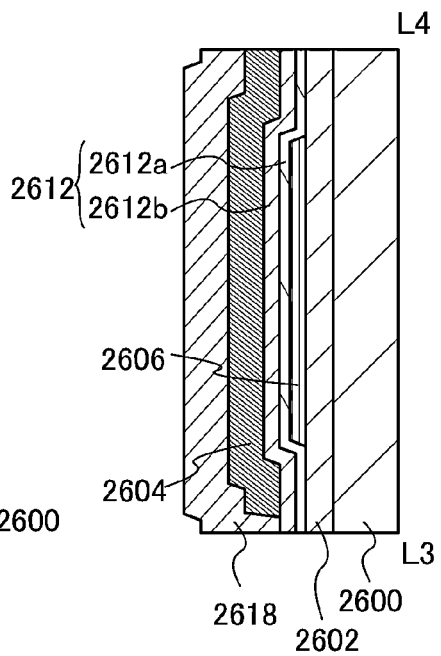
Figure 25B:
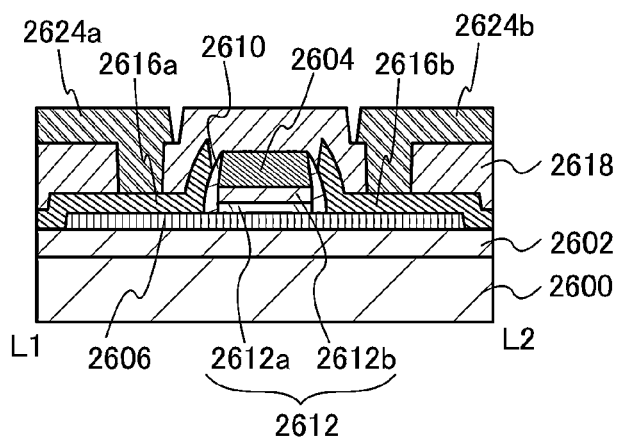

FIG. 25B is a cross-sectional view of a transistor including a base insulating film 2602 over a substrate 2600; a semiconductor film 2606 over the base insulating film 2602; the gate insulating film 2612 over the semiconductor film 2606; a gate electrode 2604 over the gate insulating film 2612; a sidewall insulating film 2610 in contact with side surfaces of the gate electrode 2604; and a source electrode 2616a and a drain electrode 2616b over the semiconductor film 2606 and the sidewall insulating film 2610. Note that the gate insulating film 2612 includes a crystalline insulating film 2612a and an aluminum oxide film 2612b over the crystalline insulating film 2612a.

In the cross-sectional view in FIG. 25B, a protective insulating film 2618 is provided over the gate electrode 2604, and the source electrode 2616a and the drain electrode 2616b. Note that openings reaching the source electrode 2616a and the drain electrode 2616b are formed in the protective insulating film 2618, and a wiring 2624a and a wiring 2624b provided over the protective insulating film 2618 are in contact with the source electrode 2616a and the drain electrode 2616b, respectively, through the openings.

Note that although part of the sidewall insulating film 2610 is provided on the side surfaces of the gate insulating film 2612 in FIG. 25B, one embodiment of the present invention is not limited to this structure. For example, the sidewall insulating film 2610 may be provided over the gate insulating film 2612.

Here, the description of the crystalline insulating film 2112a is referred to for the crystalline insulating film 2612a.

The crystalline insulating film 2612a is an insulating film having crystallinity, specifically, an insulating film whose crystallinity can be observed by XRD, electron diffraction, or neutron diffraction.

The aluminum oxide film 2612b has crystallinity. Specifically, the crystallinity can be observed by XRD, electron diffraction, or neutron diffraction.

The aluminum oxide film 2612b has crystallinity even near the interface with the crystalline insulating film 2612a. On the other hand, in the case where an aluminum oxide film is formed over a metal film or an amorphous insulating film which serves as a base, an amorphous aluminum oxide film is formed in the aluminum oxide film near the base. The amorphous aluminum oxide film has many defects; therefore, when it is used as the gate insulating film, deterioration in electrical characteristics of the transistor might occur. Whereas, the aluminum oxide film 2612b has fewer defects; therefore, deterioration in electrical characteristics of the transistor, which is caused by defects in the gate insulating film 2612, can be suppressed.

The aluminum oxide film 2612b is a high-density aluminum oxide film, specifically, an aluminum oxide film having a density greater than or equal to 3.2 $g/cm^3$ and less than or equal to 4.1 $g/cm^3$ measured by XRR or RBS. The aluminum oxide film 2612b has a high barrier property against impurities; therefore, deterioration in electric characteristics of the transistor, which is caused by impurities, can be suppressed.

Note that the aluminum oxide film 2612b does not include a low density layer near the crystalline insulating film 2612a. Specifically, a layer having a density less than 3.2 $g/cm^3$ measured by XRR is not included. Thus, the aluminum oxide film 2612b has fewer defects; therefore, the gate insulating film 2612 can be made favorable. On the other hand, in the case where the aluminum oxide film is formed over the metal film or the amorphous insulating film which serves as a base, the aluminum oxide film having lower density is formed in the aluminum oxide film near the base. The aluminum oxide film having low density has high leakage current; therefore, when it is used as the gate insulating film, an off-state current of the transistor might be increased. Moreover, the aluminum oxide film having low density has low resistance to a chemical liquid and might be unintentionally etched in a chemical liquid treatment at the time of manufacturing the transistor. Consequently, shape defects and malfunctions of the transistor might occur.

Further, a relative dielectric constant of the aluminum oxide film 2612b is greater than or equal to 7 and less than or equal to 10. Thus, a physical thickness which is twice as large as a required equivalent oxide thickness can be obtained. Accordingly, gate leakage current can be reduced in some cases.

The description of the semiconductor film 106 is referred to for the semiconductor film 2606.

It is preferred that, in the semiconductor film 2606, a region not overlapping with the gate electrode 2604 has lower resistance than a region overlapping with the gate electrode 2604. For example, in the semiconductor film 2606, the region not overlapping with the gate electrode 2604 may contain an impurity that reduces the resistance of the semiconductor film 2606. Alternatively, the resistance of the region may be reduced by defects. In the semiconductor film 2606, the region not overlapping with the gate electrode 2604 has lower resistance than the region overlapping with the gate electrode 2604; thus, the region can serve as a source region and a drain region of the transistor. However, since the transistor illustrated in FIG. 25B includes the source electrode 2616a and the drain electrode 2616b, a source region and a drain region are not necessarily provided.

It is preferred that, in the semiconductor film 2606, a region overlapping with the sidewall insulating film 2610 has higher resistance than a region overlapping with the source electrode 2616a and the drain electrode 2616b and lower resistance than a region overlapping with the gate electrode 2604. For example, in the semiconductor film 2606, the region not overlapping with the gate electrode 2604 may contain an impurity that reduces the resistance of the semiconductor film 2606. Alternatively, the resistance of the region may be reduced by defects. In the semiconductor film 2606, the region overlapping with the sidewall insulating film 2610 has higher resistance than the source electrode 2616a and the drain electrode 2616b and lower resistance than the region overlapping with the gate electrode 2604; thus, the region serves as an LDD region. With the LDD regions of the transistor, DIBL and hot-carrier degradation can be suppressed. Note that in the semiconductor film 2606, the region overlapping with the sidewall insulating film 2610 may serve also as an offset region. Also with the offset region of the transistor, DIBL and hot-carrier degradation can be suppressed.

The description of the substrate 100 is referred to for the substrate 2600.

The description of the base insulating film 302 is referred to for the base insulating film 2602.

The base insulating film 2602 is preferred to contain excess oxygen.

In the case where the base insulating film 2602 contains excess oxygen, oxygen vacancies in the oxide semiconductor film can be reduced.

The description of the gate electrode 104 is referred to for the gate electrode 2604.

The description of the sidewall insulating film 610 is referred to for the sidewall insulating film 2610.

Note that it is preferred to use a crystalline insulating film and an aluminum oxide film over the crystalline insulating film for the sidewall insulating film 2610. With such a structure, shape defects of the sidewall insulating film 2610 can be made unlikely to occur.

The description of the source electrode 616a and the drain electrode 616b are referred to for the source electrode 2616a and the drain electrode 2616b.

The description of the protective insulating film 518 is referred to for the protective insulating film 2618.

The description of the wiring 524a and the wiring 524b are referred to for the wiring 2624a and the wiring 2624b.

In the transistor illustrated in FIGS. 25A to 25C, a region where the gate electrode 2604 overlaps with another wiring and electrode is small; therefore, parasitic capacitance is unlikely to be generated. Accordingly, the switching characteristics of the transistor can be enhanced. The source electrode 2616a and the drain electrode 2616b are provided, whereby parasitic resistance can be made lower than that of the transistor illustrated in FIGS. 24A to 24C. Accordingly, an on-state current can be increased. Moreover, the channel length of the transistor is determined by the width of the gate electrode 2604; therefore, a miniaturized transistor having a short channel length is manufactured easily.

According to this embodiment, since a gate insulating film has a high barrier property against impurities and contains fewer defects, a transistor having stable electric characteristics and high reliability can be provided.

This embodiment is obtained by performing change, addition, modification, removal, application, superordinate conceptualization, or subordinate conceptualization on part or the whole of another embodiment. Thus, part or whole of this embodiment can be freely combined with, applied to, or replaced with part or all of another embodiment.

[Embodiment 4]

In this embodiment, methods for manufacturing the transistors described in Embodiment 3 will be described.

First, a method for manufacturing the transistor illustrated in FIGS. 20A to 20C will be described with reference to FIGS. 26A to 26C and FIGS. 27A to 27C. Note that only cross-sectional views corresponding to FIG. 20B are shown for simplicity in FIGS. 26A to 26C and FIGS. 27A to 27C.

First, the substrate 2100 is prepared. As the substrate 2100, a substrate selected from the substrates given as examples of the substrate 2100 can be used.

Next, a conductive film to be the gate electrode 2104 is formed. The conductive film to be the gate electrode 2104 can be formed using a conductive film selected from the conductive films given as examples of the gate electrode 2104 and can be formed by a sputtering method, a CVD method, an MBE method, an ALD method, or a PLD method.

When a microwave CVD method is employed as the CVD method, plasma damage to a surface to be formed can be made small. Since high-density plasma is used, a dense film having fewer defects can be formed even at a relatively low temperature (at approximately 325° C.). Note that the microwave CVD method is also referred to as a high-density plasma CVD method.

Figure 26A:
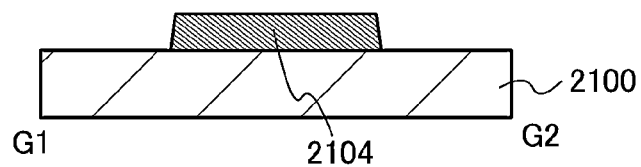
FIGS. 26A to 26C are cross-sectional views illustrating an example of a method for manufacturing the transistor illustrated in FIGS. 20A to 20C.

Next, the conductive film to be the gate electrode 2104 is processed to form the gate electrode 2104 (see FIG. 26A).

Figure 26B:
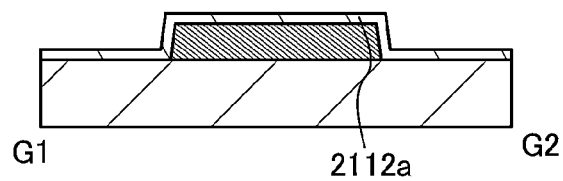

Next, the crystalline insulating film 2112a is formed (see FIG. 26B). The crystalline insulating film 2112a can be formed using an insulating film selected from the insulating films given as examples of the crystalline insulating film 2112a and can be formed by a sputtering method, a CVD method, a MBE method, an ALD method, or a PLD method. Note that it is preferred to employ a sputtering method because an insulating film having crystallinity and a high density is likely to be formed. Moreover, it is preferred to form the crystalline insulating film 2112a while the substrate is heated at a temperature higher than or equal to 100° C. and lower than or equal to 450° C. because an insulating film having crystallinity and a high density is likely to be formed.

Note that a first heat treatment may be performed after the crystalline insulating film 2112a is formed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, preferably 1% or more, further preferably 10% or more, or under reduced pressure. Alternatively, the first heat treatment may be performed in such a manner that a heat treatment is performed in an inert gas atmosphere, and then another heat treatment is performed in an atmosphere containing an oxidizing gas at 10 ppm or more, preferably 1% or more, further preferably 10% or more in order to compensate desorbed oxygen. By the first heat treatment, the crystallinity of the crystalline insulating film 2112a can be improved and impurities such as hydrogen and water can be removed.

Figure 26C:
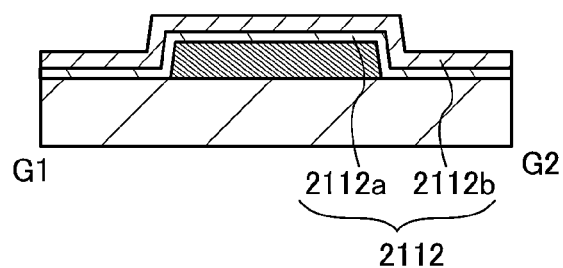

Next, the aluminum oxide film 2112b is formed (see FIG. 26C). The aluminum oxide film 2112b can be formed by a sputtering method, a CVD method, an MBE method, an ALD method, or a PLD method.

The aluminum oxide film 2112b is formed over the crystalline insulating film 2112a, whereby the aluminum oxide film 2112b having crystallinity and a high density can be formed. The aluminum oxide film 2112b having crystallinity and a high density is unlikely to transmit hydrogen, water, oxygen, and a metal element (particularly Cu). Thus, the aluminum oxide film 2112b serves as a barrier film against impurities which cause deterioration in electrical characteristics of the transistor.

Note that it is preferred to employ a sputtering method because the aluminum oxide film 2112b having crystallinity and a high density is likely to be formed over the crystalline insulating film 2112a. Moreover, it is preferred to form the aluminum oxide film 2112b while the substrate is heated at a temperature higher than or equal to 100° C. and lower than or equal to 450° C. because an insulating film having crystallinity and a high density is likely to be formed.

In this manner, the gate insulating film 2112 including the crystalline insulating film 2112a and the aluminum oxide film 2112b over the crystalline insulating film 2112a can be formed. Note that the gate insulating film 2112 is not limited to the structure including only the crystalline insulating film 2112a and the aluminum oxide film 2112b. For example, another insulating film may be provided below the crystalline insulating film 2112a or over the aluminum oxide film 2112b. The condition of an interface between the gate insulating film 2112 and the semiconductor film 2106 can be made favorable by providing, for example, a silicon oxide film over the aluminum oxide film 2112b.

Next, a semiconductor film to be the semiconductor film 2106 is formed. The semiconductor film to be the semiconductor film 2106 can be formed using a semiconductor film selected from the semiconductor films given as examples of the semiconductor film 2106 and can be formed by a sputtering method, a CVD method, an MBE method, an ALD method, or a PLD method. The semiconductor film to be the semiconductor film 2106 is preferred to be formed using an oxide semiconductor film by a sputtering method. Note that it is preferred to employ a sputtering method because an oxide semiconductor film having crystallinity and a high density is likely to be formed. Moreover, it is preferred to form the oxide semiconductor film while the substrate is heated at a temperature higher than or equal to 100° C. and lower than or equal to 450° C. because an oxide semiconductor film having crystallinity and a high density is likely to be formed.

Note that a second heat treatment may be performed after the oxide semiconductor film is formed. The second heat treatment can be performed under the conditions shown in the first heat treatment. By the second heat treatment, the crystallinity of the oxide semiconductor film can be improved and further impurities such as hydrogen and water can be removed from the oxide semiconductor film.

Figure 27A:
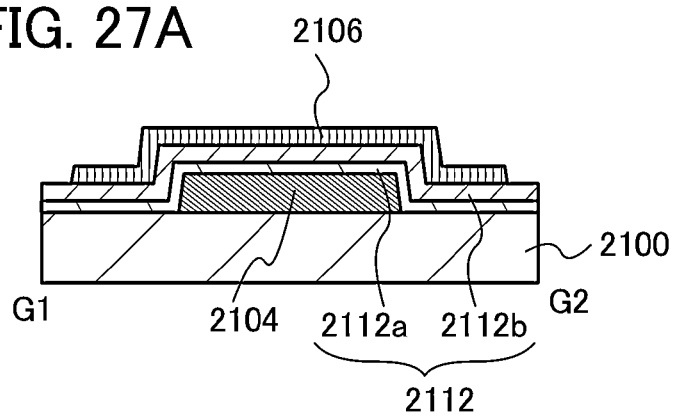
FIGS. 27A to 27C are cross-sectional views illustrating the example of the method for manufacturing the transistor illustrated in FIGS. 20A to 20C.

Next, the semiconductor film to be the semiconductor film 2106 is processed into an island shape to form the semiconductor film 2106 (see FIG. 27A).

Note that when the semiconductor film 2106 is an oxide semiconductor film, a third heat treatment may be performed after the semiconductor film 2106 is formed. The third heat treatment can be performed under the conditions shown in the first heat treatment. By the third heat treatment, which is performed with the side surfaces of the oxide semiconductor film exposed, impurities such as hydrogen and water are likely to be removed from the side surfaces of the oxide semiconductor film and thus the impurities can be effectively removed. Moreover, impurities such as hydrogen and water that exist at the interface between the aluminum oxide film 2112b and the semiconductor film 2106 can also be removed. Note that when the oxide semiconductor film is a CAAC-OS film, impurities diffuse easily along a layer of crystal; thus, impurities such as hydrogen and water are further likely to be removed form the side surfaces.

Next, a conductive film to be the source electrode 2116a and the drain electrode 2116b is formed. The conductive film to be the source electrode 2116a and the drain electrode 2116b can be formed using a conductive film selected from the conductive films given as examples of the source electrode 2116a and the drain electrode 2116b and can be formed by a sputtering method, a CVD method, an MBE method, an ALD method, or a PLD method.

Figure 27B:
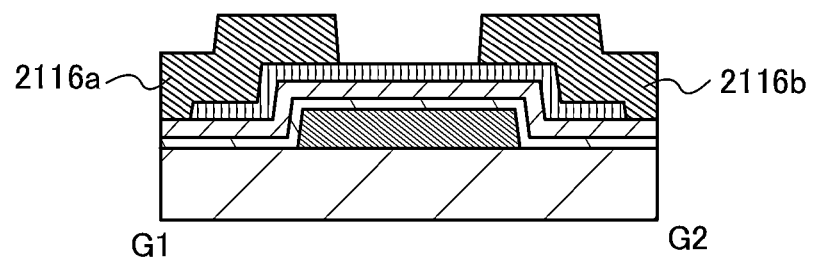

Next, the conductive film to be the source electrode 2116a and the drain electrode 2116b is processed to form the source electrode 2116a and the drain electrode 2116b (see FIG. 27B).

Figure 27C:
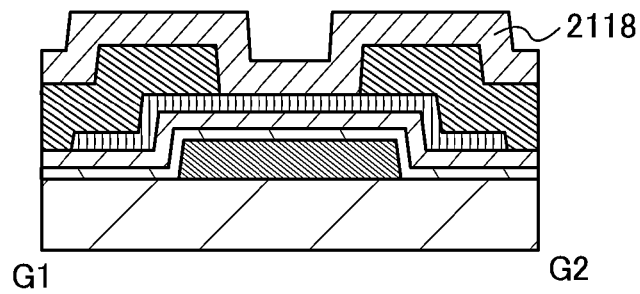

Next, the protective insulating film 2118 is formed (see FIG. 27C). The protective insulating film 2118 can be formed using an insulating film selected from the insulating films given as examples of the protective insulating film 2118 and can be formed by a sputtering method, a CVD method, an MBE method, an ALD method, or a PLD method.

As the protective insulating film 2118, for example, a silicon oxide film is preferred to be formed by an RF sputtering method under the following conditions: a quartz (preferably synthetic quartz) target is used; the substrate heating temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas. With such a method, the protective insulating film 2118 can contain excess oxygen.

Next, a fourth heat treatment may be performed. The fourth heat treatment may be performed under conditions selected from conditions similar to those of the first heat treatment. By the fourth heat treatment, when the semiconductor film 2106 is an oxide semiconductor film and the protective insulating film 2118 contains excess oxygen, defects in the semiconductor film 2106 (oxygen vacancies in the oxide semiconductor film) can be reduced.

Through the above steps, the transistor illustrated in FIGS. 20A to 20C can be manufactured.

When the semiconductor film 2106 is an oxide semiconductor film, a transistor having stable electrical characteristics and high reliability can be provided by performing the first to fourth heat treatments. Moreover, the gate insulating film 2112 serves as a barrier film against impurities which cause deterioration in electrical characteristics of the transistor. Thus, even in the case where diffusion of the impurities occurs, the first to fourth heat treatments can prevent deterioration in electrical characteristics from being caused. However, one embodiment of the present invention is not limited to performing all of the first to fourth heat treatments.

Next, a method for manufacturing the transistor illustrated in FIGS. 21A to 21C will be described with reference to FIGS. 28A to 28C and FIGS. 29A to 29C. Note that only cross-sectional views corresponding to FIG. 21B are shown for simplicity in FIGS. 28A to 28C and FIGS. 29A to 29C.

First, the substrate 2200 is prepared. As the substrate 2200, a substrate selected from the substrates given as examples of the substrate 2200 can be used.

Next, a conductive film to be the gate electrode 2204 is formed. The conductive film to be the gate electrode 2204 can be formed using a conductive film selected from the conductive films given as examples of the gate electrode 2204 and can be formed by a sputtering method, a CVD method, an MBE method, an ALD method, or a PLD method.

Figure 28A:
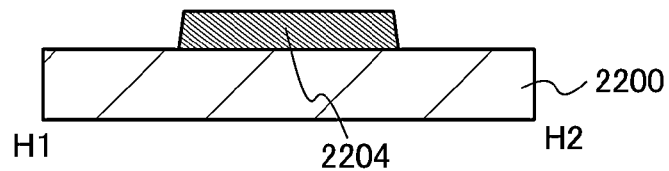
FIGS. 28A to 28C are cross-sectional views illustrating an example of a method for manufacturing the transistor illustrated in FIGS. 21A to 21C.

Next, the conductive film to be the gate electrode 2204 is processed to form the gate electrode 2204 (see FIG. 28A).

Figure 28B:
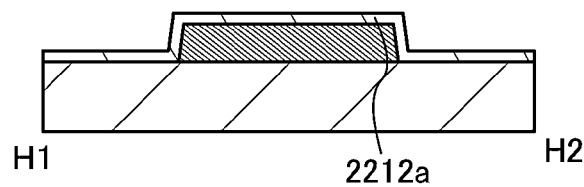

Next, the crystalline insulating film 2212a is formed (see FIG. 28B). The crystalline insulating film 2212a can be formed using an insulating film selected from the insulating films given as examples of the crystalline insulating film 2212a and can be formed by a sputtering method, a CVD method, a MBE method, an ALD method, or a PLD method. Note that it is preferred to employ a sputtering method because an insulating film having crystallinity and a high density is likely to be formed. Moreover, it is preferred to form the crystalline insulating film 2212a while the substrate is heated at a temperature higher than or equal to 100° C. and lower than or equal to 450° C. because an insulating film having crystallinity and a high density is likely to be formed.

Note that a fifth heat treatment may be performed after the crystalline insulating film 2212a is formed. The fifth heat treatment can be performed under the conditions shown in the first heat treatment. By the fifth heat treatment, the crystallinity of the crystalline insulating film 2212a can be improved and impurities such as hydrogen and water can be removed.

Figure 28C:
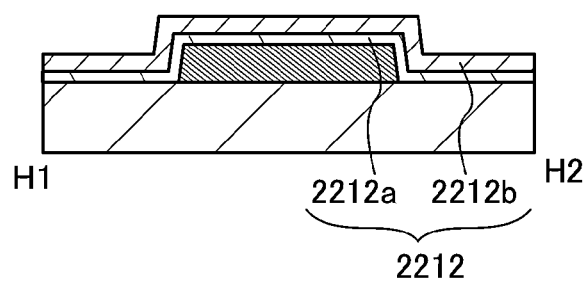

Next, the aluminum oxide film 2212b is formed (see FIG. 28C). The aluminum oxide film 2212b can be formed by a sputtering method, a CVD method, an MBE method, an ALD method, or a PLD method.

The aluminum oxide film 2212b is formed over the crystalline insulating film 2212a, whereby the aluminum oxide film 2212b having crystallinity and a high density can be formed. The aluminum oxide film 2212b having crystallinity and a high density is unlikely to transmit hydrogen, water, oxygen, and a metal element (particularly Cu). Thus, the aluminum oxide film 2212b serves as a bather film against impurities which cause deterioration in electrical characteristics of the transistor.

Note that it is preferred to employ a sputtering method because the aluminum oxide film 2212b having crystallinity and a high density is likely to be formed over the crystalline insulating film 2212a. Moreover, it is preferred to form the aluminum oxide film 2212b while the substrate is heated at a temperature higher than or equal to 100° C. and lower than or equal to 450° C. because an insulating film having crystallinity and a high density is likely to be formed.

In this manner, the gate insulating film 2212 including the crystalline insulating film 2212a and the aluminum oxide film 2212b over the crystalline insulating film 2212a can be formed. Note that the gate insulating film 2212 is not limited to the structure including only the crystalline insulating film 2212a and the aluminum oxide film 2212b. For example, another insulating film may be provided below the crystalline insulating film 2212a or over the aluminum oxide film 2212b. The condition of an interface between the gate insulating film 2212 and the semiconductor film 2206 can be made favorable by providing, for example, a silicon oxide film over the aluminum oxide film 2212b.

Next, a conductive film to be the source electrode 2216a and the drain electrode 2216b is formed. The conductive film to be the source electrode 2216a and the drain electrode 2216b can be formed using a conductive film selected from the conductive films given as examples of the source electrode 2216a and the drain electrode 2216b and can be formed by a sputtering method, a CVD method, an MBE method, an ALD method, or a PLD method.

Figure 29A:
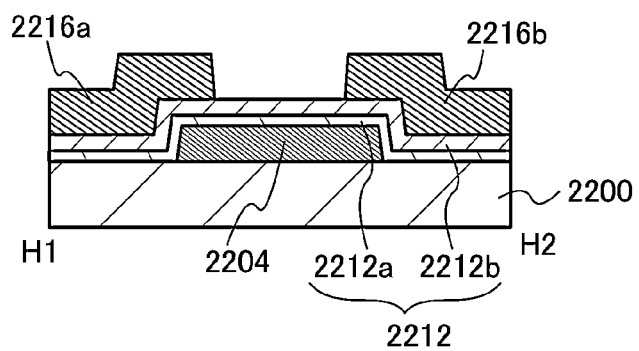
FIGS. 29A to 29C are cross-sectional views illustrating the example of the method for manufacturing the transistor illustrated in FIGS. 21A to 21C.

Next, the conductive film to be the source electrode 2216a and the drain electrode 2216b is processed to form the source electrode 2216a and the drain electrode 2216b (see FIG. 29A).

Next, a semiconductor film to be the semiconductor film 2206 is formed. The semiconductor film to be the semiconductor film 2206 can be formed using a semiconductor film selected from the semiconductor films given as examples of the semiconductor film 2206 and can be formed by a sputtering method, a CVD method, an MBE method, an ALD method, or a PLD method. The semiconductor film to be the semiconductor film 2206 is preferred to be formed using an oxide semiconductor film by a sputtering method. Note that it is preferred to employ a sputtering method because an oxide semiconductor film having crystallinity and a high density is likely to be formed. Moreover, it is preferred to form the oxide semiconductor film while the substrate is heated at a temperature higher than or equal to 100° C. and lower than or equal to 450° C. because an oxide semiconductor film having crystallinity and a high density is likely to be formed.

Note that a sixth heat treatment may be performed after the oxide semiconductor film is formed. The sixth heat treatment can be performed under the conditions shown in the first heat treatment. By the sixth heat treatment, the crystallinity of the oxide semiconductor film can be improved and further impurities such as hydrogen and water can be removed from the oxide semiconductor film.

Figure 29B:
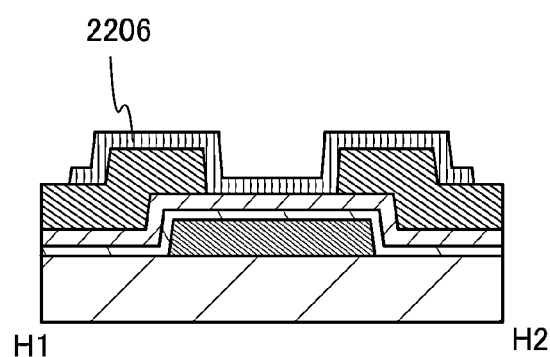

Next, the semiconductor film to be the semiconductor film 2206 is processed into an island shape to form the semiconductor film 2206 (see FIG. 29B).

Note that when the semiconductor film 2206 is an oxide semiconductor film, a seventh heat treatment may be performed after the semiconductor film 2206 is formed. The seventh heat treatment can be performed under the conditions shown in the first heat treatment. By the seventh heat treatment, which is performed with the side surfaces of the oxide semiconductor film exposed, impurities such as hydrogen and water are likely to be removed from the side surfaces of the oxide semiconductor film and thus the impurities can be effectively removed. Moreover, impurities such as hydrogen and water that exist at the interface between the aluminum oxide film 2212b and the semiconductor film 2206 can also be removed. Note that when the oxide semiconductor film is a CAAC-OS film, impurities diffuse easily along a layer of crystal; thus, impurities such as hydrogen and water are further likely to be removed form the side surfaces.

Figure 29C:
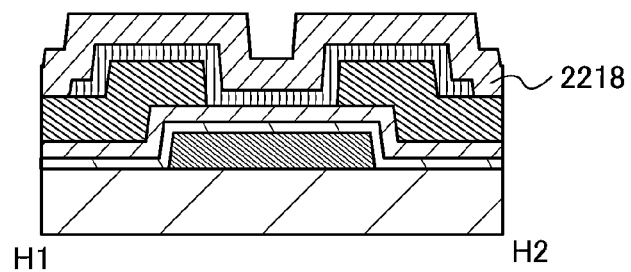

Next, the protective insulating film 2218 is formed (see FIG. 29C). The protective insulating film 2218 can be formed using an insulating film selected from the insulating films given as examples of the protective insulating film 2218 and can be formed by a sputtering method, a CVD method, an MBE method, an ALD method, or a PLD method.

As the protective insulating film 2218, for example, a silicon oxide film is preferred to be formed by an RF sputtering method under the following conditions: a quartz (preferably synthetic quartz) target is used; the substrate heating temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas. With such a method, the protective insulating film 2218 can contain excess oxygen.

Next, an eighth heat treatment may be performed. The eighth heat treatment may be performed under conditions selected from conditions similar to those of the first heat treatment. By the eighth heat treatment, when the semiconductor film 2206 is an oxide semiconductor film and the protective insulating film 2218 contains excess oxygen, defects in the semiconductor film 2206 (oxygen vacancies in the oxide semiconductor film) can be reduced.

Through the above steps, the transistor illustrated in FIGS. 21A to 21C can be manufactured.

When the semiconductor film 2206 is an oxide semiconductor film, a transistor having stable electrical characteristics and high reliability can be provided by performing the fifth to eighth heat treatments. Moreover, the gate insulating film 2212 serves as a barrier film against impurities which cause deterioration in electrical characteristics of the transistor. Thus, even in the case where diffusion of the impurities occurs, the fifth to eighth heat treatments can prevent deterioration in electrical characteristics from being caused. However, one embodiment of the present invention is not limited to performing all of the fifth to eighth heat treatments.

Next, a method for manufacturing the transistor illustrated in FIGS. 22A to 22C will be described with reference to FIGS. 30A to 30C and FIGS. 31A and 31B. Note that only cross-sectional views corresponding to FIG. 22B are shown for simplicity in FIGS. 30A to 30C and FIGS. 31A and 31B.

First, the substrate 2300 is prepared. As the substrate 2300, a substrate selected from the substrates given as examples of the substrate 2300 can be used.

Next, the base insulating film 2302 is formed. The base insulating film 2302 can be formed using an insulating film selected from the insulating films given as examples of the base insulating film 2302 and can be formed by a sputtering method, a CVD method, a MBE method, an ALD method, or a PLD method.

As the base insulating film 2302, for example, a silicon oxide film is preferred to be formed by an RF sputtering method under the following conditions: a quartz (preferably synthetic quartz) target is used; the substrate heating temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas. With such a method, the base insulating film 2302 can contain excess oxygen.

Next, a semiconductor film to be the semiconductor film 2306 is formed. The semiconductor film to be the semiconductor film 2306 can be formed using a semiconductor film selected from the semiconductor films given as examples of the semiconductor film 2306 and can be formed by a sputtering method, a CVD method, an MBE method, an ALD method, or a PLD method. The semiconductor film to be the semiconductor film 2306 is preferred to be formed using an oxide semiconductor film by a sputtering method. Note that it is preferred to employ a sputtering method because an oxide semiconductor film having crystallinity and a high density is likely to be formed. Moreover, it is preferred to form the oxide semiconductor film while the substrate is heated at a temperature higher than or equal to 100° C. and lower than or equal to 450° C. because an oxide semiconductor film having crystallinity and a high density is likely to be formed.

Note that a ninth heat treatment may be performed after the oxide semiconductor film is formed. The ninth heat treatment can be performed under the conditions shown in the first heat treatment. By the ninth heat treatment, the crystallinity of the oxide semiconductor film can be improved and further impurities such as hydrogen and water can be removed from the oxide semiconductor film.

Figure 30A:
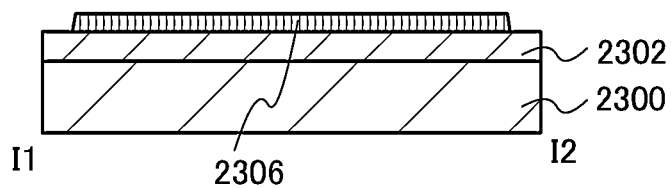
FIGS. 30A to 30C are cross-sectional views illustrating an example of a method for manufacturing the transistor illustrated in FIGS. 22A to 22C.

Next, the semiconductor film to be the semiconductor film 2306 is processed into an island shape to form the semiconductor film 2306 (see FIG. 30A).

Note that when the semiconductor film 2306 is an oxide semiconductor film, a tenth heat treatment may be performed after the semiconductor film 2306 is formed. The tenth heat treatment can be performed under the conditions shown in the first heat treatment. By the tenth heat treatment, which is performed with the side surfaces of the oxide semiconductor film exposed, impurities such as hydrogen and water are likely to be removed from the side surfaces of the oxide semiconductor film and thus the impurities can be effectively removed. Moreover, impurities such as hydrogen and water that exist at the interface between the base insulating film 2302 and the semiconductor film 2306 can also be removed. Note that when the oxide semiconductor film is a CAAC-OS film, impurities diffuse easily along a layer of crystal; thus, impurities such as hydrogen and water are further likely to be removed form the side surfaces.

Next, a conductive film to be the source electrode 2316a and the drain electrode 2316b is formed. The conductive film to be the source electrode 2316a and the drain electrode 2316b can be formed using a conductive film selected from the conductive films given as examples of the source electrode 2316a and the drain electrode 2316b and can be formed by a sputtering method, a CVD method, an MBE method, an ALD method, or a PLD method.

Figure 30B:
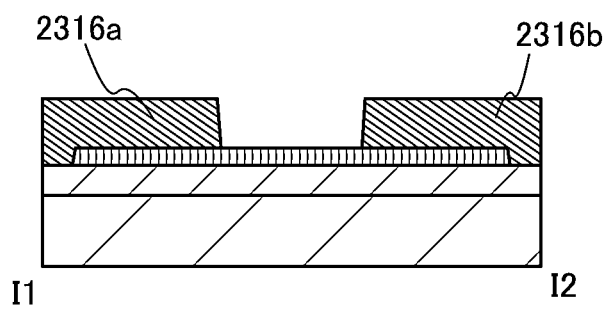

Next, the conductive film to be the source electrode 2316a and the drain electrode 2316b is processed to form the source electrode 2316a and the drain electrode 2316b (see FIG. 30B).

Figure 30C:
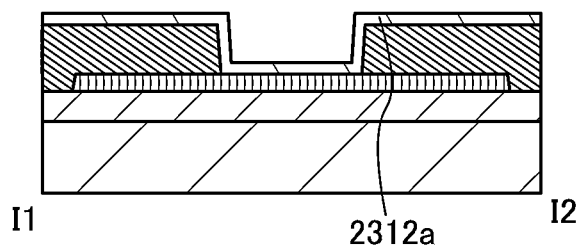

Next, the crystalline insulating film 2312a is formed (see FIG. 30C). The crystalline insulating film 2312a can be formed using an insulating film selected from the insulating films given as examples of the crystalline insulating film 2312a and can be formed by a sputtering method, a CVD method, a MBE method, an ALD method, or a PLD method. Note that it is preferred to employ a sputtering method because an insulating film having crystallinity and a high density is likely to be formed. Moreover, it is preferred to form the crystalline insulating film 2312a while the substrate is heated at a temperature higher than or equal to 100° C. and lower than or equal to 450° C. because an insulating film having crystallinity and a high density is likely to be formed.

Note that an eleventh heat treatment may be performed after the crystalline insulating film 2312a is formed. The eleventh heat treatment can be performed under the conditions shown in the first heat treatment. By the eleventh heat treatment, the crystallinity of the crystalline insulating film 2312a can be improved and impurities such as hydrogen and water can be removed.

Figure 31A:
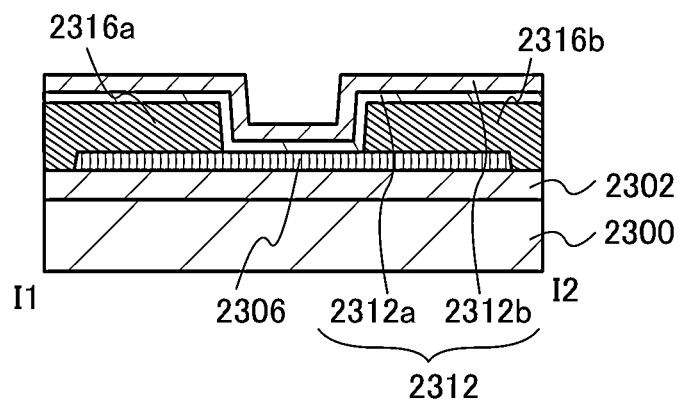
FIGS. 31A and 31B are cross-sectional views illustrating the example of the method for manufacturing the transistor illustrated in FIGS. 22A to 22C.

Next, the aluminum oxide film 2312b is formed (see FIG. 31A). The aluminum oxide film 2312b can be formed by a sputtering method, a CVD method, an MBE method, an ALD method, or a PLD method.

The aluminum oxide film 2312b is formed over the crystalline insulating film 2312a, whereby the aluminum oxide film 2312b having crystallinity and a high density can be formed. The aluminum oxide film 2312b having crystallinity and a high density is unlikely to transmit hydrogen, water, oxygen, and a metal element (particularly Cu). Thus, the aluminum oxide film 2312b serves as a barrier film against impurities which cause deterioration in electrical characteristics of the transistor.

Note that it is preferred to employ a sputtering method because the aluminum oxide film 2312b having crystallinity and a high density is likely to be formed over the crystalline insulating film 2312a. Moreover, it is preferred to form the aluminum oxide film 2312b while the substrate is heated at a temperature higher than or equal to 100° C. and lower than or equal to 450° C. because an insulating film having crystallinity and a high density is likely to be formed.

In this manner, the gate insulating film 2312 including the crystalline insulating film 2312a and the aluminum oxide film 2312b over the crystalline insulating film 2312a can be formed. Note that the gate insulating film 2312 is not limited to the structure including only the crystalline insulating film 2312a and the aluminum oxide film 2312b. For example, another insulating film may be provided below the crystalline insulating film 2312a or over the aluminum oxide film 2312b. The condition of an interface between the gate insulating film 2312 and the semiconductor film 2306 can be made favorable by providing, for example, a silicon oxide film below the crystalline insulating film 2312a.

Next, a conductive film to be the gate electrode 2304 is formed. The conductive film to be the gate electrode 2304 can be formed using a conductive film selected from the conductive films given as examples of the gate electrode 2304 and can be formed by a sputtering method, a CVD method, an MBE method, an ALD method, or a PLD method.

Figure 31B:
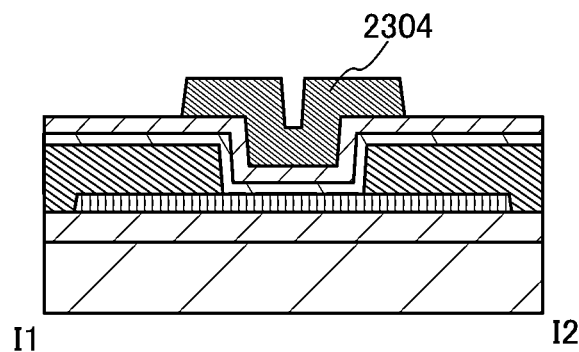

Next, the conductive film to be the gate electrode 2304 is processed to form the gate electrode 2304 (see FIG. 31B).

Next, a twelfth heat treatment may be performed. The twelfth heat treatment may be performed under conditions selected from conditions similar to those of the first heat treatment. By the twelfth heat treatment, when the semiconductor film 2306 is an oxide semiconductor film and the base insulating film 2302 contains excess oxygen, defects in the semiconductor film 2306 (oxygen vacancies in the oxide semiconductor film) can be reduced.

Through the above steps, the transistor illustrated in FIGS. 22A to 22C can be manufactured.

When the semiconductor film 2306 is an oxide semiconductor film, a transistor having stable electrical characteristics and high reliability can be provided by performing the ninth to twelfth heat treatments. Moreover, the gate insulating film 2312 serves as a barrier film against impurities which cause deterioration in electrical characteristics of the transistor. Thus, even in the case where diffusion of the impurities occurs, the ninth to twelfth heat treatments can prevent deterioration in electrical characteristics from being caused. However, one embodiment of the present invention is not limited to performing all of the ninth to twelfth heat treatments.

Next, a method for manufacturing the transistor illustrated in FIGS. 23A to 23C will be described with reference to FIGS. 32A to 32C and FIGS. 33A and 33B. Note that only cross-sectional views corresponding to FIG. 23B are shown for simplicity in FIGS. 32A to 32C and FIGS. 33A and 33B.

First, the substrate 2400 is prepared. As the substrate 2400, a substrate selected from the substrates given as examples of the substrate 2400 can be used.

Next, the base insulating film 2402 is formed. The base insulating film 2402 can be formed using an insulating film selected from the insulating films given as examples of the base insulating film 2402 and can be formed by a sputtering method, a CVD method, a MBE method, an ALD method, or a PLD method.

As the base insulating film 2402, for example, a silicon oxide film is preferred to be formed by an RF sputtering method under the following conditions: a quartz (preferably synthetic quartz) target is used; the substrate heating temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas. With such a method, the base insulating film 2402 can contain excess oxygen.

Next, a conductive film to be the source electrode 2416a and the drain electrode 2416b is formed. The conductive film to be the source electrode 2416a and the drain electrode 2416b can be formed using a conductive film selected from the conductive films given as examples of the source electrode 2416a and the drain electrode 2416b and can be formed by a sputtering method, a CVD method, an MBE method, an ALD method, or a PLD method.

Figure 32A:
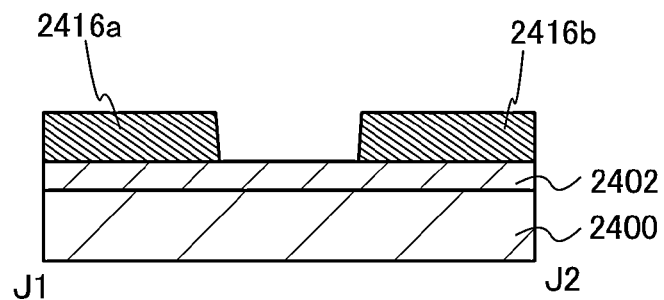
FIGS. 32A to 32C are cross-sectional views illustrating an example of a method for manufacturing the transistor illustrated in FIGS. 23A to 23C.

Next, the conductive film to be the source electrode 2416a and the drain electrode 2416b is processed to form the source electrode 2416a and the drain electrode 2416b (see FIG. 32A).

Next, a semiconductor film to be the semiconductor film 2406 is formed. The semiconductor film to be the semiconductor film 2406 can be formed using a semiconductor film selected from the semiconductor films given as examples of the semiconductor film 2406 and can be formed by a sputtering method, a CVD method, an MBE method, an ALD method, or a PLD method. The semiconductor film to be the semiconductor film 2406 is preferred to be formed using an oxide semiconductor film by a sputtering method. Note that it is preferred to employ a sputtering method because an oxide semiconductor film having crystallinity and a high density is likely to be formed. Moreover, it is preferred to form the oxide semiconductor film while the substrate is heated at a temperature higher than or equal to 100° C. and lower than or equal to 450° C. because an oxide semiconductor film having crystallinity and a high density is likely to be formed.

Note that a thirteenth heat treatment may be performed after the oxide semiconductor film is formed. The thirteenth heat treatment can be performed under the conditions shown in the first heat treatment. By the thirteenth heat treatment, the crystallinity of the oxide semiconductor film can be improved and further impurities such as hydrogen and water can be removed from the oxide semiconductor film.

Figure 32B:
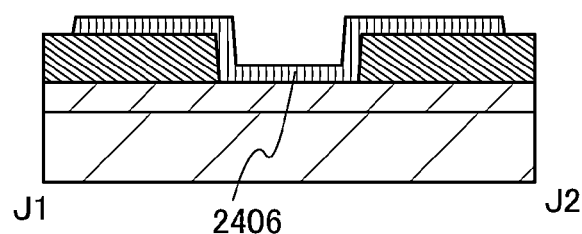

Next, the semiconductor film to be the semiconductor film 2406 is processed into an island shape to form the semiconductor film 2406 (see FIG. 32B).

Note that when the semiconductor film 2406 is an oxide semiconductor film, a fourteenth heat treatment may be performed after the semiconductor film 2406 is formed. The fourteenth heat treatment can be performed under the conditions shown in the first heat treatment. By the fourteenth heat treatment, which is performed with the side surfaces of the oxide semiconductor film exposed, impurities such as hydrogen and water are likely to be removed from the side surfaces of the oxide semiconductor film and thus the impurities can be effectively removed. Moreover, impurities such as hydrogen and water that exist at the interface between the base insulating film 2402 and the semiconductor film 2406 can also be removed. Note that when the oxide semiconductor film is a CAAC-OS film, impurities diffuse easily along a layer of crystal; thus, impurities such as hydrogen and water are further likely to be removed form the side surfaces.

Figure 32C:
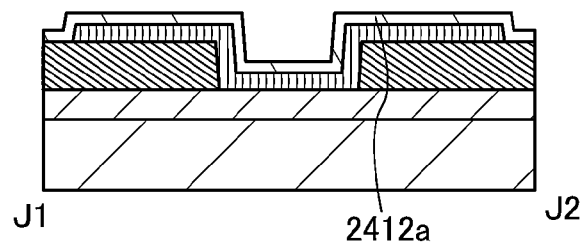

Next, the crystalline insulating film 2412a is formed (see FIG. 32C). The crystalline insulating film 2412a can be formed using an insulating film selected from the insulating films given as examples of the crystalline insulating film 2412a and can be formed by a sputtering method, a CVD method, a MBE method, an ALD method, or a PLD method. Note that it is preferred to employ a sputtering method because an insulating film having crystallinity and a high density is likely to be formed. Moreover, it is preferred to form the crystalline insulating film 2412a while the substrate is heated at a temperature higher than or equal to 100° C. and lower than or equal to 450° C. because an insulating film having crystallinity and a high density is likely to be formed.

Note that a fifteenth heat treatment may be performed after the crystalline insulating film 2412a is formed. The fifteenth heat treatment can be performed under the conditions shown in the first heat treatment. By the fifteenth heat treatment, the crystallinity of the crystalline insulating film 2412a can be improved and impurities such as hydrogen and water can be removed.

Figure 33A:
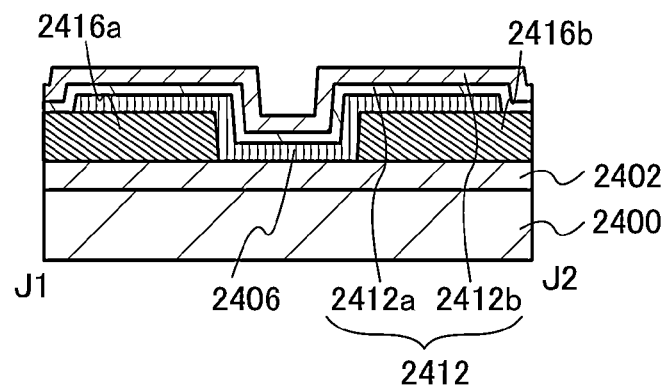
FIGS. 33A and 33B are cross-sectional views illustrating the example of the method for manufacturing the transistor illustrated in FIGS. 23A to 23C.

Next, the aluminum oxide film 2412b is formed (see FIG. 33A). The aluminum oxide film 2412b can be formed by a sputtering method, a CVD method, an MBE method, an ALD method, or a PLD method.

The aluminum oxide film 2412b is formed over the crystalline insulating film 2412a, whereby the aluminum oxide film 2412b having crystallinity and a high density can be formed. The aluminum oxide film 2412b having crystallinity and a high density is unlikely to transmit hydrogen, water, oxygen, and a metal element (particularly Cu). Thus, the aluminum oxide film 2412b serves as a bather film against impurities which cause deterioration in electrical characteristics of the transistor.

Note that it is preferred to employ a sputtering method because the aluminum oxide film 2412b having crystallinity and a high density is likely to be formed over the crystalline insulating film 2412a. Moreover, it is preferred to form the aluminum oxide film 2412b while the substrate is heated at a temperature higher than or equal to 100° C. and lower than or equal to 450° C. because an insulating film having crystallinity and a high density is likely to be formed.

In this manner, the gate insulating film 2412 including the crystalline insulating film 2412a and the aluminum oxide film 2412b over the crystalline insulating film 2412a can be formed. Note that the gate insulating film 2412 is not limited to the structure including only the crystalline insulating film 2412a and the aluminum oxide film 2412b. For example, another insulating film may be provided below the crystalline insulating film 2412a or over the aluminum oxide film 2412b. The condition of an interface between the gate insulating film 2412 and the semiconductor film 2406 can be made favorable by providing, for example, a silicon oxide film below the crystalline insulating film 2412a.

Next, a conductive film to be the gate electrode 2404 is formed. The conductive film to be the gate electrode 2404 can be formed using a conductive film selected from the conductive films given as examples of the gate electrode 2404 and can be formed by a sputtering method, a CVD method, an MBE method, an ALD method, or a PLD method.

Figure 33B:
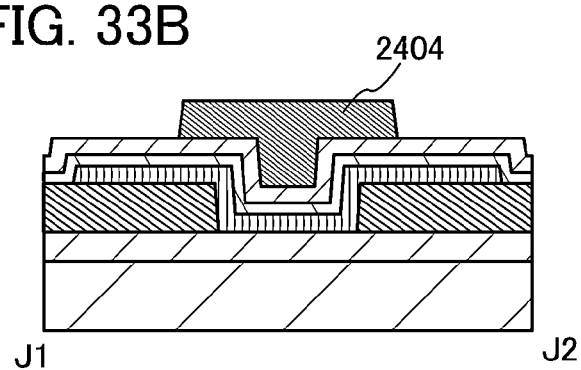

Next, the conductive film to be the gate electrode 2404 is processed to form the gate electrode 2404 (see FIG. 33B).

Next, a sixteenth heat treatment may be performed. The sixteenth heat treatment may be performed under conditions selected from conditions similar to those of the first heat treatment. By the sixteenth heat treatment, when the semiconductor film 2406 is an oxide semiconductor film and the base insulating film 2402 contains excess oxygen, defects in the semiconductor film 2406 (oxygen vacancies in the oxide semiconductor film) can be reduced.

Through the above steps, the transistor illustrated in FIGS. 23A to 23C can be manufactured.

When the semiconductor film 2406 is an oxide semiconductor film, a transistor having stable electrical characteristics and high reliability can be provided by performing the thirteenth to sixteenth heat treatments. Moreover, the gate insulating film 2412 serves as a barrier film against impurities which cause deterioration in electrical characteristics of the transistor. Thus, even in the case where diffusion of the impurities occurs, the thirteenth to sixteenth heat treatments can prevent deterioration in electrical characteristics from being caused. However, one embodiment of the present invention is not limited to performing all of the thirteenth to sixteenth heat treatments.

Next, a method for manufacturing the transistor illustrated in FIGS. 24A to 24C will be described with reference to FIGS. 34A to 34C and FIGS. 35A and 35B. Note that only cross-sectional views corresponding to FIG. 24B are shown for simplicity in FIGS. 34A to 34C and FIGS. 35A and 35B.

First, the substrate 2500 is prepared. As the substrate 2500, a substrate selected from the substrates given as examples of the substrate 2500 can be used.

Next, the base insulating film 2502 is formed. The base insulating film 2502 can be formed using an insulating film selected from the insulating films given as examples of the base insulating film 2502 and can be formed by a sputtering method, a CVD method, a MBE method, an ALD method, or a PLD method.

As the base insulating film 2502, for example, a silicon oxide film is preferred to be formed by an RF sputtering method under the following conditions: a quartz (preferably synthetic quartz) target is used; the substrate heating temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas. With such a method, the base insulating film 2502 can contain excess oxygen.

Next, a semiconductor film to be the semiconductor film 2506 is formed. The semiconductor film to be the semiconductor film 2506 can be formed using a semiconductor film selected from the semiconductor films given as examples of the semiconductor film 2506 and can be formed by a sputtering method, a CVD method, an MBE method, an ALD method, or a PLD method. The semiconductor film to be the semiconductor film 2506 is preferred to be formed using an oxide semiconductor film by a sputtering method. Note that it is preferred to employ a sputtering method because an oxide semiconductor film having crystallinity and a high density is likely to be formed. Moreover, it is preferred to form the oxide semiconductor film while the substrate is heated at a temperature higher than or equal to 100° C. and lower than or equal to 450° C. because an oxide semiconductor film having crystallinity and a high density is likely to be formed.

Note that a seventeenth heat treatment may be performed after the oxide semiconductor film is formed. The seventeenth heat treatment can be performed under the conditions shown in the first heat treatment. By the seventeenth heat treatment, the crystallinity of the oxide semiconductor film can be improved and further impurities such as hydrogen and water can be removed from the oxide semiconductor film.

Figure 34A:
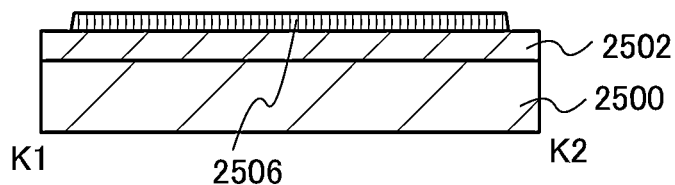
FIGS. 34A to 34C are cross-sectional views illustrating an example of a method for manufacturing the transistor illustrated in FIGS. 24A to 24C.

Next, the semiconductor film to be the semiconductor film 2506 is processed into an island shape to form the semiconductor film 2506 (see FIG. 34A).

Note that when the semiconductor film 2506 is an oxide semiconductor film, an eighteenth heat treatment may be performed after the semiconductor film 2506 is formed. The eighteenth heat treatment can be performed under the conditions shown in the first heat treatment. By the eighteenth heat treatment, which is performed with the side surfaces of the oxide semiconductor film exposed, impurities such as hydrogen and water are likely to be removed from the side surfaces of the oxide semiconductor film and thus the impurities can be effectively removed. Moreover, impurities such as hydrogen and water that exist at the interface between the base insulating film 2502 and the semiconductor film 2506 can also be removed. Note that when the oxide semiconductor film is a CAAC-OS film, impurities diffuse easily along a layer of crystal; thus, impurities such as hydrogen and water are further likely to be removed form the side surfaces.

Figure 34B:
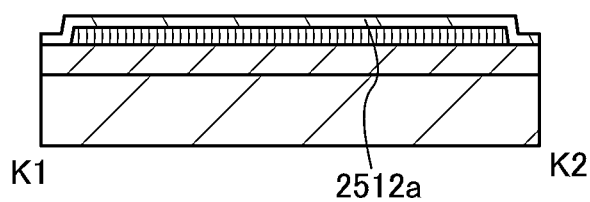

Next, the crystalline insulating film 2512a is formed (see FIG. 34B). The crystalline insulating film 2512a can be formed using an insulating film selected from the insulating films given as examples of the crystalline insulating film 2512a and can be formed by a sputtering method, a CVD method, a MBE method, an ALD method, or a PLD method. Note that it is preferred to employ a sputtering method because an insulating film having crystallinity and a high density is likely to be formed. Moreover, it is preferred to form the crystalline insulating film 2512a while the substrate is heated at a temperature higher than or equal to 100° C. and lower than or equal to 450° C. because an insulating film having crystallinity and a high density is likely to be formed.

Note that a ninteenth heat treatment may be performed after the crystalline insulating film 2512a is formed. The ninteenth heat treatment can be performed under the conditions shown in the first heat treatment. By the ninteenth heat treatment, the crystallinity of the crystalline insulating film 2512a can be improved and impurities such as hydrogen and water can be removed.

Figure 34C:
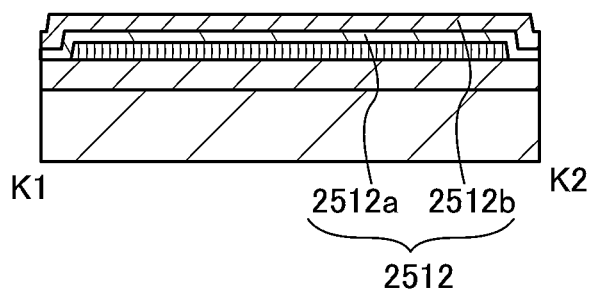

Next, the aluminum oxide film 2512b is formed (see FIG. 34C). The aluminum oxide film 2512b can be formed by a sputtering method, a CVD method, an MBE method, an ALD method, or a PLD method.

The aluminum oxide film 2512b is formed over the crystalline insulating film 2512a, whereby the aluminum oxide film 2512b having crystallinity and a high density can be formed. The aluminum oxide film 2512b having crystallinity and a high density is unlikely to transmit hydrogen, water, oxygen, and a metal element (particularly Cu). Thus, the aluminum oxide film 2512b serves as a barrier film against impurities which cause deterioration in electrical characteristics of the transistor.

Note that it is preferred to employ a sputtering method because the aluminum oxide film 2512b having crystallinity and a high density is likely to be formed over the crystalline insulating film 2512a. Moreover, it is preferred to form the aluminum oxide film 2512b while the substrate is heated at a temperature higher than or equal to 100° C. and lower than or equal to 450° C. because an insulating film having crystallinity and a high density is likely to be formed.

In this manner, the gate insulating film 2512 including the crystalline insulating film 2512a and the aluminum oxide film 2512b over the crystalline insulating film 2512a can be formed. Note that the gate insulating film 2512 is not limited to the structure including only the crystalline insulating film 2512a and the aluminum oxide film 2512b. For example, another insulating film may be provided below the crystalline insulating film 2512a or over the aluminum oxide film 2512b. The condition of an interface between the gate insulating film 2512 and the semiconductor film 2506 can be made favorable by providing, for example, a silicon oxide film below the crystalline insulating film 2512a.

Next, a conductive film to be the gate electrode 2504 is formed. The conductive film to be the gate electrode 2504 can be formed using a conductive film selected from the conductive films given as examples of the gate electrode 2504 and can be formed by a sputtering method, a CVD method, an MBE method, an ALD method, or a PLD method.

Figure 35A:
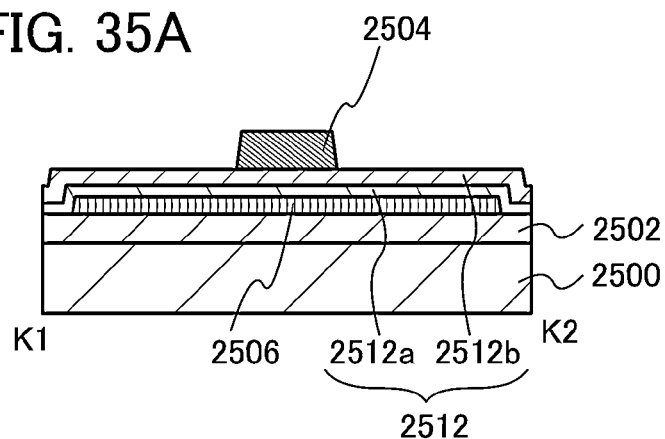
FIGS. 35A and 35B are cross-sectional views illustrating the example of the method for manufacturing the transistor illustrated in FIGS. 24A to 24C.

Next, the conductive film to be the gate electrode 2504 is processed to form the gate electrode 2504 (see FIG. 35A).

Next, an impurity may be added to the semiconductor film 2506 using the gate electrode 2504 as a mask. As the impurity, an impurity selected from the impurities that reduce the resistance of the semiconductor film 2506 may be added. Note that in the case where the semiconductor film 2506 is an oxide semiconductor film, as the impurity, one or more of helium, boron, nitrogen, fluorine, neon, aluminum, phosphorus, argon, arsenic, krypton, indium, tin, antimony, and xenon can be added. The impurity may be added by an ion implantation method or an ion doping method, preferably, an ion implantation method. At this time, the acceleration voltage is made higher than or equal to 5 kV and lower than or equal to 100 kV. The amount of the added impurity is made greater than or equal to $1\times10^{14}$ ions/cm$^2$ and less than or equal to $1\times10^{16}$ ions/cm$^2$.

Next, a twentieth heat treatment may be performed. The twentieth heat treatment may be performed under conditions selected from conditions similar to those of the first heat treatment. By the twentieth heat treatment, a region of the semiconductor film 2506, to which an impurity is added, can be made a low-resistant region. When the semiconductor film 2506 is an oxide semiconductor film and the base insulating film 2502 contains excess oxygen, defects in the semiconductor film 2506 (oxygen vacancies in the oxide semiconductor film) can be reduced.

Next, the protective insulating film 2518 is formed. The protective insulating film 2518 can be formed using an insulating film selected from the insulating films given as examples of the protective insulating film 2518 and can be formed by a sputtering method, a CVD method, an MBE method, an ALD method, or a PLD method.

Next, the protective insulating film 2518 is processed to form openings exposing the semiconductor film 2506.

Next, a conductive film to be the wiring 2524a and the wiring 2524b is formed. The conductive film to be the wiring 2524a and the wiring 2524b can be formed using a conductive film selected from the conductive films given as examples of the wiring 2524a and the wiring 2524b and can be formed by a sputtering method, a CVD method, an MBE method, an ALD method, or a PLD method.

Figure 35B:
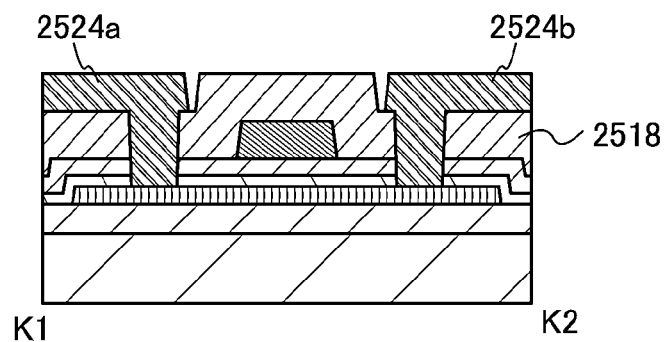

Next, the conductive film to be the wiring 2524a and the wiring 2524b is processed to form the wiring 2524a and the wiring 2524b (see FIG. 35B).

Through the above steps, the transistor illustrated in FIGS. 24A to 24C can be manufactured.

When the semiconductor film 2506 is an oxide semiconductor film, a transistor having stable electrical characteristics and high reliability can be provided by performing the seventeenth to twentieth heat treatments. Moreover, the gate insulating film 2512 serves as a barrier film against impurities which cause deterioration in electrical characteristics of the transistor. Thus, even in the case where diffusion of the impurities occurs, the seventeenth to twentieth heat treatments can prevent deterioration in electrical characteristics from being caused. However, one embodiment of the present invention is not limited to performing all of the seventeenth to twentieth heat treatments.

Next, a method for manufacturing the transistor illustrated in FIGS. 25A to 25C will be described with reference to FIGS. 36A to 36C and FIGS. 37A to 37C. Note that only cross-sectional views corresponding to FIG. 25B are shown for simplicity in FIGS. 36A to 36C and FIGS. 37A to 37C.

First, the substrate 2600 is prepared. As the substrate 2600, a substrate selected from the substrates given as examples of the substrate 2600 can be used.

Next, the base insulating film 2602 is formed. The base insulating film 2602 can be formed using an insulating film selected from the insulating films given as examples of the base insulating film 2602 and can be formed by a sputtering method, a CVD method, a MBE method, an ALD method, or a PLD method.

As the base insulating film 2602, for example, a silicon oxide film is preferred to be formed by an RF sputtering method under the following conditions: a quartz (preferably synthetic quartz) target is used; the substrate heating temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas. With such a method, the base insulating film 2602 can contain excess oxygen.

Next, a semiconductor film to be the semiconductor film 2606 is formed. The semiconductor film to be the semiconductor film 2606 can be formed using a semiconductor film selected from the semiconductor films given as examples of the semiconductor film 2606 and can be formed by a sputtering method, a CVD method, an MBE method, an ALD method, or a PLD method. The semiconductor film to be the semiconductor film 2606 is preferred to be formed using an oxide semiconductor film by a sputtering method. Note that it is preferred to employ a sputtering method because an oxide semiconductor film having crystallinity and a high density is likely to be formed. Moreover, it is preferred to form the oxide semiconductor film while the substrate is heated at a temperature higher than or equal to 100° C. and lower than or equal to 450° C. because an oxide semiconductor film having crystallinity and a high density is likely to be formed.

Note that a twenty-first heat treatment may be performed after the oxide semiconductor film is formed. The twenty-first heat treatment can be performed under the conditions shown in the first heat treatment. By the twenty-first heat treatment, the crystallinity of the oxide semiconductor film can be improved and further impurities such as hydrogen and water can be removed from the oxide semiconductor film.

Figure 36A:
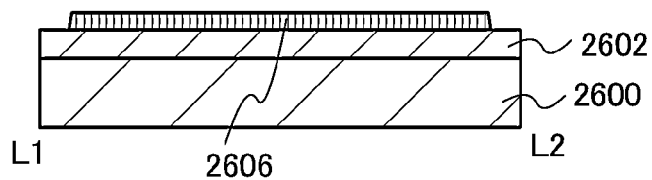
FIGS. 36A to 36C are cross-sectional views illustrating an example of a method for manufacturing the transistor illustrated in FIGS. 25A to 25C.

Next, the semiconductor film to be the semiconductor film 2606 is processed into an island shape to form the semiconductor film 2606 (see FIG. 36A).

Note that when the semiconductor film 2606 is an oxide semiconductor film, a twenty-second heat treatment may be performed after the semiconductor film 2606 is formed. The twenty-second heat treatment can be performed under the conditions shown in the first heat treatment. By the twenty-second heat treatment, which is performed with the side surfaces of the oxide semiconductor film exposed, impurities such as hydrogen and water are likely to be removed from the side surfaces of the oxide semiconductor film and thus the impurities can be effectively removed. Moreover, impurities such as hydrogen and water that exist at the interface between the base insulating film 2602 and the semiconductor film 2606 can also be removed. Note that when the oxide semiconductor film is a CAAC-OS film, impurities diffuse easily along a layer of crystal; thus, impurities such as hydrogen and water are further likely to be removed form the side surfaces.

Next, the crystalline insulating film 2613a is formed. The crystalline insulating film 2613a can be formed using an insulating film selected from the insulating films given as examples of the crystalline insulating film 2612a and can be formed by a sputtering method, a CVD method, a MBE method, an ALD method, or a PLD method. Note that it is preferred to employ a sputtering method because an insulating film having crystallinity and a high density is likely to be formed. Moreover, it is preferred to form the crystalline insulating film 2613a while the substrate is heated at a temperature higher than or equal to 100° C. and lower than or equal to 450° C. because an insulating film having crystallinity and a high density is likely to be formed.

Note that a twenty-third heat treatment may be performed after the crystalline insulating film 2613a is formed. The twenty-third heat treatment can be performed under the conditions shown in the first heat treatment. By the twenty-third heat treatment, the crystallinity of the crystalline insulating film 2613a can be improved and impurities such as hydrogen and water can be removed.

Figure 36B:
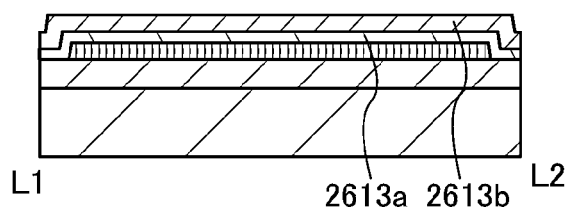

Next, the aluminum oxide film 2613b is formed (see FIG. 36B). The aluminum oxide film 2613b can be formed by a sputtering method, a CVD method, an MBE method, an ALD method, or a PLD method.

The aluminum oxide film 2613b is formed over the crystalline insulating film 2613a, whereby the aluminum oxide film 2613b having crystallinity and a high density can be formed. The aluminum oxide film 2613b having crystallinity and a high density is unlikely to transmit hydrogen, water, oxygen, and a metal element (particularly Cu). Thus, the aluminum oxide film 2613b serves as a barrier film against impurities which cause deterioration in electrical characteristics of the transistor.

Note that it is preferred to employ a sputtering method because the aluminum oxide film 2613b having crystallinity and a high density is likely to be formed over the crystalline insulating film 2613a. Moreover, it is preferred to form the aluminum oxide film 2613b while the substrate is heated at a temperature higher than or equal to 100° C. and lower than or equal to 450° C. because an insulating film having crystallinity and a high density is likely to be formed.

Next, a conductive film to be the gate electrode 2604 is formed. The conductive film to be the gate electrode 2604 can be formed using a conductive film selected from the conductive films given as examples of the gate electrode 2604 and can be formed by a sputtering method, a CVD method, an MBE method, an ALD method, or a PLD method.

Next, the conductive film to be the gate electrode 2604 is processed to form the gate electrode 2604.

Figure 36C:
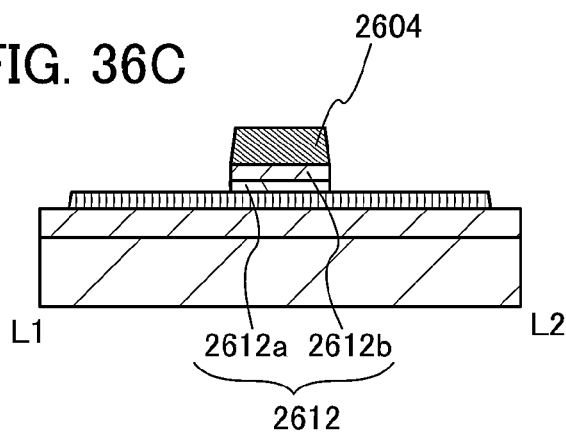

Next, the crystalline insulating film 2612a and the aluminum oxide film 2612b are formed by processing the crystalline insulating film 2613a and the aluminum oxide film 2613b using a resist mask used for forming the gate electrode 2604 or the gate electrode 2604 as a mask (see FIG. 36C).

In this manner, the gate insulating film 2612 including the crystalline insulating film 2612a and the aluminum oxide film 2612b over the crystalline insulating film 2612a can be formed. Note that the gate insulating film 2612 is not limited to the structure including only the crystalline insulating film 2612a and the aluminum oxide film 2612b. For example, another insulating film may be provided below the crystalline insulating film 2612a or over the aluminum oxide film 2612b. The condition of an interface between the gate insulating film 2612 and the semiconductor film 2606 can be made favorable by providing, for example, a silicon oxide film below the crystalline insulating film 2612a.

Next, an impurity may be added to the semiconductor film 2606 using the gate electrode 2604 as a mask (this step is also referred to as a first impurity addition step). As the impurity, an impurity selected from the impurities that reduce the resistance of the semiconductor film 2606 may be added. Note that in the case where the semiconductor film 2606 is an oxide semiconductor film, as the impurity, one or more of helium, boron, nitrogen, fluorine, neon, aluminum, phosphorus, argon, arsenic, krypton, indium, tin, antimony, and xenon can be added. The impurity may be added by an ion implantation method or an ion doping method, preferably, an ion implantation method. At this time, the acceleration voltage is made higher than or equal to 5 kV and lower than or equal to 100 kV.

The amount of the added impurity is made greater than or equal to $1\times10^{14}$ ions/cm$^2$ and less than or equal to $1\times10^{16}$ ions/cm$^2$.

Next, an insulating film to be the sidewall insulating film 2610 is formed. The insulating film to be the sidewall insulating film 2610 can be formed using an insulating film selected from the insulating films given as examples of the sidewall insulating film 2610 and can be formed by a sputtering method, a CVD method, an MBE method, an ALD method, or a PLD method. Next, a highly anisotropic etching treatment is performed on the insulating film to be the sidewall insulating film 2610, whereby the sidewall insulating film 2610 which are in contact with side surfaces of the gate insulating film 2612 and the gate electrode 2604 can be formed (see FIG. 37A).

Next, an impurity may be added to the semiconductor film 2606 using the gate electrode 2604 and the sidewall insulating film 2610 as masks (this step is also referred to as a second impurity addition step). The conditions of the first impurity addition step can be referred to for the second impurity addition step. Two kinds of low-resistance regions can be provided in the semiconductor film 2606 by performing the first impurity addition step and the second impurity addition step. Therefore, electric-field concentration at an edge of the drain electrode is likely to be relieved and hot-carrier degradation can be effectively suppressed. Moreover, the edge of the source electrode has less influence of the electric field from the edge of the drain electrode; therefore, DIBL can be suppressed. Note that either one of the first impurity addition step and the second impurity addition step may be performed.

Next, a twenty-fourth heat treatment may be performed. The twenty-fourth heat treatment may be performed under conditions selected from conditions similar to those of the first heat treatment. By the twenty-fourth heat treatment, a region of the semiconductor film 2606, to which an impurity is added, can be made a low-resistant region. When the semiconductor film 2606 is an oxide semiconductor film and the base insulating film 2602 contains excess oxygen, defects in the semiconductor film 2606 (oxygen vacancies in the oxide semiconductor film) can be reduced.

Next, a conductive film to be the source electrode 2616a and the drain electrode 2616b is formed. The conductive film to be the source electrode 2616a and the drain electrode 2616b can be formed using a conductive film selected from the conductive films given as examples of the source electrode 2616a and the drain electrode 2616b and can be formed by a sputtering method, a CVD method, an MBE method, an ALD method, or a PLD method.

Figure 37A:
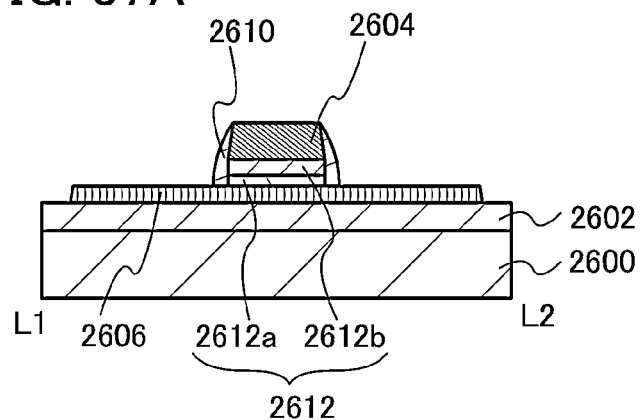
FIGS. 37A to 37C are cross-sectional views illustrating the example of the method for manufacturing the transistor illustrated in FIGS. 25A to 25C.
Figure 37B:
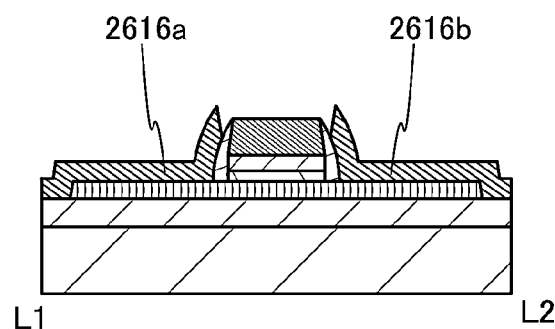

Next, the conductive film to be the source electrode 2616a and the drain electrode 2616b is processed to form the source electrode 2616a and the drain electrode 2616b (see FIG. 37B).

Next, the protective insulating film 2618 is formed. The protective insulating film 2618 can be formed using an insulating film selected from the insulating films given as examples of the protective insulating film 2618 and can be formed by a sputtering method, a CVD method, an MBE method, an ALD method, or a PLD method.

Next, the protective insulating film 2618 is processed to form openings exposing the source electrode 2616a and the drain electrode 2616b.

Next, a conductive film to be the wiring 2624a and the wiring 2624b is formed. The conductive film to be the wiring 2624a and the wiring 2624b can be formed using a conductive film selected from the conductive films given as examples of the wiring 2624a and the wiring 2624b and can be formed by a sputtering method, a CVD method, an MBE method, an ALD method, or a PLD method.

Figure 37C:
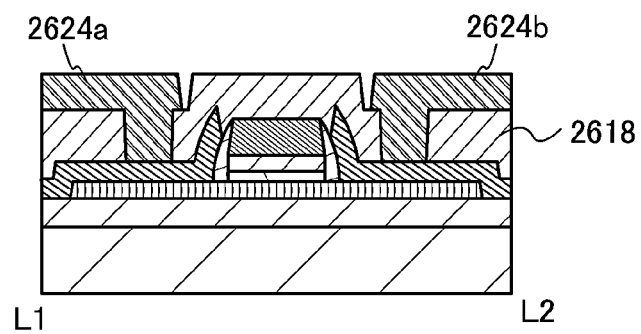

Next, the conductive film to be the wiring 2624a and the wiring 2624b is processed to form the wiring 2624a and the wiring 2624b (see FIG. 37C).

Through the above steps, the transistor illustrated in FIGS. 25A to 25C can be manufactured.

When the semiconductor film 2606 is an oxide semiconductor film, a transistor having stable electrical characteristics and high reliability can be provided by performing the twenty-first to twenty-fourth heat treatments. Moreover, the gate insulating film 2612 serves as a barrier film against impurities which cause deterioration in electrical characteristics of the transistor. Thus, even in the case where diffusion of the impurities occurs, the twenty-first to twenty-fourth heat treatments can prevent deterioration in electrical characteristics from being caused. However, one embodiment of the present invention is not limited to performing all of the twenty-first to twenty-fourth heat treatments.

According to this embodiment, since a gate insulating film has a high barrier property against impurities and contains fewer defects, a transistor having stable electric characteristics and high reliability can be provided.

This embodiment is obtained by performing change, addition, modification, removal, application, superordinate conceptualization, or subordinate conceptualization on part or the whole of another embodiment. Thus, part or whole of this embodiment can be freely combined with, applied to, or replaced with part or all of another embodiment.

[Embodiment 5]

In this embodiment, a semiconductor device including the transistor described in any of the above embodiments, in which an oxide semiconductor film is used as a semiconductor film, will be described.

The off-state current of the transistor described in any of the above embodiments can be significantly reduced when an oxide semiconductor film is used as the semiconductor film. That is, the transistor has electrical characteristics in which leakage of charge through the transistor is unlikely to occur.

A semiconductor device including the transistor having such electrical characteristics and having a memory element which is functionally superior to a known memory element will be described below.

Figure 38A:
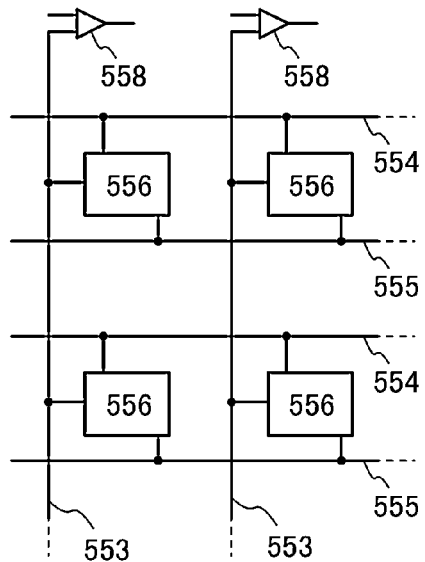
FIGS. 38A to 38D are circuit diagrams and a cross-sectional view illustrating a semiconductor device of one embodiment of the present invention, and a graph showing electrical characteristics thereof.
Figure 38B:
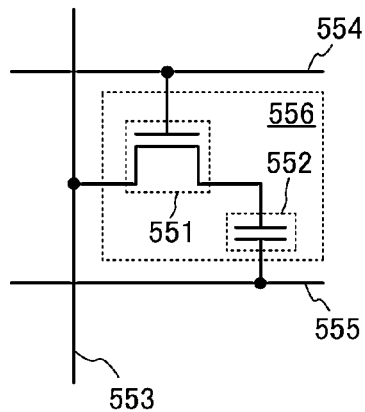
Figure 38C:
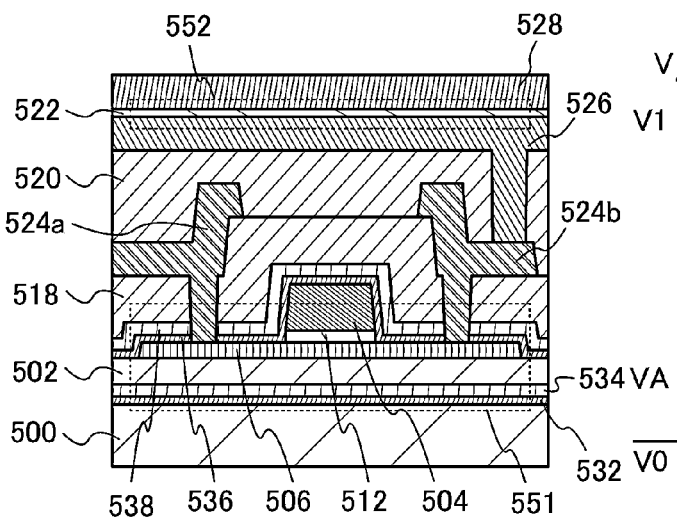
Figure 38D:
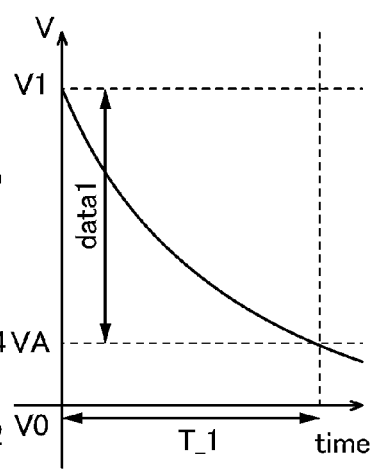

First, the semiconductor device is specifically described with reference to FIGS. 38A to 38D. Note that FIG. 38A is a circuit diagram illustrating a memory cell array in the semiconductor device. FIG. 38B is a circuit diagram of the memory cell. FIG. 38C shows an example of a cross-sectional structure corresponding to the memory cell in FIG. 38B. FIG. 38D is a graph showing electrical characteristics of the memory cell in FIG. 38B.

The memory cell array in FIG. 38A includes a plurality of memory cells 556, a plurality of bit lines 553, a plurality of word lines 554, a plurality of capacitor lines 555, and a plurality of sense amplifiers 558.

Note that the bit lines 553 and the word lines 554 are arranged in grid patterns, and each memory cell 556 is provided at an intersection of the bit line 553 and the word line 554. The bit line 553 is connected to the sense amplifier 558, and the sense amplifier 558 has a function of reading a potential of the bit line 553 as data.

It is seen from FIG. 38B that the memory cell 556 includes a transistor 551 and a capacitor 552. A gate of the transistor 551 is electrically connected to the word line 554. A source of the transistor 551 is electrically connected to the bit line 553. A drain of the transistor 551 is electrically connected to one terminal of the capacitor 552. The other terminal of the capacitor 552 is electrically connected to the capacitor line 555.

FIG. 38C shows an example of a cross-sectional structure of the memory cell. FIG. 38C is a cross-sectional view of the semiconductor device including the transistor 551; the wiring 524a and the wiring 524b connected to the transistor 551; an insulating film 520 provided over the transistor 551, and the wiring 524a and the wiring 524b; and a capacitor 552 provided over the insulating film 520.

Note that in FIG. 38C, the transistor illustrated in FIGS. 5A to 5C is used as the transistor 551. Therefore, for components of the transistor 551, which are not particularly mentioned below, the description in the above embodiments is referred to. The case where an oxide semiconductor film is used as the semiconductor film 506 of the transistor 551 is described below.

Figure 39:
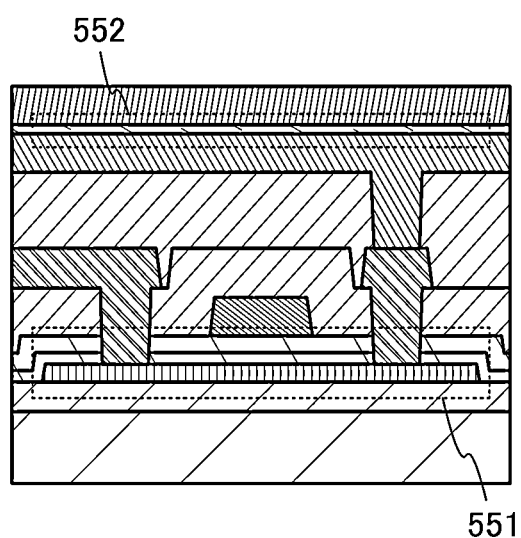
FIG. 39 is a cross-sectional view of a semiconductor device of one embodiment of the present invention.

Note that in FIG. 39, the transistor illustrated in FIGS. 24A to 24C is used as a transistor 551. Therefore, for components of the transistor 551, which are not particularly mentioned below, the description in the above embodiments can be referred to. The case where an oxide semiconductor film is used as the semiconductor film 2506 of the transistor 551 is described below. However, the transistor that can be applied to the transistor 551 is not limited to the transistor illustrated in FIGS. 5A to 5C and the transistor illustrated in FIGS. 24A to 24C.

The insulating film 520 can be provided using methods and an insulating film which are similar to those of the protective insulating film 518. Alternatively, a resin film of a polyimide resin, an acrylic resin, an epoxy resin, a silicone resin, or the like may be used as the insulating film 520.

The capacitor 552 includes an electrode 526 in contact with the wiring 524b, an electrode 528 overlapping with the electrode 526, and an insulating film 522 provided between the electrode 526 and the electrode 528.

The electrode 526 can be formed to have a single-layer or a stacked-layer structure of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

The electrode 528 can be formed to have a single-layer or a stacked-layer structure of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

The insulating film 522 can be formed to have a single-layer or a stacked-layer structure of an insulating film containing one or more of the following: aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

Note that although FIG. 38C shows an example where the transistor 551 and the capacitor 552 are provided in different layers, one embodiment of the present invention is not limited to this structure. For example, the transistor 551 and the capacitor 552 may be provided in the same layer. With such a structure, over the memory cell, a memory cell having a similar structure can be stacked. By stacking a plurality of memory cells, the plurality of memory cells can be integrated in the area of one memory cell. Accordingly, the degree of integration of the semiconductor device can be increased.

Here, the wiring 524a in FIG. 38C is electrically connected to the bit line 553 in FIG. 38B. The gate electrode 504 in FIG. 38C is electrically connected to the word line 554 in FIG. 38B. Further, the electrode 528 in FIG. 38C is electrically connected to the capacitor line 555 in FIG. 38B.

As shown in FIG. 38D, voltage held in the capacitor 552 is gradually decreased over time due to leakage through the transistor 551. A voltage originally charged from V0 to V1 is decreased with time to VA that is a limit for reading out data 1. This period is called a holding period T_1. In the case of a two-level memory cell, refresh operation needs to be performed within the holding period T_1.

For example, in the case where the off-state current of the transistor 551 is not small enough, a voltage held in the capacitor 552 over time changes significantly; therefore, the holding period T_1 becomes short. Thus, refresh operation needs to be performed frequently. When the frequency of refresh operation is increased, power consumption is increased.

In this embodiment, the off-state current of the transistor 551 is extremely small; therefore, the holding period T_1 can be made extremely long. That is, frequency of refresh operation can be reduced, which results in reduction in power consumption. For example, when a memory cell includes the transistor 551 having an off-state current of $1 \times 10^{-21}$ A to $1 \times 10^{-25}$ A, data can be held for several days to several decades without supply of power.

As described above, according to one embodiment of the present invention, a semiconductor device with high degree of integration and low power consumption can be obtained.

Figure 40A:
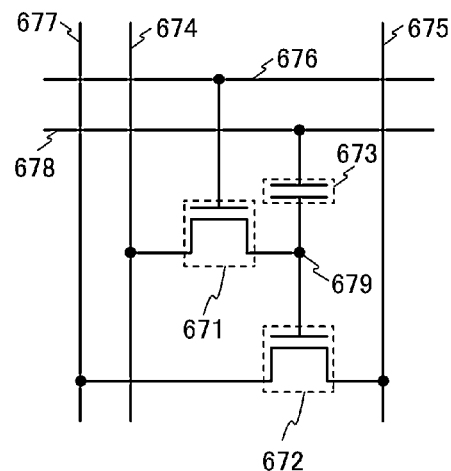
FIGS. 40A to 40C are a circuit diagram and a cross-sectional view illustrating a semiconductor device of one embodiment of the present invention, and a graph showing electrical characteristics thereof.
Figure 40B:
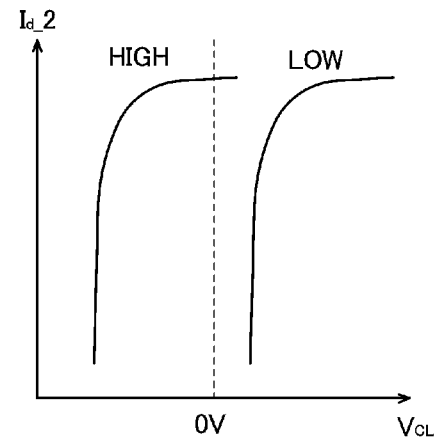
Figure 40C:
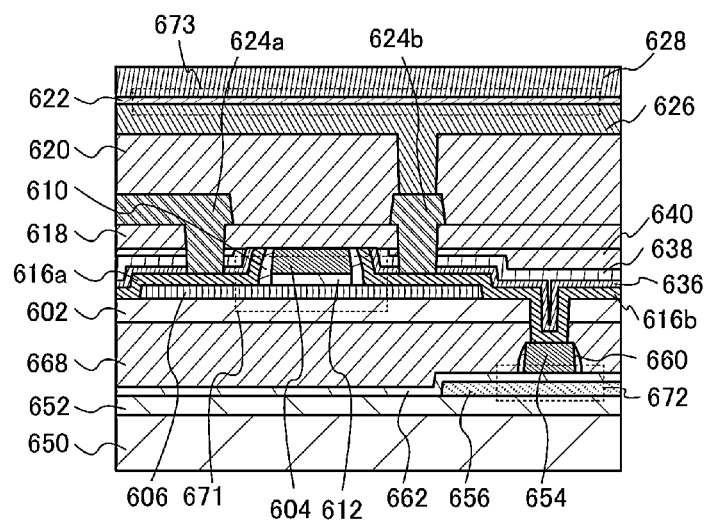

Next, a semiconductor device having a structure different from that of the semiconductor device in FIGS. 38A to 38D is described with reference to FIGS. 40A to 40C. Note that FIG. 40A is a circuit diagram of a memory cell and wirings included in the semiconductor device. FIG. 40B is a graph showing electrical characteristics of the memory cell in FIG. 40A. FIG. 40C shows an example of a cross-sectional structure corresponding to the memory cell in FIG. 40A.

It is seen from FIG. 40A that the memory cell includes a transistor 671, a transistor 672, and a capacitor 673. Here, a gate of the transistor 671 is electrically connected to a word line 676. A source of the transistor 671 is electrically connected to a source line 674. A drain of the transistor 671 is electrically connected to a gate of the transistor 672 and one terminal of the capacitor 673, and this connection portion is referred to as a node 679. A source of the transistor 672 is electrically connected to a source line 675. A drain of the transistor 672 is electrically connected to a drain line 677. The other terminal of the capacitor 673 is electrically connected to a capacitor line 678.

The semiconductor device illustrated in FIGS. 40A to 40C utilizes variation in the apparent threshold voltage of the transistor 672, which depends on the potential of the node 679. For example, FIG. 40B shows a relation between a voltage $V_{CL}$ of the capacitor line 678 and a drain current $I_{d\_2}$ flowing through the transistor 672.

The potential of the node 679 can be controlled through the transistor 671. For example, the potential of the source line 674 is set to a power supply potential VDD. In this case, when the potential of the word line 676 is set to be higher than or equal to a potential obtained by adding the power supply potential VDD to the threshold voltage Vth of the transistor 671, the potential of the node 679 can be HIGH. Further, when the potential of the word line 676 is set to be lower than or equal to the threshold voltage Vth of the transistor 671, the potential of the node 679 can be LOW.

Thus, the electrical characteristics of the transistor 672 is either a $V_{CL}$-$I_{d\_}2$ curve denoted as LOW or a $V_{CL}$-$I_{d\_}2$ curve denoted as HIGH. That is, when the potential of the node 679 is LOW, $I_{d\_}2$ is small at a $V_{CL}$ of 0 V; accordingly, data 0 is stored. Further, when the potential of the node 679 is HIGH, $I_{d\_}2$ is large at a $V_{CL}$ of 0 V; accordingly, data 1 is stored. In this manner, data can be stored.

FIG. 40C shows an example of a cross-sectional structure of the memory cell. FIG. 40C is a cross-sectional view of the semiconductor device including the transistor 672; an insulating film 668 provided over the transistor 672; the transistor 671 provided over the insulating film 668; the wiring 624*a* and the wiring 624*b* connected to the transistor 671; an insulating film 620 provided over the transistor 671, and the wiring 624*a* and the wiring 624*b*; and a capacitor 673 provided over the insulating film 620.

The description of the protective insulating film 118 is referred to for the insulating film 620. Alternatively, a resin film of a polyimide resin, an acrylic resin, an epoxy resin, a silicone resin, or the like may be used as the insulating film 620.

Note that in FIG. 40C, the transistor illustrated in FIGS. 6A to 6C is used as the transistor 671. Therefore, for components of the transistor 671, which are not particularly mentioned below, the description in the above embodiments is referred to. The case where an oxide semiconductor film is used as the semiconductor film 606 of the transistor 671 is described below.

Figure 41:
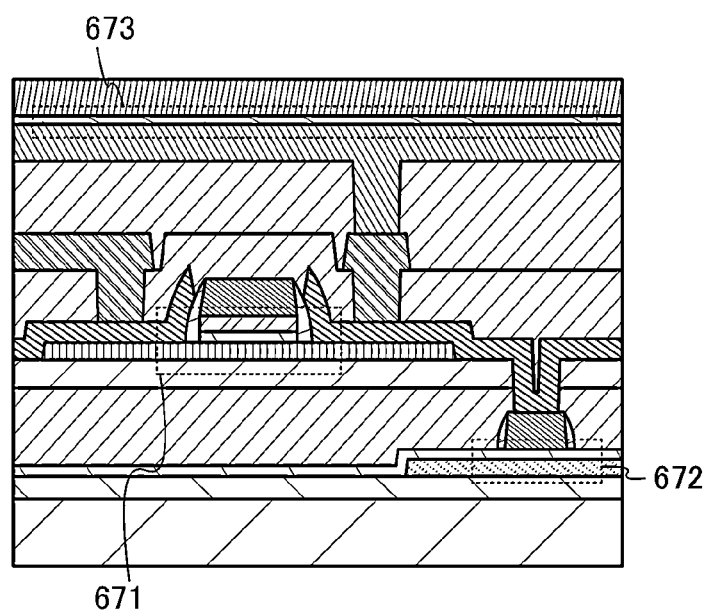
FIG. 41 is a cross-sectional view of a semiconductor device of one embodiment of the present invention.

Note that in FIG. 41, the transistor illustrated in FIGS. 25A to 25C is used as a transistor 671. Therefore, for components of the transistor 671, which are not particularly mentioned below, the description in the above embodiments can be referred to. The case where an oxide semiconductor film is used as the semiconductor film 2606 of the transistor 671 is described below. However, the transistor that can be applied to the transistor 671 is not limited to the transistor illustrated in FIGS. 6A to 6C and the transistor illustrated in FIGS. 25A to 25C.

In this embodiment, the case where a transistor including crystalline silicon is used as the transistor 672 will be described. Note that any of the transistors described in the above embodiments may be used for the transistor 672.

The transistor including crystalline silicon has an advantage over the transistor including an oxide semiconductor film in that on-state characteristics can be easily improved. Thus, it can be said that the transistor including crystalline silicon is suitable for the transistor 672 for which excellent on-state characteristics are required.

Here, the transistor 672 includes a base insulating film 652 provided over a substrate 650; a crystalline silicon film 656 provided over the base insulating film 652; a gate insulating film 662 provided over the crystalline silicon film 656; a gate electrode 654 which is over the gate insulating film 662 and provided so as to overlap with the crystalline silicon film 656; and a sidewall insulating film 660 in contact with a side surface of the gate electrode 654.

The description of the substrate 100 is referred to for the substrate 650.

The description of the base insulating film 302 is referred to for the base insulating film 652.

A silicon film such as a single crystal silicon film or a polycrystalline silicon film can be used as the crystalline silicon film 656.

Note that the crystalline silicon film is used for the transistor 672 in this embodiment; however, in the case where the substrate 650 is a semiconductor substrate such as a silicon wafer, the transistor 672 may include a channel region, and a source region and a drain region in the semiconductor substrate.

The gate insulating film 662 can be formed to have a single-layer or a stacked-layer structure of an insulating film containing one or more of the following: aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

The description of the gate electrode 104 is referred to for the gate electrode 654.

The sidewall insulating film 660 can be formed to have a single-layer or a stacked-layer structure of an insulating film containing one or more of the following: aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

The description of the protective insulating film 118 is referred to for the insulating film 668. Alternatively, a resin film of a polyimide resin, an acrylic resin, an epoxy resin, a silicone resin, or the like may be used as the insulating film 668.

The insulating film 668 and the base insulating film 602 include an opening reaching the gate electrode 654 of the transistor 672. The drain electrode 616*b* of the transistor 671 is in contact with the gate electrode 654 of the transistor 672 through the opening.

The capacitor 673 includes an electrode 626 in contact with the wiring 624*b*, an electrode 628 overlapping with the electrode 626, and an insulating film 622 provided between the electrode 626 and the electrode 628.

The description of the electrode 526 is referred to for the electrode 626.

The description of the electrode 528 is referred to for the electrode 628.

Here, the wiring 624*a* in FIG. 40C is electrically connected to the source line 674 in FIG. 40A. The gate electrode 604 in FIG. 40C is electrically connected to the word line 676 in FIG. 40A. Further, the electrode 628 in FIG. 40C is electrically connected to the capacitor line 678 in FIG. 40A.

Note that although FIG. 40C shows an example where the transistor 671 and the capacitor 673 are provided in different layers, one embodiment of the present invention is not limited to this structure. For example, the transistor 671 and the capacitor 673 may be provided in the same layer. With such a structure, over the memory cell, a memory cell having a similar structure can be stacked. By stacking a plurality of memory cells, the plurality of memory cells can be integrated in the area of one memory cell. Accordingly, the degree of integration of the semiconductor device can be increased.

Here, when any of the transistors including an oxide semiconductor film described in the above embodiments is used as the transistor 671, leakage of charge held in the node 679, which occurs through the transistor 671, can be suppressed because the off-state current of the transistor 671 is extremely small. Therefore, data can be held for a long period. Further, high voltage is not needed in data writing; therefore, power consumption can be made small and operation speed can be made high compared to a flash memory.

As described above, according to one embodiment of the present invention, a semiconductor device with high degree of integration and low power consumption can be obtained.

This embodiment is obtained by performing change, addition, modification, removal, application, superordinate conceptualization, or subordinate conceptualization on part or the whole of another embodiment. Thus, part or whole of this embodiment can be freely combined with, applied to, or replaced with part or all of another embodiment.

[Embodiment 6]

A central processing unit (CPU) can be formed with the use of any of the transistors described in the above embodiments or any of the semiconductor devices described in the above embodiment for at least part of the CPU.

Figure 42A:
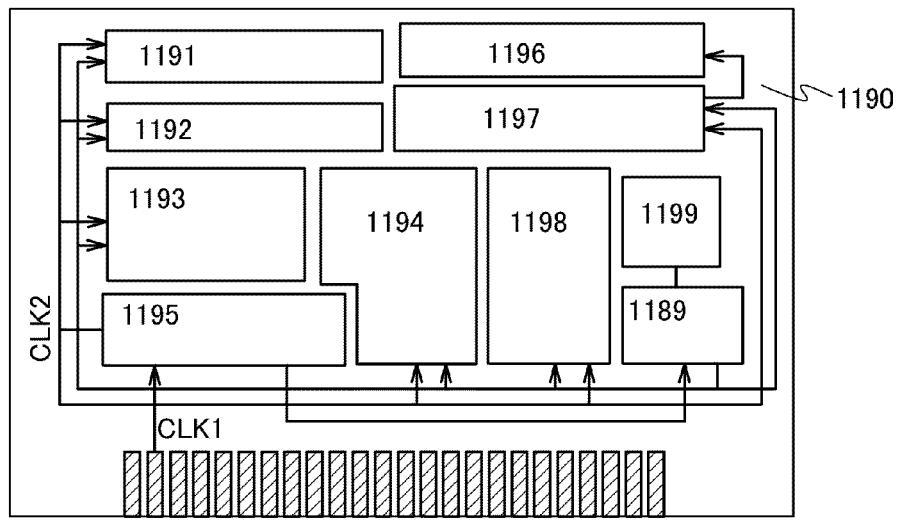
FIGS. 42A to 42C are block diagrams illustrating a structure of a CPU of one embodiment of the present invention.

FIG. 42A is a block diagram illustrating a specific structure of the CPU. The CPU illustrated in FIG. 42A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 42A is just an example in which a configuration is simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 42A, a memory element is provided in the register 1196. As the register 1196, any of the semiconductor devices described in the above embodiment can be used.

In the CPU illustrated in FIG. 42A, the register controller 1197 selects operation of holding data in the register 1196 in accordance with an instruction from the ALU 1191. That is, the register controller 1197 selects whether data is retained by a flip flop or a capacitor in the memory element included in the register 1196. When data is held by the flip flop, a power supply voltage is supplied to the memory element in the register 1196. When data is held by the capacitor, the data in the capacitor is rewritten, and supply of the power supply voltage to the memory element in the register 1196 can be stopped.

Figure 42B:
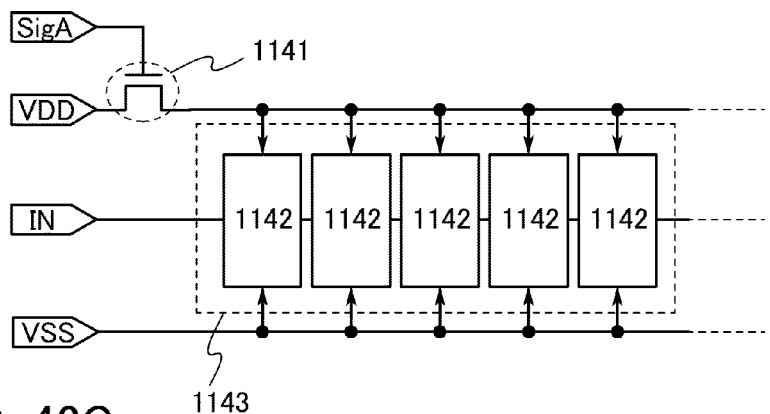
Figure 42C:
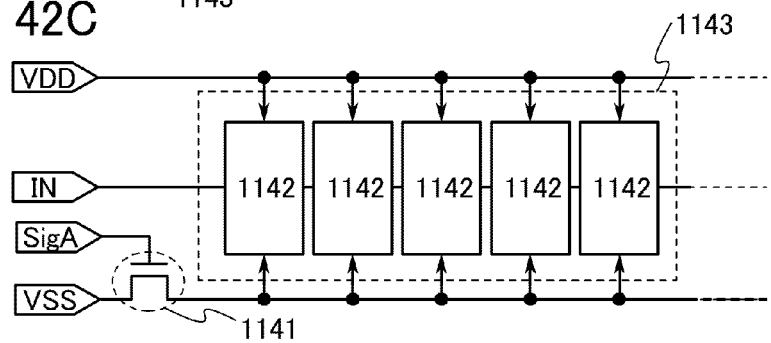

The power supply can be stopped by providing a switching element between a memory element group and a node to which a power supply potential VDD or a power supply potential VSS is supplied, as illustrated in FIG. 42B or 42C. Circuits illustrated in FIGS. 42B and 42C are described below.

FIGS. 42B and 42C each show an example of a structure including any of the transistors described in the above embodiments as a switching element for controlling supply of a power supply potential to a memory element.

The memory device illustrated in FIG. 42B includes a switching element 1141 and a memory element group 1143 including a plurality of memory elements 1142. Specifically, as each of the memory elements 1142, any of the semiconductor devices described in the above embodiment can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and a potential of the low-level power supply potential VSS.

In FIG. 42B, as the switching element 1141, any of the transistors described in the above embodiments is used. With the use of an oxide semiconductor film as the semiconductor film of the transistor, a transistor whose off-state current is extremely small can be obtained. The switching of the transistor is controlled by a signal SigA input to the gate thereof.

Note that although FIG. 42B shows the structure in which the switching element 1141 includes only one transistor; however, the switching element 1141 is not limited to one transistor and may include a plurality of transistors. In the case where the switching element 1141 includes a plurality of transistors which serves as switching elements, the plurality of transistors may be connected to each other in parallel, in series, or in combination of parallel connection and series connection.

FIG. 42C shows an example of a memory device in which each of the memory elements 1142 included in the memory element group 1143 is supplied with the low-level power supply potential VSS through the switching element 1141. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example here, the transistor and the semiconductor device can also be applied to an LSI such as a digital signal processor (DSP), a custom LSI, or a field programmable gate array (FPGA).

This embodiment is obtained by performing change, addition, modification, removal, application, superordinate conceptualization, or subordinate conceptualization on part or the whole of another embodiment. Thus, part or whole of this embodiment can be freely combined with, applied to, or replaced with part or all of another embodiment.

[Embodiment 7]

In this embodiment, a display device to which any of the transistors described in the above embodiments is applied will be described.

As a display element provided in the display device, a liquid crystal element (also referred to as a liquid crystal display element), a light-emitting element (also referred to as a light-emitting display element), or the like can be used. The light-emitting element includes, in its category, an element whose luminance is controlled by a current or a voltage, and specifically an inorganic electroluminescent (EL) element, an organic EL element, and the like. Furthermore, a display medium whose contrast is changed by an electric effect, such as electronic ink, can be used as the display element. In this embodiment, a display device including an EL element and a display device including a liquid crystal element will be described as examples of the display device.

Note that the display device in this embodiment includes in its category a panel in which a display element is sealed, and a module in which an IC such as a controller is mounted on the panel.

Additionally, the display device in this embodiment refers to an image display device, a display device, or a light source (including a lighting device). The display device includes any of the following modules in its category: a module provided with a connector such as an FPC or TCP; a module in which a printed wiring board is provided at the end of TCP; and a module in which an integrated circuit (IC) is mounted directly on a display element by a COG method.

Figure 43A:
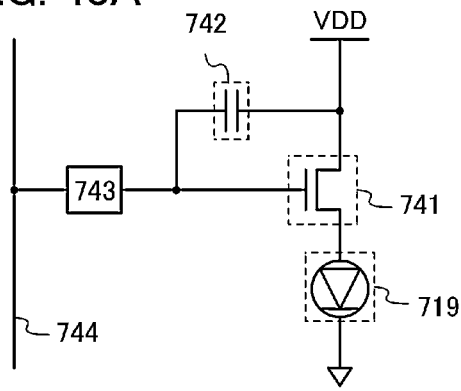
FIGS. 43A to 43C are a circuit diagram of a display device including an EL element of one embodiment of the present invention, a cross-sectional view of part of a pixel of the display device, and a cross-sectional view of a light-emitting layer in the pixel.

FIG. 43A is an example of a circuit diagram of the display device including an EL element.

The display device in FIG. 43A includes a switching element 743, a transistor 741, a capacitor 742, and a light-emitting element 719.

A gate of the transistor 741 is electrically connected to one terminal of the switching element 743 and one terminal of the capacitor 742. A source of the transistor 741 is electrically connected to one terminal of the light-emitting element 719. A drain of the transistor 741 is electrically connected to the other terminal of the capacitor 742 and is supplied with a power supply potential VDD. The other terminal of the switching element 743 is electrically connected to a signal line 744. The other terminal of the light-emitting element 719 is supplied with a fixed potential. Note that the fixed potential is a ground potential GND or lower.

Note that, as the transistor 741, any of the transistors described in the above embodiments is used. The transistor has stable electrical characteristics and high reliability. Therefore, a display device having stable display quality can be obtained.

As the switching element 743, it is preferred to use a transistor. With a transistor, the area of a pixel can be reduced, so that a display device having a high resolution can be obtained. Moreover, as the switching element 743, any of the transistors described in the above embodiments may be used. With the use of any of the transistors described in the above embodiments as the switching element 743, the switching element 743 can be formed in the same process as the transistor 741; thus, the productivity of the display device can be improved.

Figure 43B:
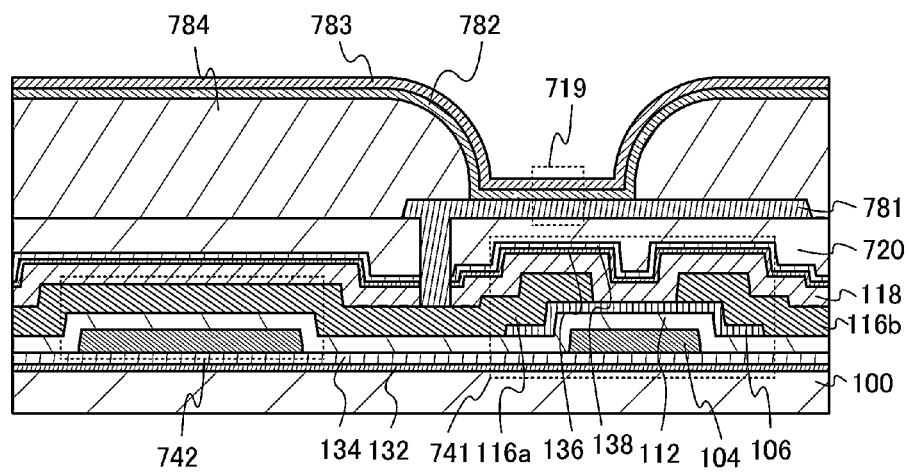

FIG. 43B illustrates part of a cross section of a pixel including the transistor 741, the capacitor 742, and the light-emitting element 719.

Note that FIG. 43B shows an example where the transistor 741 and the capacitor 742 are provided in the same plane. With such a structure, the capacitor 742 can be formed in the same layer and using the same conductive film as a gate electrode, a gate insulating film, and a source electrode (drain electrode), which are included in the transistor 741. When the transistor 741 and the capacitor 742 are provided in the same plane in this manner, the number of manufacturing steps of the display device can be reduced; thus, the productivity can be increased.

In FIG. 43B, the transistor illustrated in FIGS. 1A to 1C is used as the transistor 741. Therefore, for components of the transistor 741, which are not particularly mentioned below, the description in the above embodiments is referred to.

Figure 44:
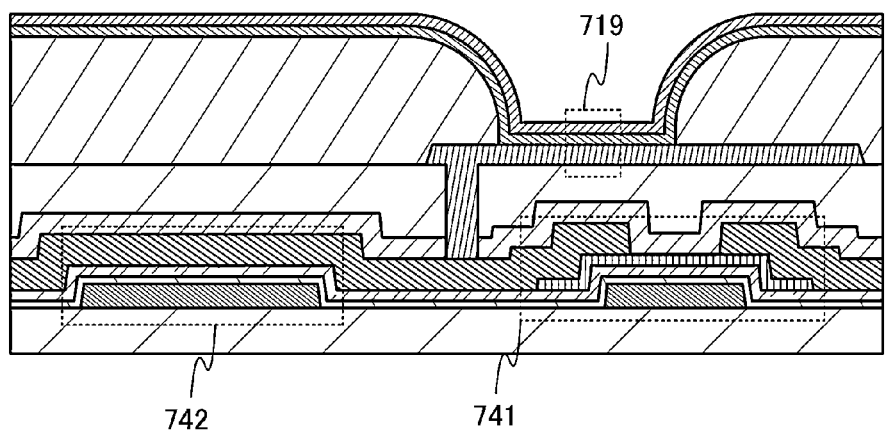
FIG. 44 is a cross-sectional view of part of a pixel of a display device including an EL element of one embodiment of the present invention.

In FIG. 44, the transistor illustrated in FIGS. 20A to 20C is used as a transistor 741. Therefore, for components of the transistor 741, which are not particularly mentioned below, the description in the above embodiments is referred to. However, the transistor that can be applied to the transistor 741 is not limited to the transistor illustrated in FIGS. 1A to 1C and the transistor illustrated in FIGS. 20A to 20C.

An insulating film 720 is provided over the transistor 741 and the capacitor 742.

Here, an opening reaching the source electrode 116a of the transistor 741 is provided in the insulating film 720 and the protective insulating film 118.

An electrode 781 is provided over the insulating film 720. The electrode 781 is in contact with the source electrode 116a of the transistor 741 through an opening provided in the protective insulating film 118, the crystalline insulating film 136, the aluminum oxide film 138, and the insulating film 720.

A partition 784 having an opening reaching the electrode 781 is provided over the electrode 781.

A light-emitting layer 782 in contact with the electrode 781 through the opening provided in the partition 784 is provided over the partition 784.

An electrode 783 is provided over the light-emitting layer 782.

A region where the electrode 781, the light-emitting layer 782, and the electrode 783 overlap with one another serves as the light-emitting element 719.

Note that description of the protective insulating film 118 is referred to for the insulating film 720. Alternatively, a resin film of a polyimide resin, an acrylic resin, an epoxy resin, a silicone resin, or the like may be used as the insulating film 720.

Figure 43C:
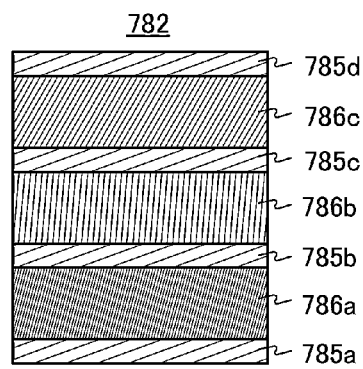

The light-emitting layer 782 is not limited to a single layer, and may be a stack of plural kinds of light-emitting materials. For example, a structure illustrated in FIG. 43C may be employed. FIG. 43C illustrates a structure in which an intermediate layer 785a, a light-emitting layer 786a, an intermediate layer 785b, a light-emitting layer 786b, an intermediate layer 785c, a light-emitting layer 786c, and an intermediate layer 785d are stacked in this order. In that case, when materials emitting light of appropriate colors are used for the light-emitting layer 786a, the light-emitting layer 786b, and the light-emitting layer 786c, the light-emitting element 719 with a high color rending property or higher emission efficiency can be formed.

Plural kinds of light-emitting materials may be stacked to obtain white light. Although not illustrated in FIG. 43B, white light may be extracted through coloring layers.

Although the structure in which three light-emitting layers and four intermediate layers are provided is shown here, the number of light-emitting layers and the number of intermediate layers can be changed as appropriate without being limited to the above. For example, the light-emitting layer 782 can be formed with only the intermediate layer 785a, the light-emitting layer 786a, the intermediate layer 785b, the light-emitting layer 786b, and the intermediate layer 785c. Alternatively, the light-emitting layer 782 may be formed with the intermediate layer 785a, the light-emitting layer 786a, the intermediate layer 785b, the light-emitting layer 786b, the light-emitting layer 786c, and the intermediate layer 785d; the intermediate layer 785c may be omitted.

Moreover, the intermediate layer can be formed using a stacked-layer structure of a hole-injection layer, a hole-transport layer, an electron-transport layer, an electron-injection layer, or the like. Note that not all of these layers need to be provided as the intermediate layer. Any of these layers may be selected as appropriate to form the intermediate layer. Note that layers having similar functions may be provided. Further, an electron-relay layer or the like may be added as appropriate as the intermediate layer, in addition to a carrier generation layer.

The electrode 781 can be formed using a conductive film having a transmitting property with respect to visible light. "Having a transmitting property with respect to visible light" means that the average transmittance of light in a visible light region (e.g., a wavelength range from 400 nm to 800 nm) is higher than or equal to 70%, particularly higher than or equal to 80%.

As the electrode 781, for example, an oxide film such as an In—Zn—W oxide film, an In—Sn oxide film, an In—Zn oxide film, an In oxide film, a Zn oxide film, or a Sn oxide film can be used. The above oxide film may contain a minute amount of Al, Ga, Sb, F, or the like. Further, a metal thin film having a thickness enough to transmit light (a metal thin film having a thickness of approximately 5 nm to 30 nm is preferred) can also be used. For example, an Ag film, an Mg film, or an Ag—Mg alloy film having a thickness of 5 nm may be used.

The electrode 781 is preferred to be a film which efficiently reflects visible light. For example, a film containing lithium, aluminum, titanium, magnesium, lanthanum, silver, silicon, or nickel can be used as the electrode 781.

The electrode 783 can be formed using any of the films for the electrode 781. Note that when the electrode 781 has a transmitting property with respect to visible light, it is preferred that the electrode 783 efficiently reflects visible light. When the electrode 781 efficiently reflects visible light, it is preferred that the electrode 783 has a transmitting property with respect to visible light.

Positions of the electrode 781 and the electrode 783 are not limited to the structure illustrated in FIG. 43B, and the electrode 781 and the electrode 783 may be replaced with each other. It is preferred to use a conductive film having a high work function for the electrode which serves as an anode and a conductive film having a low work function for the electrode which serves as a cathode. Note that in the case where a carrier generation layer is provided in contact with the anode, a variety of conductive films can be used for the anode regardless of their work functions.

Note that description of the protective insulating film 118 is referred to for the partition 784. Alternatively, a resin film of a polyimide resin, an acrylic resin, an epoxy resin, a silicone resin, or the like may be used as the partition 784.

The transistor 741 connected to the light-emitting element 719 has stable electrical characteristics and high reliability. Therefore, a display device having stable display quality can be obtained.

Next, the display device including a liquid crystal element is described.

Figure 45A:
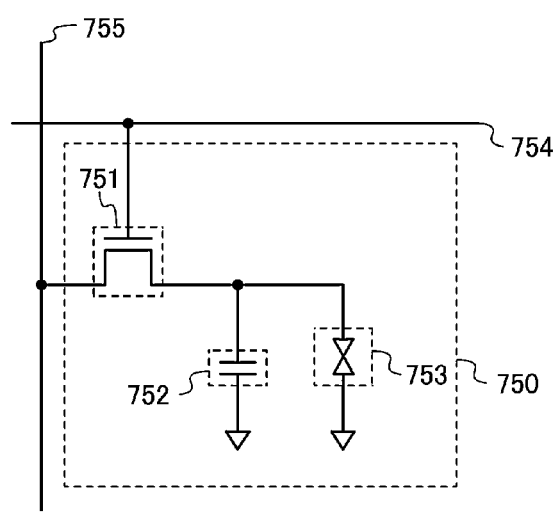
FIGS. 45A and 45B are a circuit diagram of a pixel of a display device including an EL element of one embodiment of the present invention and a cross-sectional view of the pixel.

FIG. 45A is a circuit diagram showing a structure example of the pixel of the display device including a liquid crystal element. A pixel 750 illustrated in FIG. 45A includes a transistor 751, a capacitor 752, and an element in which liquid crystal is filled between a pair of electrodes (hereinafter also referred to as a liquid crystal element) 753.

One of a source and a drain of the transistor 751 is electrically connected to a signal line 755, and a gate of the transistor 751 is electrically connected to a scan line 754.

One of electrodes of the capacitor 752 is electrically connected to the other of the source and the drain of the transistor 751, and the other of the electrodes of the capacitor 752 is electrically connected to a wiring for supplying a common potential.

One of electrodes of the liquid crystal element 753 is electrically connected to the other of the source and the drain of the transistor 751, and the other of the electrodes of the liquid crystal element 753 is electrically connected to a wiring for supplying a common potential. Note that the common potential supplied to the wiring electrically connected to the other of the electrodes of the liquid crystal element 753 may be different from the common potential supplied to the wiring electrically connected to the other of the electrodes of the capacitor 752.

Figure 45B:
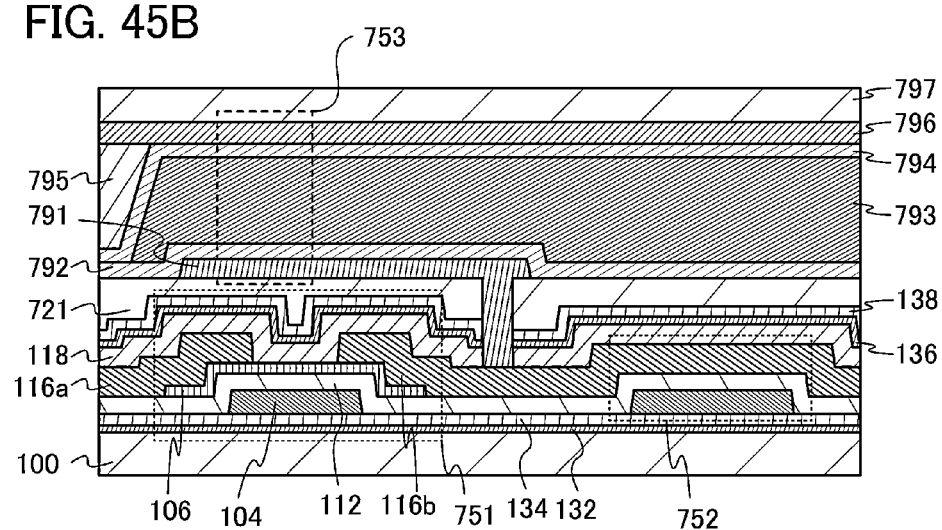

FIG. 45B illustrates part of a cross section of the pixel 750.

Note that FIG. 45B shows an example where the transistor 751 and the capacitor 752 are provided in the same plane. With such a structure, the capacitor 752 can be formed in the same layer and using the same conductive film as a gate electrode, a gate insulating film, and a source electrode (drain electrode), which are included in the transistor 751. When the transistor 751 and the capacitor 752 are provided in the same plane in this manner, the number of manufacturing steps of the display device can be reduced; thus, the productivity can be increased.

Note that, as the transistor 751, any of the transistors described in the above embodiments can be used. In FIG. 45B, the transistor illustrated in FIGS. 1A to 1C is used as the transistor 751. Therefore, for components of the transistor 751, which are not particularly mentioned below, the description in the above embodiments is referred to.

Figure 46:
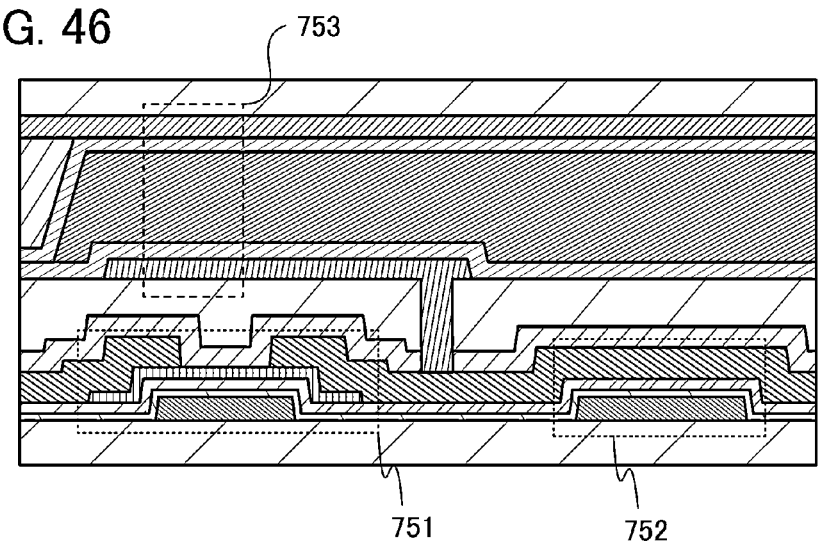
FIG. 46 is a cross-sectional view of a pixel of a display device including a liquid crystal element of one embodiment of the present invention.

In FIG. 46, the transistor illustrated in FIGS. 20A to 20C is used as a transistor 751. Therefore, for components of the transistor 751, which are not particularly mentioned below, the description in the above embodiments is referred to. However, the transistor that can be applied to the transistor 751 is not limited to the transistor illustrated in FIGS. 1A to 1C and the transistor illustrated in FIGS. 20A to 20C.

Note that in the case where an oxide semiconductor film is used as the semiconductor film 106 of the transistor 751, the off-state current of the transistor 751 can be made extremely small. Thus, the charge held in the capacitor 752 is unlikely to be leaked and a voltage applied to the liquid crystal element 753 can be retained for a long time. Accordingly, when a motion image with less movement or a still image is displayed, a voltage for operating the transistor 751 is not needed by turning off the transistor 751, whereby a display device with low power consumption can be obtained.

An insulating film 721 is provided over the transistor 751 and the capacitor 752.

Here, an opening reaching the source electrode 116b of the transistor 751 is provided in the protective insulating film 118, the crystalline insulating film 136, the aluminum oxide film 138, and the insulating film 721.

An electrode 791 is provided over the insulating film 721. The electrode 791 is in contact with the drain electrode 116b of the transistor 751 through the opening provided in the insulating film 721, the aluminum oxide film 138, the crystalline insulating film 136, and the protective insulating film 118.

An insulating film 792 serving as an alignment film is provided over the electrode 791.

A liquid crystal layer 793 is provided over the insulating film 792.

An insulating film 794 serving as an alignment film is provided over the liquid crystal layer 793.

A spacer 795 is provided over the insulating film 794.

An electrode 796 is provided over the spacer 795 and the insulating film 794.

A substrate 797 is provided over the electrode 796.

Note that description of the protective insulating film 118 is referred to for the insulating film 721. Alternatively, a resin film of a polyimide resin, an acrylic resin, an epoxy resin, a silicone resin, or the like may be used as the insulating film 721.

For the liquid crystal layer 793, a thermotropic liquid crystal, a low-molecular liquid crystal, a polymer liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Note that as the liquid crystal layer 793, a liquid crystal exhibiting a blue phase may be used. In that case, the insulating films 792 and 794 serving as an alignment film are not necessarily provided.

The electrode 791 can be formed using a conductive film having a transmitting property with respect to visible light.

As the electrode 791, for example, an oxide film such as an In—Zn—W oxide film, an In—Sn oxide film, an In—Zn oxide film, an In oxide film, a Zn oxide film, or a Sn oxide film can be used. The above oxide film may contain a minute amount of Al, Ga, Sb, F, or the like. Further, a metal thin film having a thickness enough to transmit light (a metal thin film having a thickness of approximately 5 nm to 30 nm is preferred) can also be used.

Alternatively, the electrode 791 is preferred to be a film which efficiently reflects visible light. For example, a film containing aluminum, titanium, chromium, copper, molybdenum, silver, tantalum, or tungsten can be used as the electrode 791.

The electrode 796 can be formed using any of the films for the electrode 791. Note that when the electrode 791 has a transmitting property with respect to visible light, it is in some cases preferred that the electrode 796 efficiently reflects visible light. When the electrode 791 efficiently reflects visible light, it is in some cases preferred that the electrode 796 has a transmitting property with respect to visible light.

Positions of the electrode 791 and the electrode 796 are not limited to the structure illustrated in FIG. 45B, and the electrode 791 and the electrode 796 may be replaced with each other.

Each of the insulating films 792 and 794 can be formed using an organic compound insulating film or an inorganic compound insulating film.

The spacer 795 can be formed using an organic compound insulating film or an inorganic compound insulating film. Note that the spacer 795 can have a variety of shapes such as a columnar shape and a spherical shape.

A region where the electrode 791, the insulating film 792, the liquid crystal layer 793, the insulating film 794, and the electrode 796 overlap with one another serves as the liquid crystal element 753.

For the substrate 797, a glass substrate, a resin substrate, a metal substrate, or the like can be used. The substrate 797 may have flexibility.

The transistor 751 connected to the liquid crystal element 753 has stable electrical characteristics and high reliability. Therefore, a display device having stable display quality can be obtained. Further, a display device with low power consumption can be provided with the use of an oxide semiconductor film as the semiconductor film 106 of the transistor 751.

This embodiment is obtained by performing change, addition, modification, removal, application, superordinate conceptualization, or subordinate conceptualization on part or the whole of another embodiment. Thus, part or whole of this embodiment can be freely combined with, applied to, or replaced with part or all of another embodiment.

[Embodiment 8]

In this embodiment, examples of an electronic device including any of the semiconductor devices described in the above embodiment will be described.

Figure 47A:
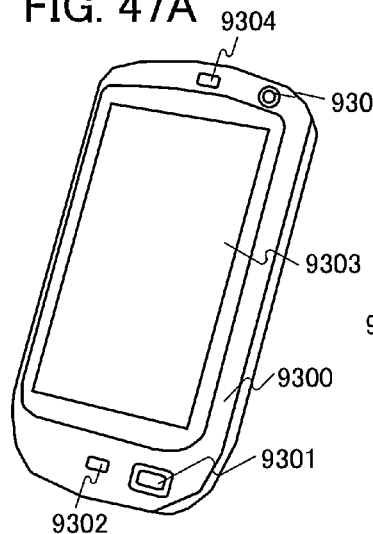
FIGS. 47A to 47D illustrate electronic devices of one embodiment of the present invention.

FIG. 47A illustrates a portable information terminal The portable information terminal illustrated in FIG. 47A includes a housing 9300, a button 9301, a microphone 9302, a display portion 9303, a speaker 9304, and a camera 9305, and has a function as a mobile phone. One embodiment of the present invention can be applied to an arithmetic unit, a wireless circuit, or a memory circuit in a main body. Alternatively, one embodiment of the present invention can be applied to the display portion 9303.

Figure 47B:
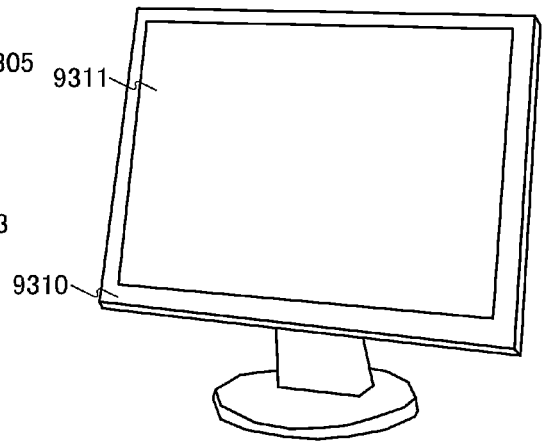

FIG. 47B illustrates a display. The display illustrated in FIG. 47B includes a housing 9310 and a display portion 9311. One embodiment of the present invention can be applied to an arithmetic unit, a wireless circuit, or a memory circuit in a main body. Alternatively, one embodiment of the present invention can be applied to the display portion 9311.

Figure 47C:
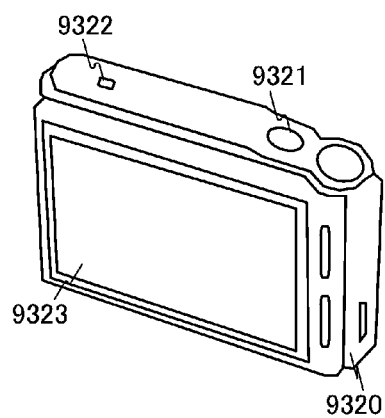

FIG. 47C illustrates a digital still camera. The digital still camera illustrated in FIG. 47C includes a housing 9320, a button 9321, a microphone 9322, and a display portion 9323. One embodiment of the present invention can be applied to an arithmetic unit, a wireless circuit, or a memory circuit in a main body. Alternatively, one embodiment of the present invention can be applied to the display portion 9323.

Figure 47D:
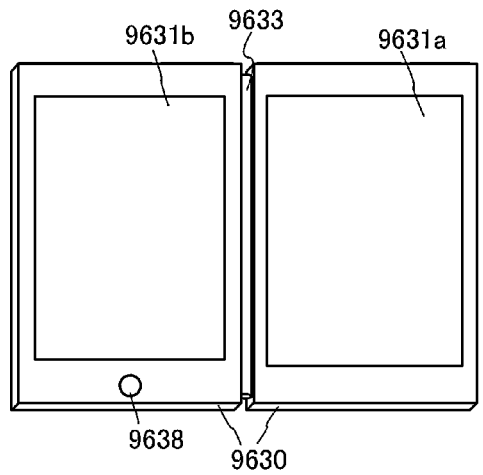

FIG. 47D illustrates a foldable portable information terminal. The foldable portable information terminal illustrated in FIG. 47D includes a housing 9630, a display portion 9631a, a display portion 9631b, a hinge 9633, and an operation switch 9638. One embodiment of the present invention can be applied to an arithmetic unit, a wireless circuit, or a memory circuit in a main body. Alternatively, one embodiment of the present invention can be applied to the display portion 9631a and the display portion 9631b.

Part or whole of the display portion 9631a and/or the display portion 9631b can function as a touch panel. By touching an operation key displayed on the touch panel, a user can input data, for example.

With the use of a semiconductor device according to one embodiment of the present invention, a highly reliable and high performance electronic device with low power consumption can be provided.

This embodiment is obtained by performing change, addition, modification, removal, application, superordinate conceptualization, or subordinate conceptualization on part or the whole of another embodiment. Thus, part or whole of this embodiment can be freely combined with, applied to, or replaced with part or all of another embodiment.

Note that in this specification and the like, in a diagram or a text described in one embodiment, it is possible to take out part of the diagram or the text and constitute one embodiment of the invention. Thus, in the case where a diagram or a text related to a certain portion is described, the context taken out from part of the diagram or the text is also disclosed as one embodiment of the invention, and one embodiment of the invention can be constituted. Consequently, for example, in a diagram or a text including one or more of active elements (e.g., transistors and diodes), wirings, passive elements (e.g., capacitors and resistors), conductive layers, insulating layers, semiconductor layers, organic materials, inorganic materials, components, devices, operation methods, manufacturing methods, and/or the like, it is possible to take out part of the diagram or the text and constitute one embodiment of the invention. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided.

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted.

EXAMPLE 1

In this example, an aluminum oxide film was formed over a crystalline insulating film, scanning transmission electron microscope (STEM) images were observed, and XRR was performed. As a comparative example, an aluminum oxide film was formed over an amorphous insulating film and similar evaluation was performed.

A method for manufacturing samples will be described below.

First, a silicon oxide film was formed over a glass substrate. The silicon oxide film was formed by a sputtering method to a thickness of 300 nm under the following conditions: a circle synthesized quartz target with a diameter of 12 inches was used; an argon gas with a flow rate of 25 sccm and an oxygen gas with a flow rate of 25 sccm were used; the power was 5 kW (13.56 MHz); the pressure was 0.4 Pa; the distance between the target and the substrate was 60 mm; and the substrate heating temperature was 100° C.

Next, a crystalline insulating film was formed. Here, in a sample 1, a zirconium oxide film to which yttrium oxide is added as a stabilizing material (such a zirconium oxide film is also referred to as yttria-stabilized zirconia film or a YSZ film) was formed. In a sample 2, a titanium oxide film was formed. Note that in a comparative sample, a crystalline insulating film was not formed.

Here, the YSZ film was formed by a sputtering method to a thickness of 100 nm under the following conditions: a circle YSZ target with a diameter of 6 inches ($ZrO_2$:$Y_2O_3$=92:8 [molar ratio]) was used; an argon gas with a flow rate of 20 sccm and an oxygen gas with a flow rate of 20 sccm were used; the power was 250 W (13.56 MHz); the pressure was 0.4 Pa; the distance between the target and the substrate was 135 mm; and substrate heating was not performed.

The titanium oxide film was formed by a sputtering method to a thickness of 100 nm under the following conditions: a circle titanium target with a diameter of 6 inches was used; an argon gas with a flow rate of 40 sccm was used; the power was 400 W (13.56 MHz); the pressure was 0.4 Pa; the distance between the target and the substrate was 150 mm; and substrate heating was not performed.

Next, in each sample, an aluminum oxide film was formed. The aluminum oxide film was formed by a sputtering method to a thickness of 100 nm under the following conditions: a circle aluminum oxide target with a diameter of 12 inches was used; an argon gas with a flow rate of 25 sccm and an oxygen gas with a flow rate of 25 sccm were used; the power was 2.5 kW (13.56 MHz); the pressure was 0.4 Pa; the distance between the target and the substrate was 60 mm; and the substrate heating temperature was 250° C.

Figure 48A:
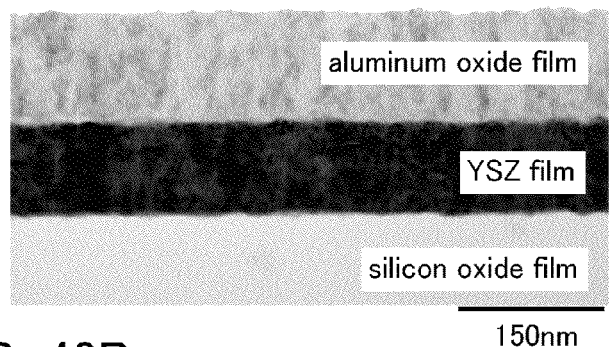
FIGS. 48A to 48C are cross-sectional TE images of each sample, which are observed by a scanning transmission electron microscope.
Figure 48B:
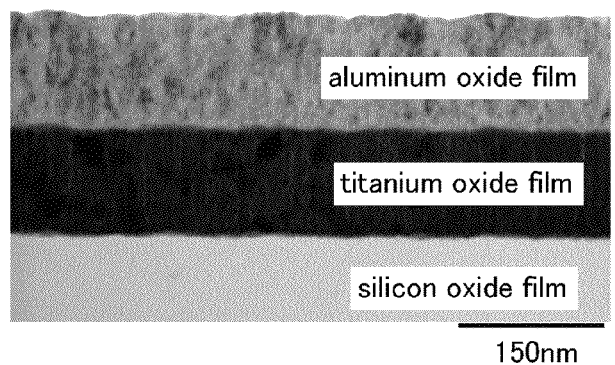
Figure 48C:
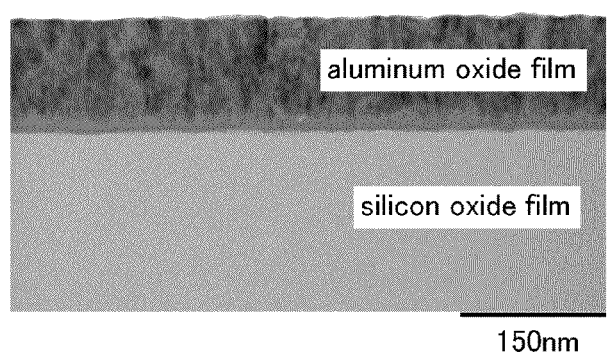

Cross-sectional STEM images of the sample 1, the sample 2, and the comparative sample which were formed in the above-described manner were observed. For the observation of the cross-sectional STEM images, an Ultra-thin Film Evaluation System HD-2300 manufactured by Hitachi High-Technologies Corporation was used. Note that the magnification was 200000 times. FIG. 48A shows a phase contrast image (also referred to as transmitted electron (TE) image) of the sample 1, FIG. 48B shows a TE image of the sample 2, and FIG. 48C shows a TE image of the comparative sample.

It was found from FIG. 48A that in the sample 1 the YSZ film had crystallinity, and the aluminum oxide film entirely had crystallinity. It was found from FIG. 48B that in the sample 2 the titanium oxide film had crystallinity, and the aluminum oxide film entirely had crystallinity. It was found from FIG. 48C that in the comparative sample not only the silicon oxide film but also a region of the aluminum oxide film near the interface with the silicon oxide film was amorphous.

Next, the sample 1, the sample 2, and the comparative sample were subjected to XRR. For the XRR, X-ray diffractometer ATX-G manufactured by Rigaku Corporation was used. As a result of the XRR, it was found that the sample 1, the sample 2, and the comparative Sample had a stacked-layer structure as in Table 1, a stacked-layer structure as in Table 2, and a stacked-layer structure as in Table 3, respectively. Note that the respective crystal states of these layers were evaluated from the TE images shown in FIGS. 48A to 48C and are shown in the tables below.

TABLE 1

| Sample 1 | Thickness [nm] | Density [g/cm$^3$] | Roughness [nm] | Crtstal state |
|---|---|---|---|---|
| aluminum oxide | 4.7 | 3.64 | 2.12 | crystalline |
| aluminum oxide | 101.3 | 3.59 | 1.30 | crystalline |
| aluminum oxide | 7.4 | 3.49 | 4.50 | crystalline |
| YSZ | 80.7 | 5.99 | 1.99 | crystalline |
| silicon oxide | 300.0 | 1.97 | 1.52 | amorphous |
| glass | — | 2.51 | 4.31 | amorphous |

TABLE 2

| Sample 2 | Thickness [nm] | Density [g/cm³] | Roughness [nm] | Crtstal state |
|---|---|---|---|---|
| aluminum oxide | 3.1 | 3.86 | 2.47 | crystalline |
| aluminum oxide | 108.8 | 3.58 | 3.09 | crystalline |
| aluminum oxide | 5.5 | 3.92 | 2.12 | crystalline |
| titanium oxide | 98.5 | 3.80 | 4.80 | crystalline |
| silicon oxide | 300.0 | 2.16 | 2.11 | amorphous |
| glass | — | 2.51 | 4.21 | amorphous |

TABLE 3

| Comparative Sample | Thickness [nm] | Density [g/cm³] | Roughness [nm] | Crtstal state |
|---|---|---|---|---|
| aluminum oxide | 3.6 | 3.76 | 1.91 | crystalline |
| aluminum oxide | 102.8 | 3.61 | 2.17 | crystalline |
| aluminum oxide | 13.2 | 2.70 | 4.82 | amorphous |
| silicon oxide | 300.0 | 1.91 | 1.34 | amorphous |
| glass | — | 2.51 | 1.08 | amorphous |

It was found from Tables 1 to 3 that the aluminum oxide film in each sample included two interface layers and a layer provided therebetween. Between the two interface layers, attention is focused on the density and the thickness of the interface layer on a base film (the YSZ film, the titanium oxide film, or the silicon oxide film) side (such an interface layer is also referred to as a lower-side layer). It was found that although there were no great difference between the density of the lower-side layer and the densities of the other layers in the sample 1 and the sample 2, the lower-side layer had a lower density than the other layers in the comparative sample. Moreover, in the comparative sample, the thickness of the lower-side layer having a low density was 13.2 nm.

As described above, it was found from the TE images and stacked-layer structures obtained by XRR of these samples that in the sample 1 and the sample 2, the aluminum oxide film is entirely crystallized and the lower-side layer had substantially the same density as the other layers. It was found that in the comparative sample, the region of the aluminum oxide film near the interface with the silicon oxide film was amorphous and the lower-side layer had a lower density than the other layers. Note that the amorphous region of the aluminum oxide film in the comparative sample is considered to be a lower-side layer having a low density.

According to this example, it is found that a silicon oxide film provided over a crystalline insulating film is entirely crystallized and has a high density.

EXAMPLE 2

In this example, a TE image of a sample (an example sample) having an aluminum oxide film where shape defects had suppressed was observed. Further, as a comparative example, a TE image of a sample (a comparative example sample) having an aluminum oxide film where shape defects had occurred was observed.

A method for manufacturing the samples will be described below.

First, a silicon oxynitride film was formed over a silicon wafer which is a substrate. The silicon oxynitride film was formed by a CVD method to a thickness of 400 nm under the following conditions: a $SiH_4$ gas with a flow rate of 27 sccm and a $N_2O$ gas with a flow rate of 1000 sccm were used; the power was 60 W (13.56 MHz); the pressure was 13.3 Pa; and the substrate heating temperature was 325° C.

Next, an oxide semiconductor film was formed. The oxide semiconductor film was formed by a sputtering method to a thickness of 20 nm under the following conditions: a circle In—Ga—Zn—O compound target with a diameter of 12 inches (In:Ga:Zn=3:1:2 [molar ratio]) was used; an argon gas with a flow rate of 30 sccm and an oxygen gas with a flow rate of 15 sccm were used; the power was 500 W (DC); the pressure was 0.4 Pa; the distance between the target and the substrate was 60 mm; and the substrate heating temperature was 200° C.

Next, a silicon oxynitride film was formed. The silicon oxynitride film was formed by a CVD method to a thickness of 20 nm under the following conditions: a $SiH_4$ gas with a flow rate of 1 sccm and a $N_2O$ gas with a flow rate of 800 sccm were used; the power was 150 W (60 MHz); the pressure was 40 Pa; and the substrate heating temperature was 400° C.

Next, a tantalum nitride film was formed. The tantalum nitride film was formed by a sputtering method to a thickness of 30 nm under the following conditions: a circle tantalum target with a diameter of 12 inches was used; an argon gas with a flow rate of 40 sccm and a nitrogen gas with a flow rate of 10 sccm were used; the power was 1 kW (DC); the pressure was 0.6 Pa; the distance between the target and the substrate was 60 mm; and substrate heating was not performed.

Next, a tungsten film was formed. The tungsten film was formed by a sputtering method to a thickness of 200 nm under the following conditions: a circle tungsten target with a diameter of 12 inches was used; an argon gas with a flow rate of 110 sccm was used; the power was 4 kW (DC); the pressure was 2 Pa; the distance between the target and the substrate was 60 mm; and the substrate heating temperature was 200° C.

Next, the 200-nm-thick tungsten film and the 30-nm-thick tantalum nitride film were processed to form a gate electrode.

Next, a silicon oxynitride film was formed. The silicon oxynitride film was formed by a CVD method to a thickness of 90 nm under the following conditions: a $SiH_4$ gas with a flow rate of 1 sccm and a $N_2O$ gas with a flow rate of 800 sccm were used; the power was 150 W (60 MHz); the pressure was 40 Pa; and the substrate heating temperature was 400° C.

Next, a highly anisotropic etching treatment was performed, whereby a sidewall insulating film was formed. Note that dry etching was employed as the highly anisotropic etching treatment. At this time, the 20-nm-thick silicon oxynitride film was simultaneously etched to form a gate insulating film.

Next, a tungsten film was formed. The tungsten film was formed by a sputtering method to a thickness of 30 nm under the following conditions: a circle tungsten target with a diameter of 12 inches was used; an argon gas with a flow rate of 90 sccm was used; the power was 1 kW (DC); the pressure was 0.8 Pa; the distance between the target and the substrate was 60 mm; and the substrate heating temperature was 200° C.

Next, the 30-nm-thick tungsten film was processed.

Next, in the example sample, a crystalline insulating film was formed. The crystalline insulating film was formed by a sputtering method to a thickness of 10 nm under the following conditions: a circle YSZ target with a diameter of 6 inches ($ZrO_2$:$Y_2O_3$=92:8 [molar ratio]) was used; an argon gas with a flow rate of 20 sccm and an oxygen gas with a flow rate of 20 sccm were used; the power was 250 W (RF); the pressure was 0.4 Pa; the distance between the target and the substrate was 135 mm; and substrate heating was not performed. Note that in the comparative example sample, a crystalline insulating film was not formed.

Next, in both the example sample and the comparative example sample, aluminum oxide films were formed. The aluminum oxide films were each formed by a sputtering method to a thickness of 70 nm under the following conditions: a circle aluminum oxide target with a diameter of 12 inches was used; an argon gas with a flow rate of 25 sccm and an oxygen gas with a flow rate of 25 sccm were used; the power was 2.5 kW (RF); the pressure was 0.4 Pa; the distance between the target and the substrate was 60 mm; and the substrate heating temperature was 250° C.

Next, a silicon oxynitride film was formed. The silicon oxynitride film was formed by a CVD method to a thickness of 460 nm under the following conditions: a $SiH_4$ gas with a flow rate of 5 sccm and a $N_2O$ gas with a flow rate of 1000 sccm were used; the power was 35 W (13.56 MHz); the pressure was 133.3 Pa; and the substrate heating temperature was 325° C.

Next, a CMP treatment was performed. The CMP treatment was performed until the tungsten film serving as the gate electrode is partly exposed.

Figure 49A:
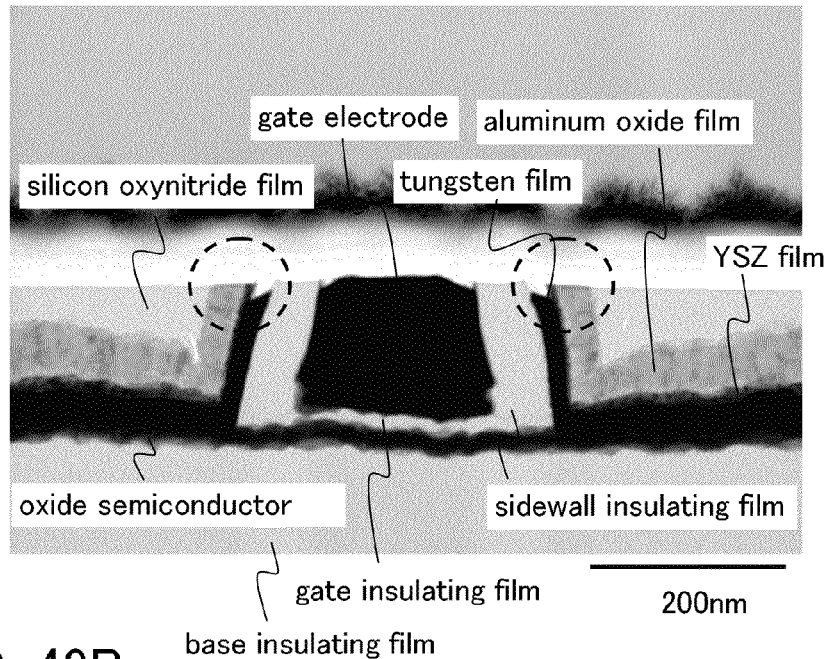
FIGS. 49A and 49B are cross-sectional TE images of each sample, which are observed by a scanning transmission electron microscope.
Figure 49B:
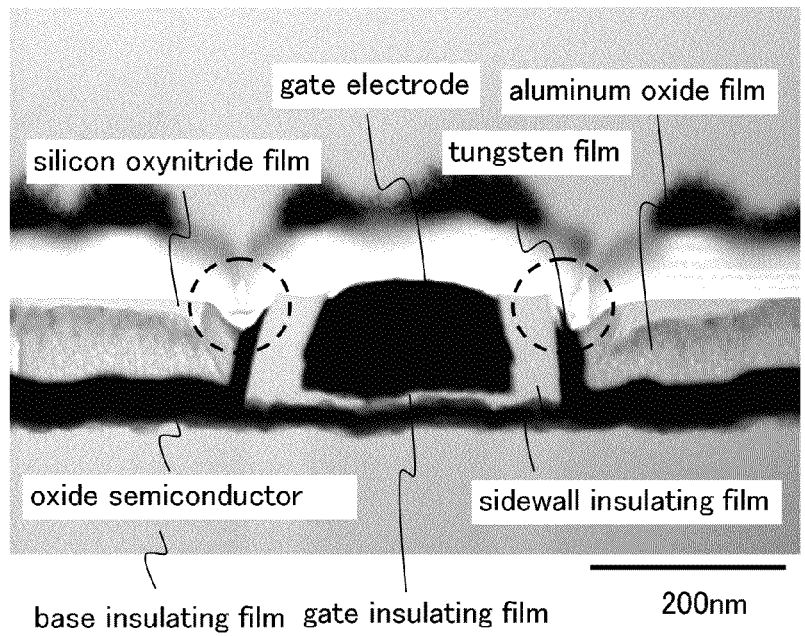

Cross-sectional STEM images of the example sample and the comparative example sample which were formed in the above-described manner were observed. For the observation of the cross-sectional STEM images, an Ultra-thin Film Evaluation System HD-2300 manufactured by Hitachi High-Technologies Corporation was used. Note that the magnification was 150000 times. FIG. 49A shows a TE image of the example sample, and FIG. 49B shows a TE image of the comparative example sample.

In the example sample, occurrence of shape defects of the aluminum oxide film was not observed from FIG. 49A (see a dashed-line circle in the figure). In the comparative example sample, it was found from FIG. 49B that a region of the aluminum oxide film near the tungsten film was etched and shape defects occur (see a dashed-line circle in the figure).

A reason why shape defects did not occur in the example sample is considered that the crystalline insulating film was provided and the aluminum oxide film had an increased density and is crystallized.

According to this example, it is found that shape defects which are caused by an aluminum oxide film can be suppressed with the use of an aluminum oxide film having crystallinity and a high density.

This application is based on Japanese Patent Application serial No. 2012-051261 filed with the Japan Patent Office on Mar. 8, 2012 and Japanese Patent Application serial No. 2012-051263 filed with the Japan Patent Office on Mar. 8, 2012, the entire contents of which are hereby incorporated by reference.

What is claimed is:

1. A semiconductor device comprising:
   a first insulating film;
   a semiconductor film over the first insulating film;
   a second insulating film over part of the semiconductor film;
   a gate electrode over the second insulating film;
   a source electrode and a drain electrode over the semiconductor film, and
   a third insulating film over the semiconductor film and the source electrode and the drain electrode,
   wherein the semiconductor film is an oxide semiconductor film,
   wherein the gate electrode and, the source electrode and the drain electrode are exposed from the third insulating film,
   wherein the third insulating film comprises a crystalline insulating film and an aluminum oxide film with crystallinity over the crystalline insulating film, and
   wherein the crystalline insulating film is an oxide film containing one or more kinds of Mg, Ti, V, Cr, Y, Zr, and Ta.

2. The semiconductor device according to claim 1, further comprising a sidewall insulating layer in contact with a side surface of the gate electrode.

3. The semiconductor device according to claim 1, wherein the crystalline insulating film contains Y and Zr.

4. The semiconductor device according to claim 1, wherein the aluminum oxide film has a density greater than or equal to 3.2 $g/cm^3$ and less than or equal to 4.1 $g/cm^3$.

5. The semiconductor device according to claim 1, wherein the oxide semiconductor film contains at least In.

6. A semiconductor device comprising:
   a semiconductor film;
   a gate insulating film in contact with the semiconductor film; and
   a gate electrode overlapping with the semiconductor film with the gate insulating film interposed therebetween,
   wherein the semiconductor film is an oxide semiconductor film,
   wherein the gate insulating film comprises a crystalline insulating film and an aluminum oxide film with crystallinity over the crystalline insulating film, and
   wherein the crystalline insulating film is an oxide film containing one or more kinds of Mg, Ti, V, Cr, Y, Zr, and Ta.

7. The semiconductor device according to claim 6, wherein the crystalline insulating film contains Y and Zr.

8. The semiconductor device according to claim 6, wherein the aluminum oxide film has a density greater than or equal to 3.2 $g/cm^3$ and less than or equal to 4.1 $g/cm^3$.

9. The semiconductor device according to claim 6, wherein the oxide semiconductor film contains at least In.

10. A semiconductor device comprising:
    a substrate;
    a first insulating film over the substrate;
    a semiconductor film over the first insulating film;
    a second insulating film over part of the semiconductor film;
    a gate electrode over the second insulating film;
    a source electrode and a drain electrode over the semiconductor film, and
    a third insulating film over the semiconductor film and the source electrode and the drain electrode,
    wherein the semiconductor film is an oxide semiconductor film,
    wherein the first insulating film comprises a first crystalline insulating film and a first aluminum oxide film with crystallinity over the first crystalline insulating film, and
    wherein the first crystalline insulating film is an oxide film containing one or more kinds of Mg, Ti, V, Cr, Y, Zr, and Ta.

11. The semiconductor device according to claim 10,
    wherein the third insulating film comprises a second crystalline insulating film and a second aluminum oxide film with crystallinity over the second crystalline insulating film, and
    wherein the second crystalline insulating film is an oxide film containing one or more kinds of Mg, Ti, V, Cr, Y, Zr, and Ta.

12. The semiconductor device according to claim 11, wherein the first crystalline insulating film and the second crystalline insulating film contain Y and Zr.

13. The semiconductor device according to claim 11, wherein the first aluminum oxide film and the second aluminum oxide film has a density greater than or equal to 3.2 $g/cm^3$ and less than or equal to 4.1 $g/cm^3$.

14. The semiconductor device according to claim 10, wherein the oxide semiconductor film contains at least In.

* * * * *